(12) United States Patent
Nakazawa et al.

(10) Patent No.: US 11,489,051 B2
(45) Date of Patent: Nov. 1, 2022

(54) SEMICONDUCTOR DEVICE WITH SIC SEMICONDUCTOR LAYER AND RAISED PORTION GROUP

(71) Applicant: ROHM CO., LTD., Kyoto (JP)

(72) Inventors: Seiya Nakazawa, Kyoto (JP); Sawa Haruyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/981,127

(22) PCT Filed: Mar. 26, 2019

(86) PCT No.: PCT/JP2019/012972
§ 371 (c)(1),
(2) Date: Sep. 15, 2020

(87) PCT Pub. No.: WO2019/189242
PCT Pub. Date: Oct. 3, 2019

(65) Prior Publication Data
US 2021/0020754 A1    Jan. 21, 2021

(30) Foreign Application Priority Data

Mar. 30, 2018 (JP) .............................. JP2018-068567
Mar. 30, 2018 (JP) .............................. JP2018-068568

(51) Int. Cl.
*H01L 29/41*    (2006.01)
*H01L 29/66*    (2006.01)
(Continued)

(52) U.S. Cl.
CPC ........ *H01L 29/417* (2013.01); *H01L 21/0485* (2013.01); *H01L 29/1608* (2013.01);
(Continued)

(58) Field of Classification Search
CPC ................. H01L 29/34; H01L 29/1608; H01L 29/66053–66068; H01L 2224/0603;
(Continued)

(56) References Cited

U.S. PATENT DOCUMENTS

2012/0223335 A1* 9/2012 Tsuchiya .................. B41M 5/26
257/77
2014/0225126 A1* 8/2014 Aketa ............... H01L 21/02529
257/77
(Continued)

FOREIGN PATENT DOCUMENTS

JP    2006041248    2/2006
JP    2011198780    10/2011
(Continued)

OTHER PUBLICATIONS

"Si ohmic contacts on N-type SiC studied by XPS" in Microelectronic Engineering vol. 106, Jun. 2013, pp. 132-138, to Stanislav Chichon et al. (Year: 2013).*
(Continued)

*Primary Examiner* — Eric A. Ward
(74) *Attorney, Agent, or Firm* — Hamre, Schumann, Mueller & Larson, P.C.

(57) ABSTRACT

A semiconductor device includes an SiC semiconductor layer which has a first main surface on one side and a second main surface on the other side, a semiconductor element which is formed in the first main surface, a raised portion group which includes a plurality of raised portions formed at intervals from each other at the second main surface and has a first portion in which some of the raised portions among the plurality of raised portions overlap each other in a first direction view as viewed in a first direction which is one of the plane directions of the second main surface, and an
(Continued)

electrode which is formed on the second main surface and connected to the raised portion group.

24 Claims, 48 Drawing Sheets

(51) Int. Cl.
*H01L 29/417* (2006.01)
*H01L 21/04* (2006.01)
*H01L 29/16* (2006.01)
*H01L 29/06* (2006.01)
*H01L 29/739* (2006.01)
*H01L 29/78* (2006.01)
*H01L 29/872* (2006.01)

(52) U.S. Cl.
CPC .... *H01L 29/41741* (2013.01); *H01L 29/6606* (2013.01); *H01L 21/049* (2013.01); *H01L 21/0465* (2013.01); *H01L 29/0619* (2013.01); *H01L 29/7397* (2013.01); *H01L 29/7813* (2013.01); *H01L 29/872* (2013.01)

(58) Field of Classification Search
CPC ......... H01L 21/02529; H01L 21/02378; H01L 21/0485; H01L 29/45–458
See application file for complete search history.

(56) References Cited

U.S. PATENT DOCUMENTS

| | | | |
|---|---|---|---|
| 2014/0232004 A1* | 8/2014 | Yoshiura | H01L 29/456 257/763 |
| 2015/0076518 A1* | 3/2015 | Tanigawa | B23K 26/3584 257/77 |
| 2015/0348783 A1* | 12/2015 | Fukuda | H01L 29/1608 257/77 |
| 2016/0254357 A1* | 9/2016 | Aketa | H01L 29/6606 257/77 |
| 2018/0019307 A1 | 1/2018 | Fukada et al. | |

FOREIGN PATENT DOCUMENTS

| | | |
|---|---|---|
| JP | 2015115583 | 6/2015 |
| JP | 2017063145 | 3/2017 |
| WO | 2014199510 | 12/2014 |
| WO | 2017098659 | 6/2017 |

OTHER PUBLICATIONS

"Effects of Si Interlayer Conditions on Platinum Ohmic Contacts forp-Type Silicon Carbide" in Journal of Electronic Materials, vol. 31, No. 5, 2002, to T. Jang et al. (Year: 2002).*

"Creating room temperature Ohmic contacts to 4H-SiC: studied by specific contact resistance measurements and X-ray photoelectron spectroscopy" in Surface Science vol. 573, Issue 2, Dec. 10, 2004, pp. 253-263, to O.J. Guy et al. (Year: 2004).*

International Preliminary Report on Patentability issued for International Patent Application No. PCT/JP2019/012972, dated Oct. 15, 2020, 16 pages including English translation.

International Search Report and Written Opinion issued for International Patent Application No. PCT/JP2019/012972, dated Jun. 11, 2019, 10 pages including English translation of Search Report.

Notice of Reasons for Refusal issued for Japanese Patent Application No. 2020-510952, dated Jun. 23, 2022, 4 pages including English translation.

\* cited by examiner

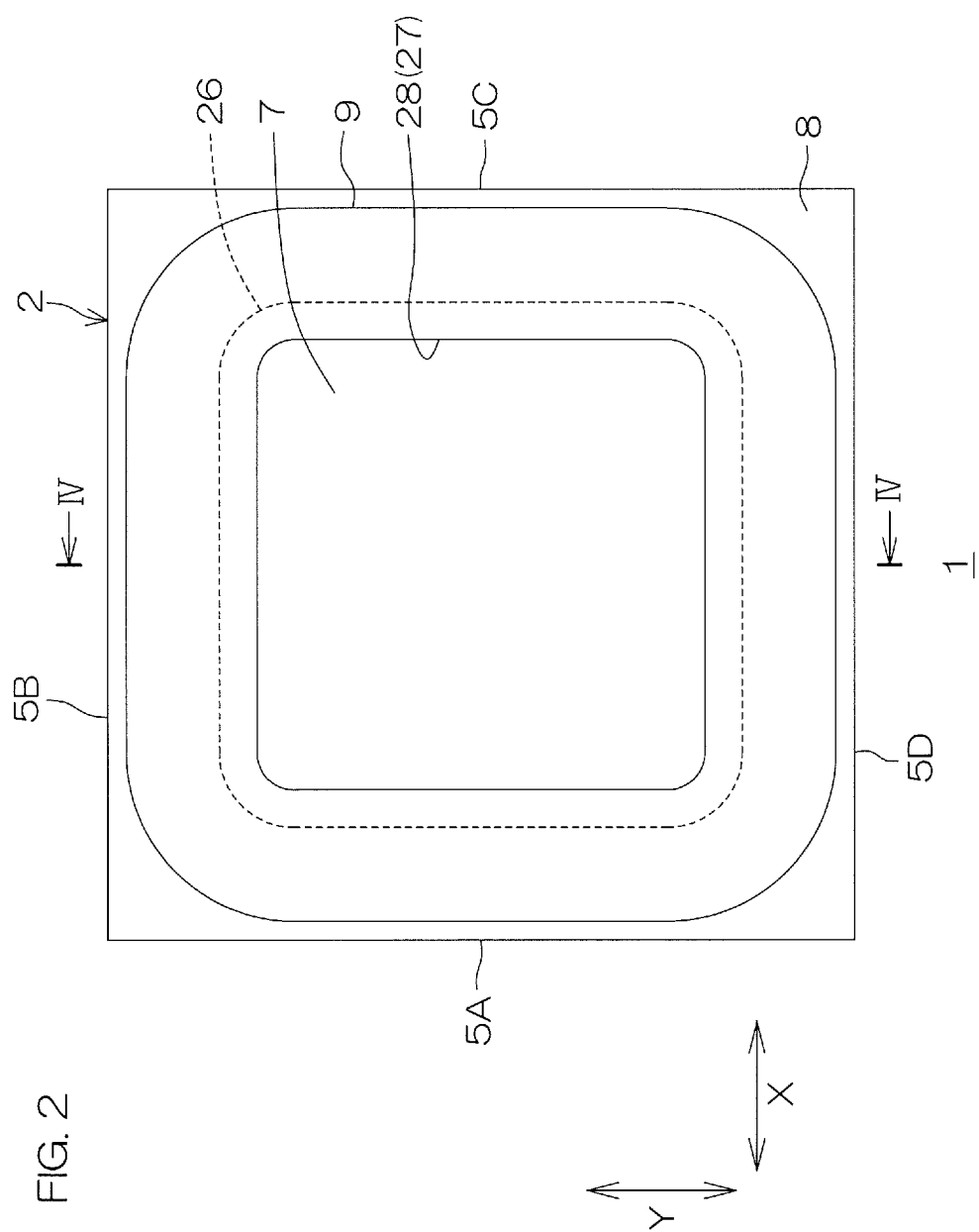

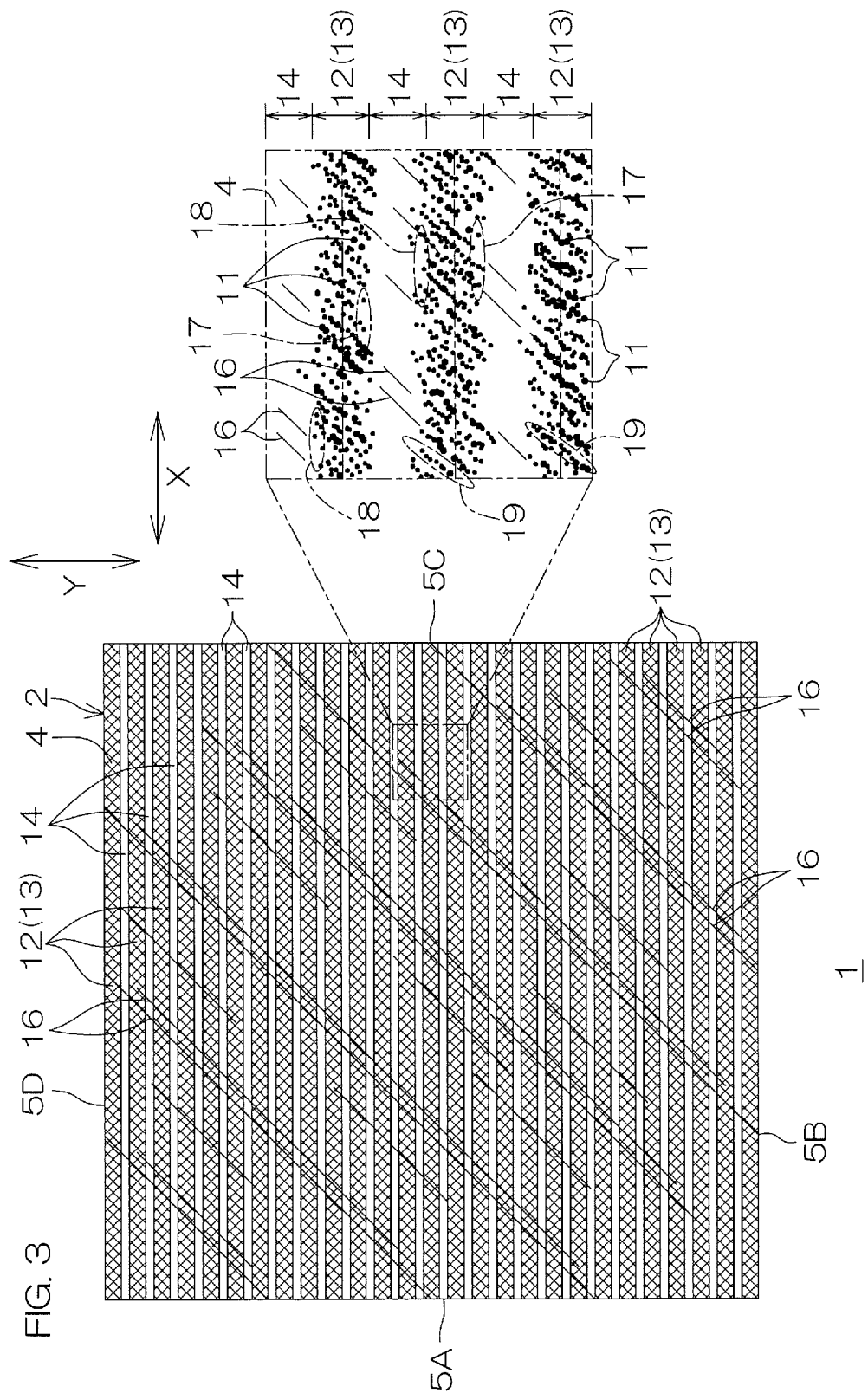

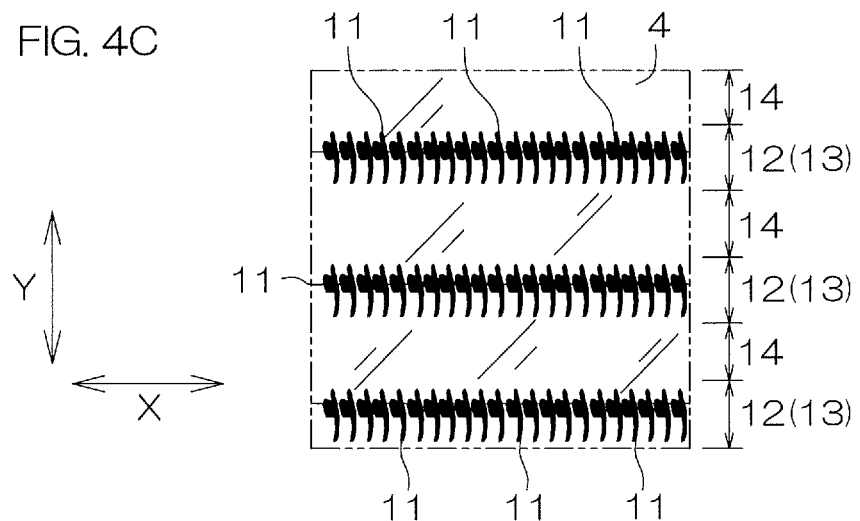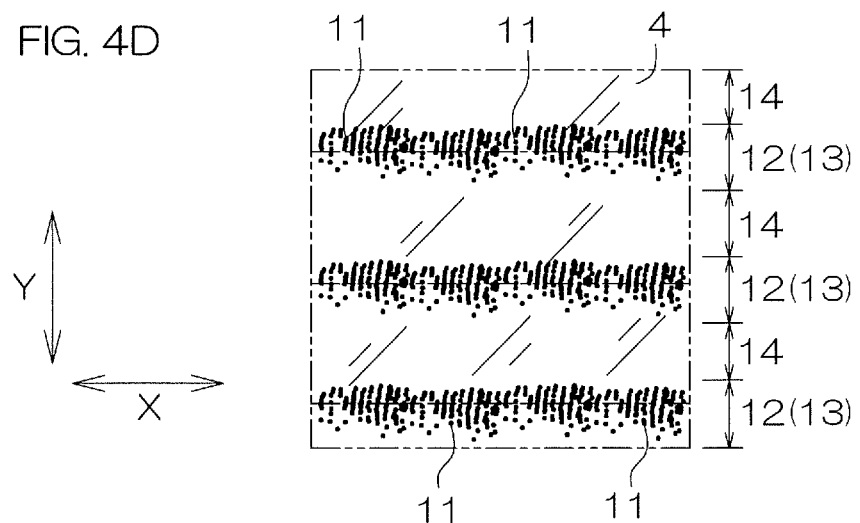

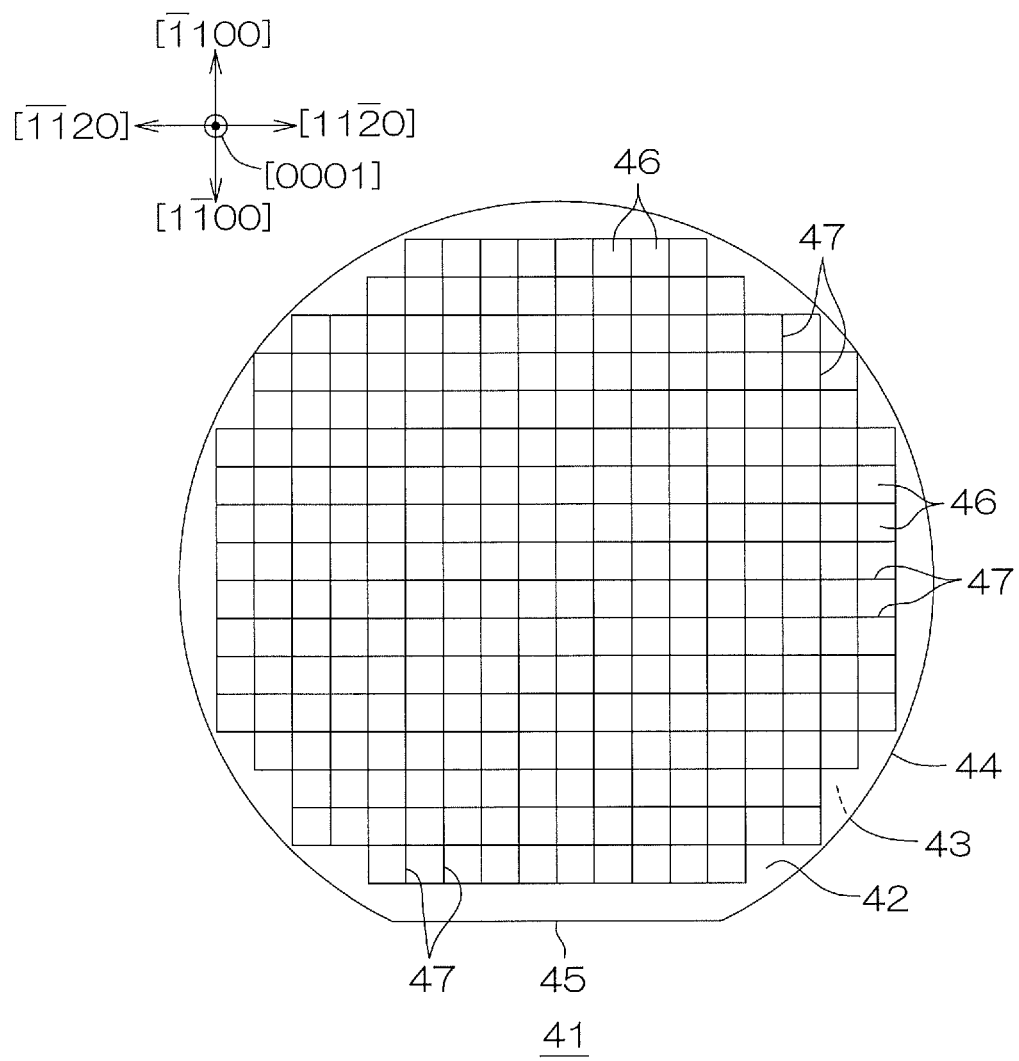

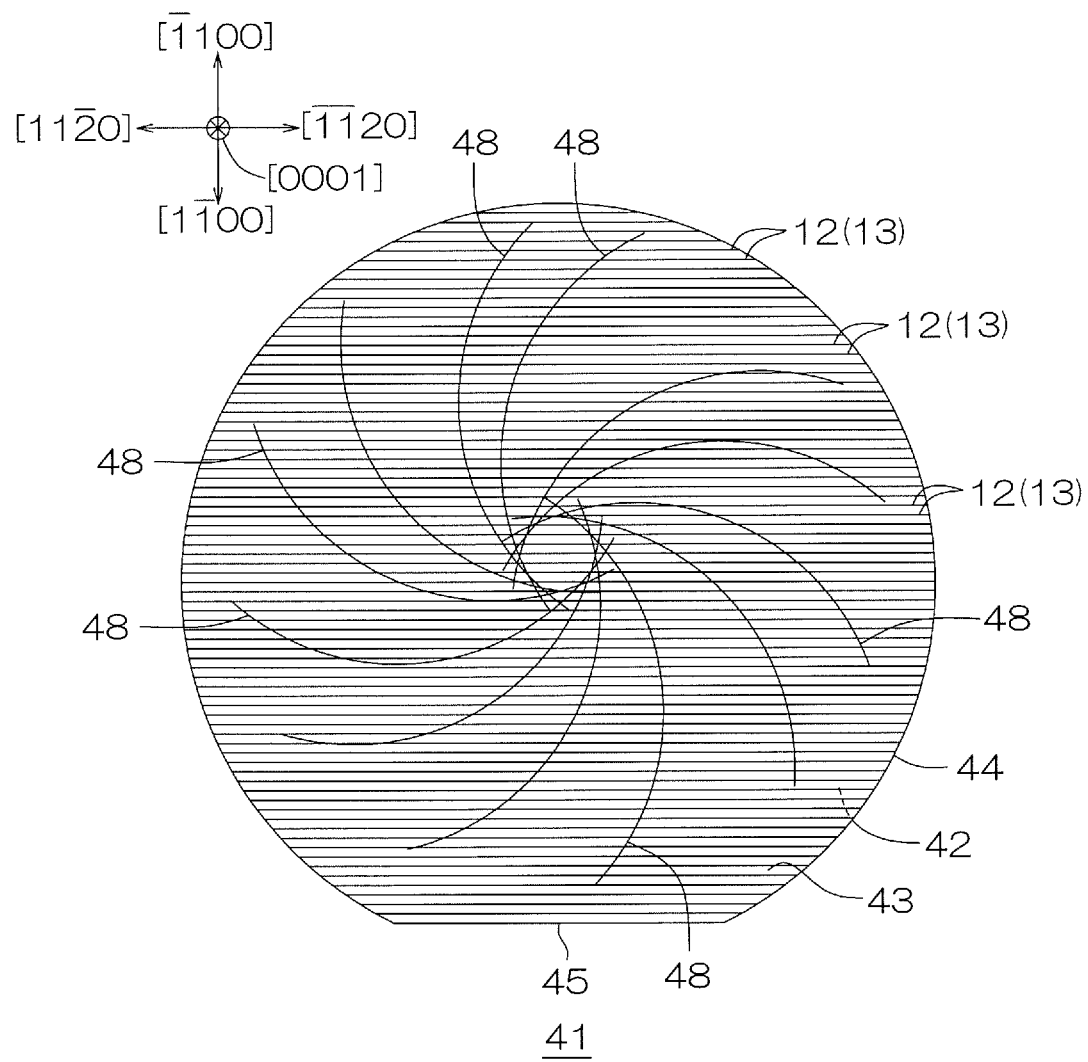

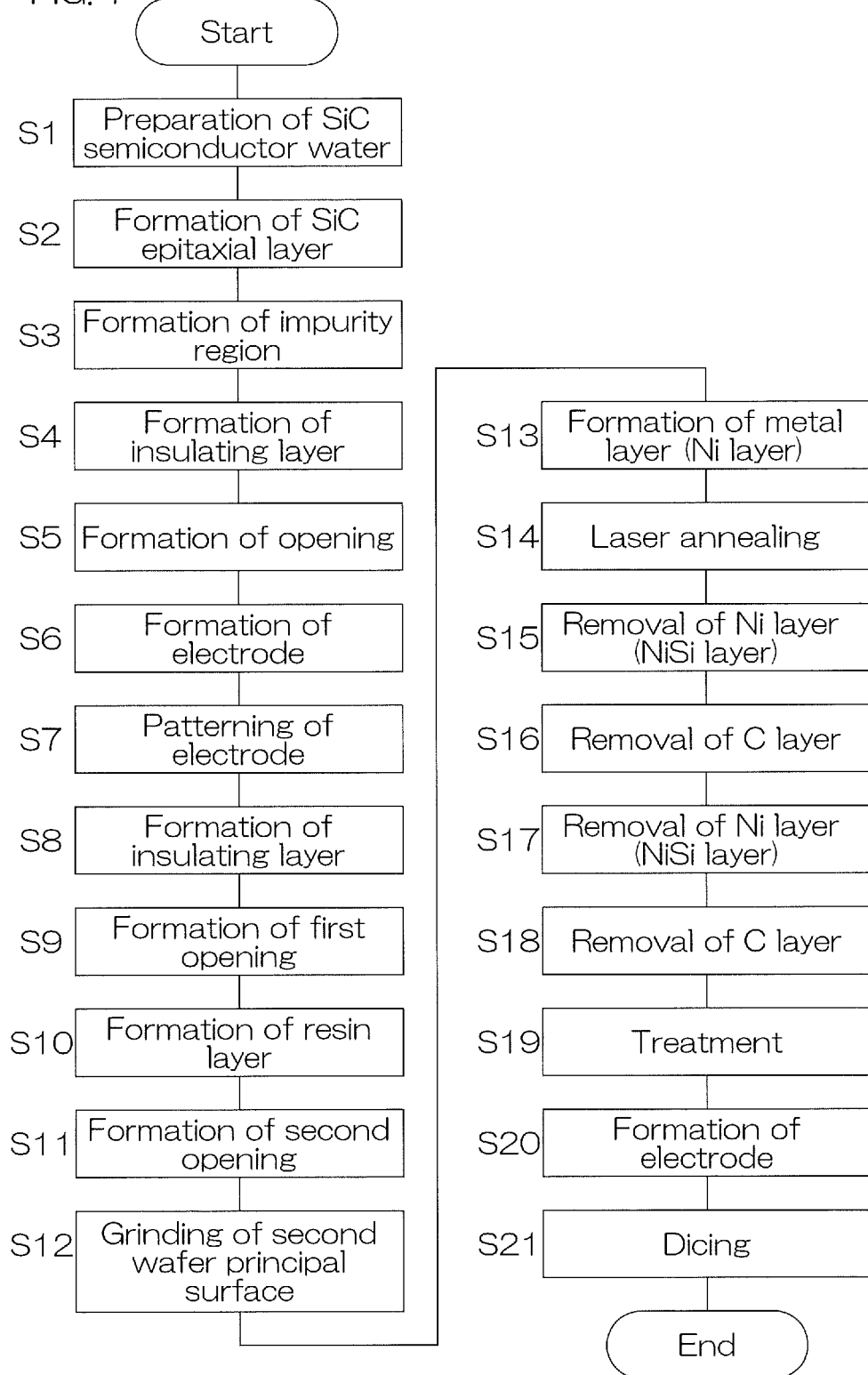

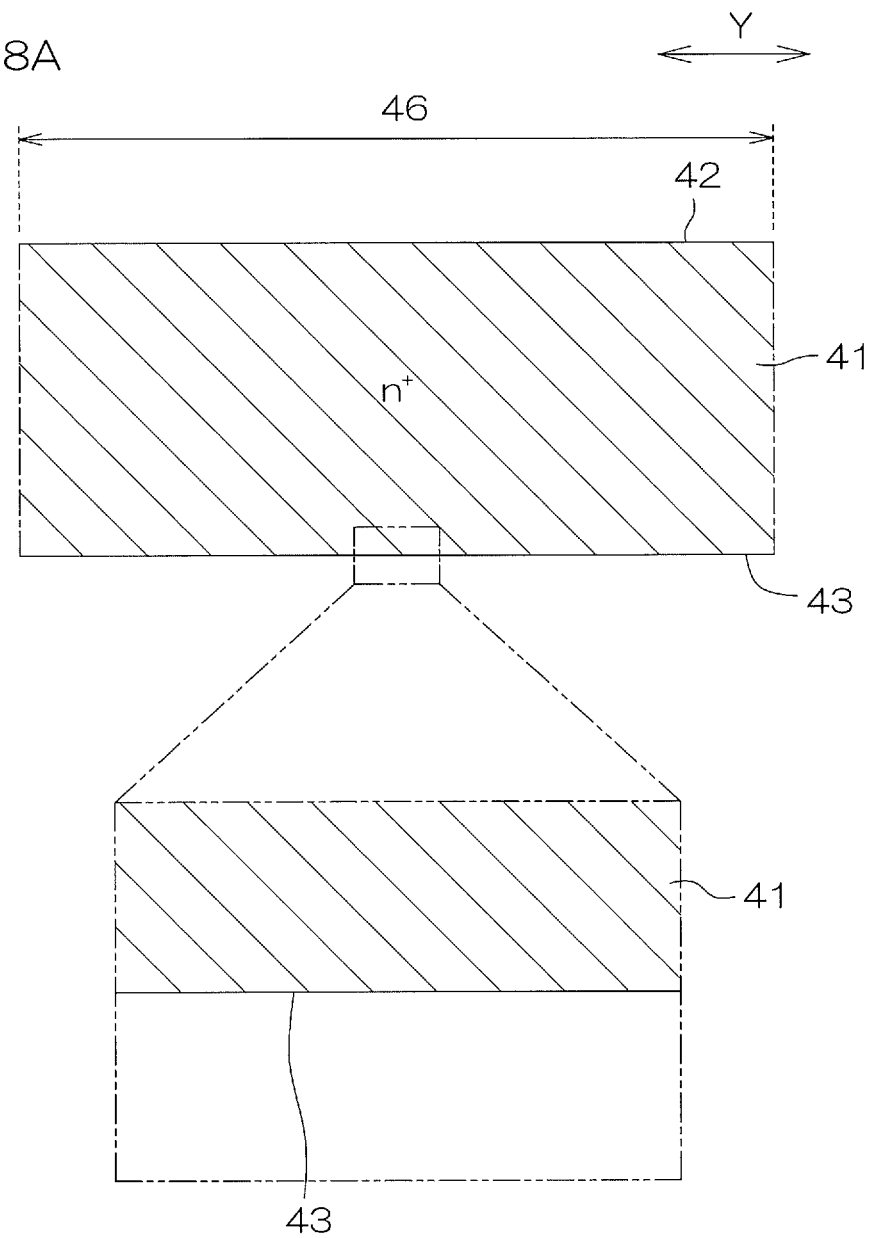

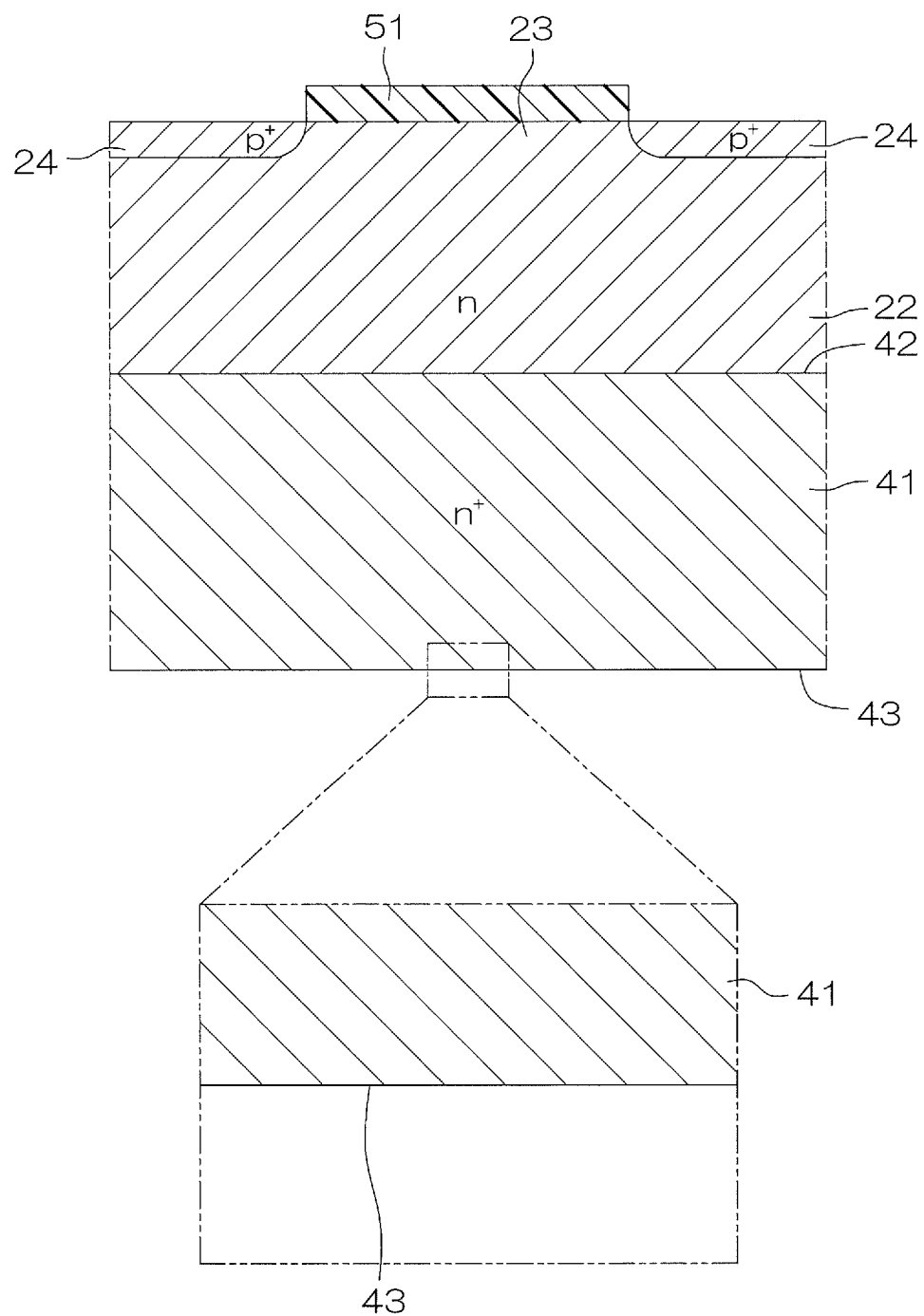

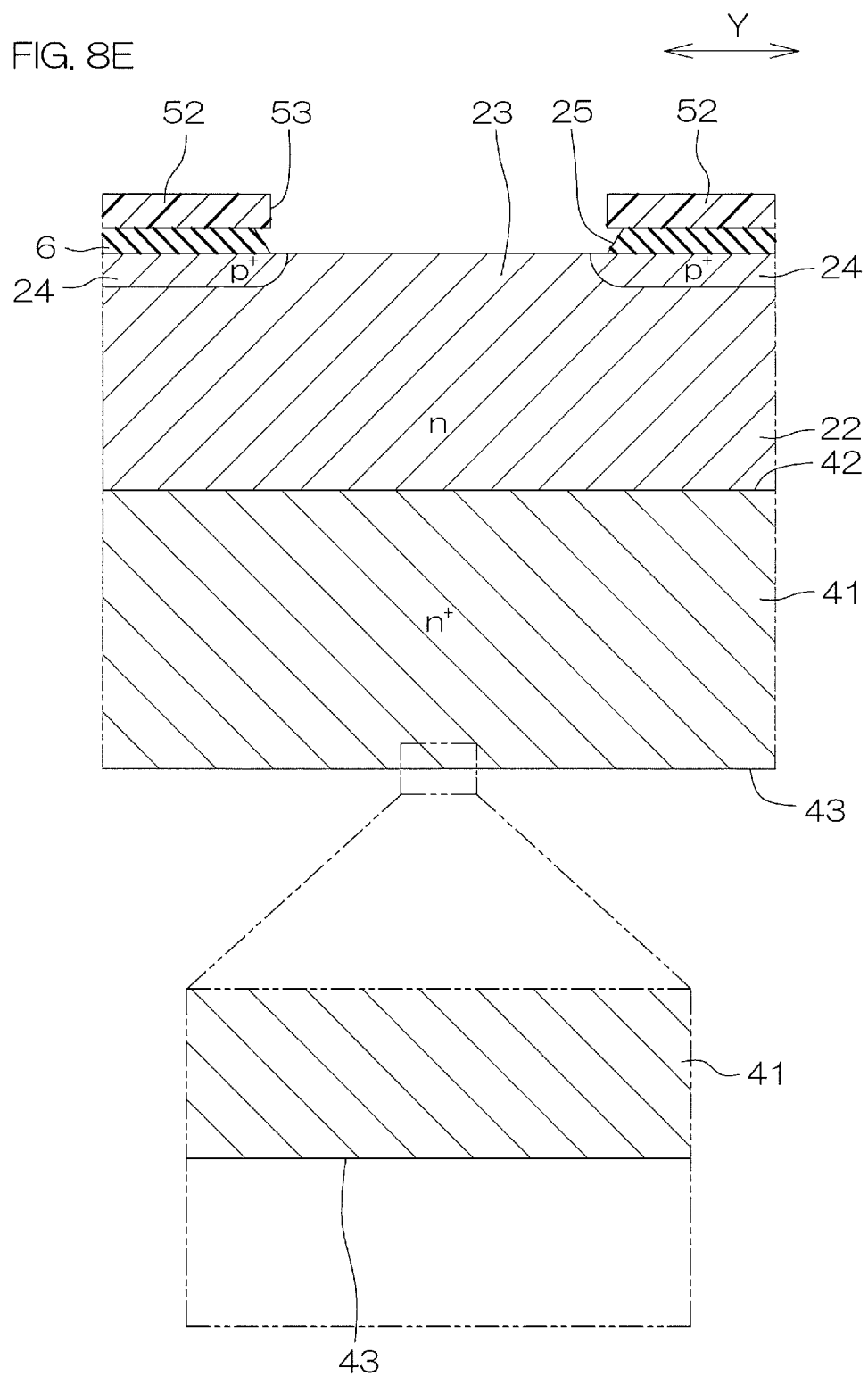

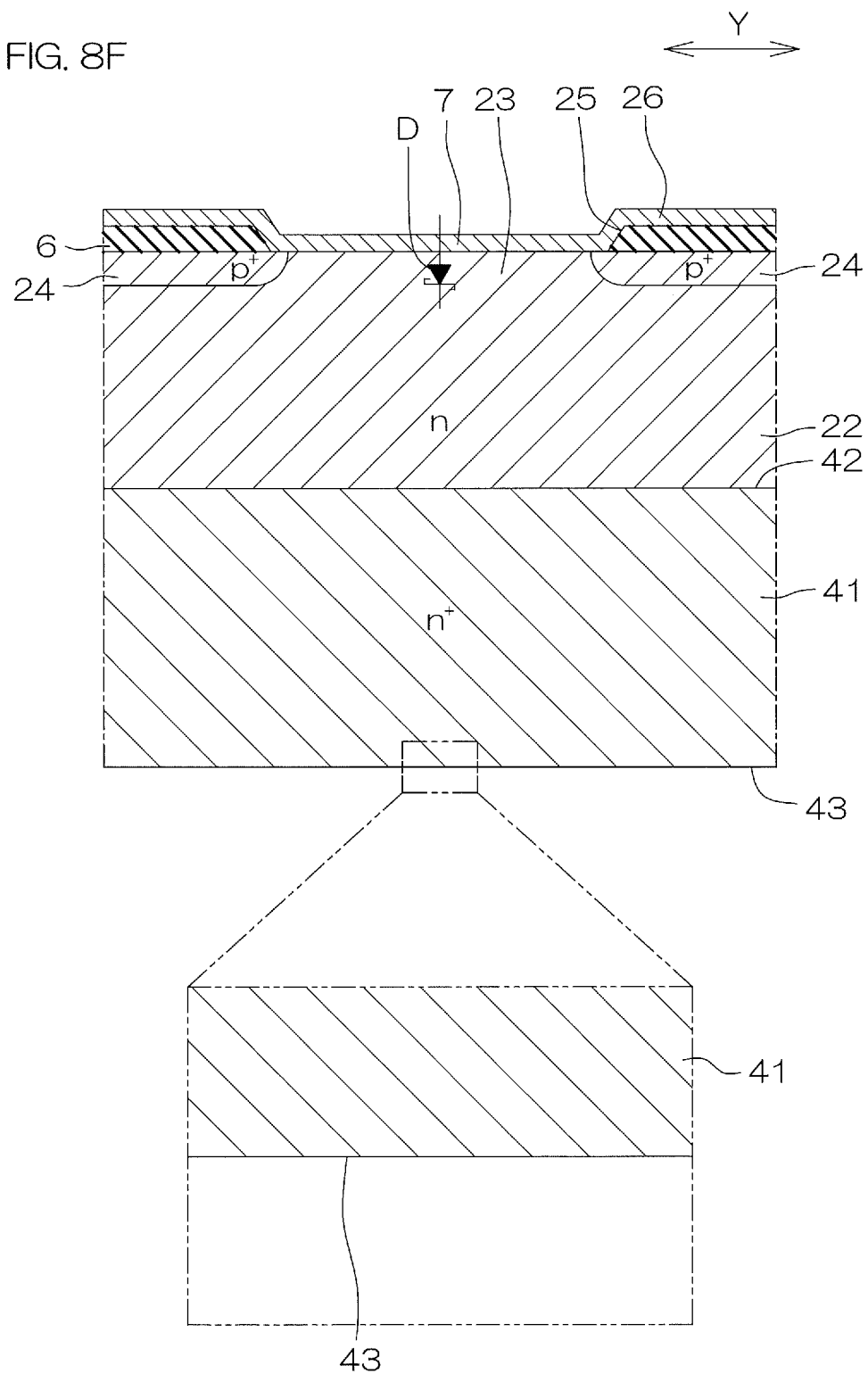

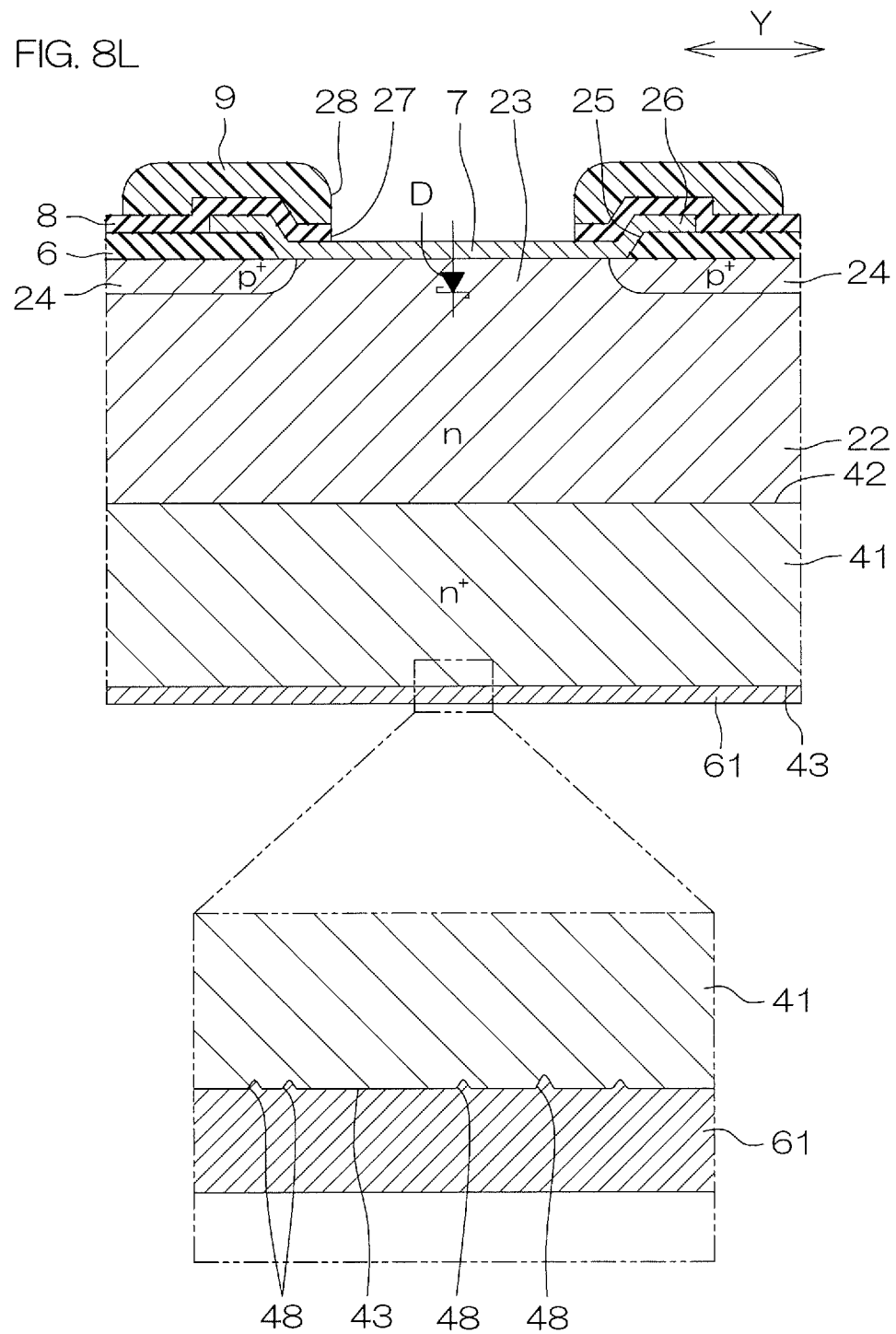

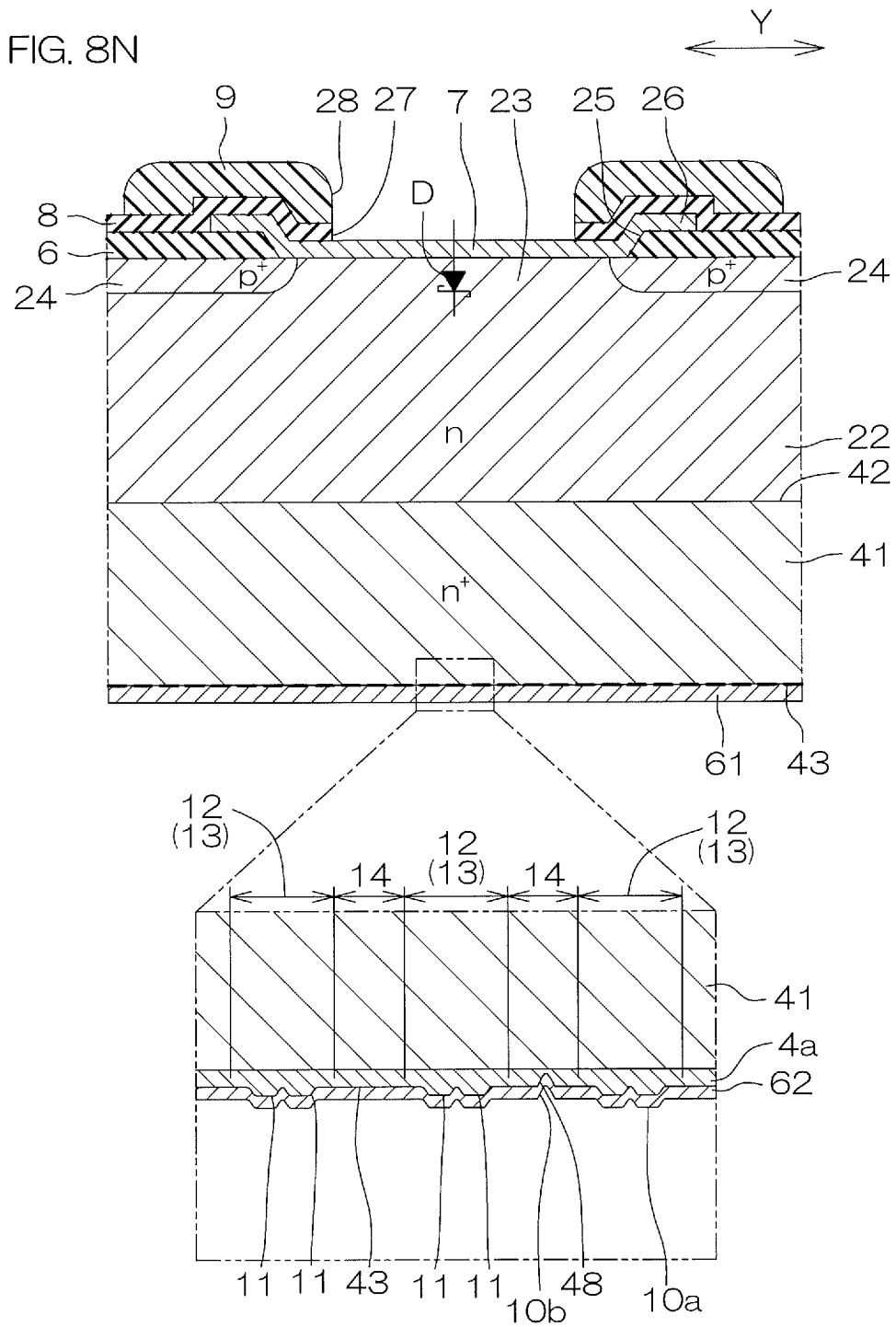

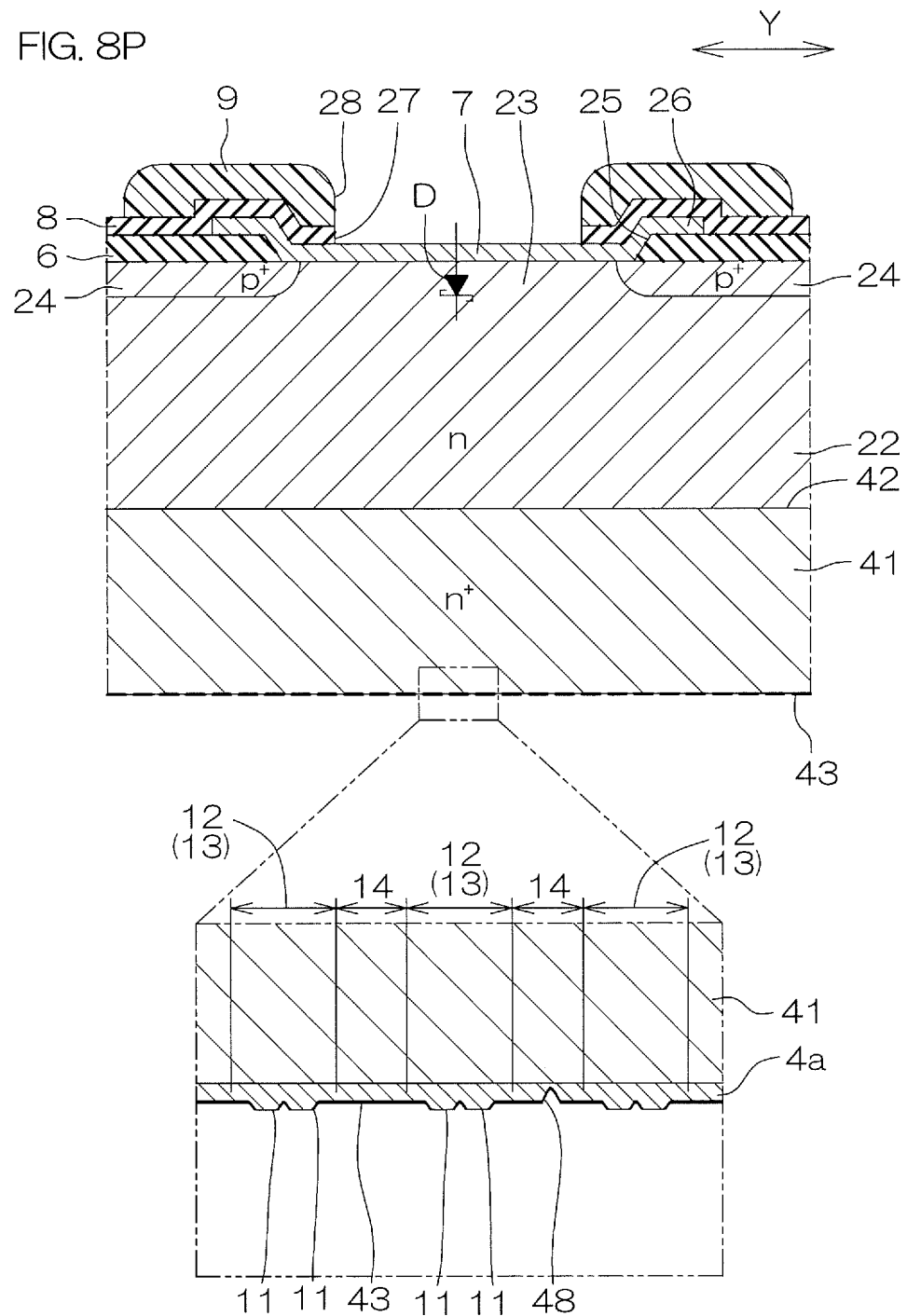

SEMICONDUCTOR DEVICE WITH SIC SEMICONDUCTOR LAYER AND RAISED PORTION GROUP

TECHNICAL FIELD

The present invention relates to a semiconductor device.

BACKGROUND ART

Patent Literature 1 discloses a semiconductor device which includes an SiC substrate, a Schottky barrier diode formed in a front surface of the SiC substrate and an ohmic electrode layer formed on a rear surface of the SiC substrate.

CITATION LIST

Patent Literature

Patent Literature 1: Japanese Patent Application Publication No. 2011-198780

SUMMARY OF INVENTION

Technical Problem

A preferred embodiment of the present invention provides a semiconductor device capable of improving electrical characteristics in a structure which includes SiC.

Solution to Problem

A preferred embodiment of the present invention provides a semiconductor device which includes an SiC semiconductor layer having a first main surface on one side and a second main surface on the other side, a semiconductor element formed in the first main surface, a raised portion group which includes a plurality of raised portions formed at intervals from each other at the second main surface and which has a first portion in which some of the raised portions among the plurality of raised portions overlap each other in a first direction view as viewed in a first direction which is one of the plane directions of the second main surface, and an electrode which is formed on the second main surface and connected to the raised portion group.

According to the semiconductor device, a connection area of the electrode to the second main surface can be increased by the raised portion group. It is, thereby, possible to improve electrical characteristics.

The aforementioned or other objects, features and effects of the present invention will become apparent from the following description of preferred embodiments given below with reference to the accompanying drawings.

BRIEF DESCRIPTION OF DRAWINGS

FIG. 2 is a top view of the semiconductor device shown in FIG. 1.

FIG. 3 is a bottom view of the semiconductor device shown in FIG. 1 and a bottom view which shows a first configuration example of a raised portion group.

FIG. 4C is a diagram which shows a fourth configuration example of the raised portion group.

FIG. 4D is a diagram which shows a fifth configuration example of the raised portion group.

FIG. 6A is a top view which shows a semiconductor wafer that is used in manufacturing of the semiconductor device shown in FIG. 1.

FIG. 6B is a bottom view of the semiconductor wafer shown in FIG. 6A and a view which shows a state after a grinding step and annealing.

FIG. 7 is a flowchart which describes an example of a method for manufacturing the semiconductor device shown in FIG. 1.

DESCRIPTION OF EMBODIMENTS

Figure 1:
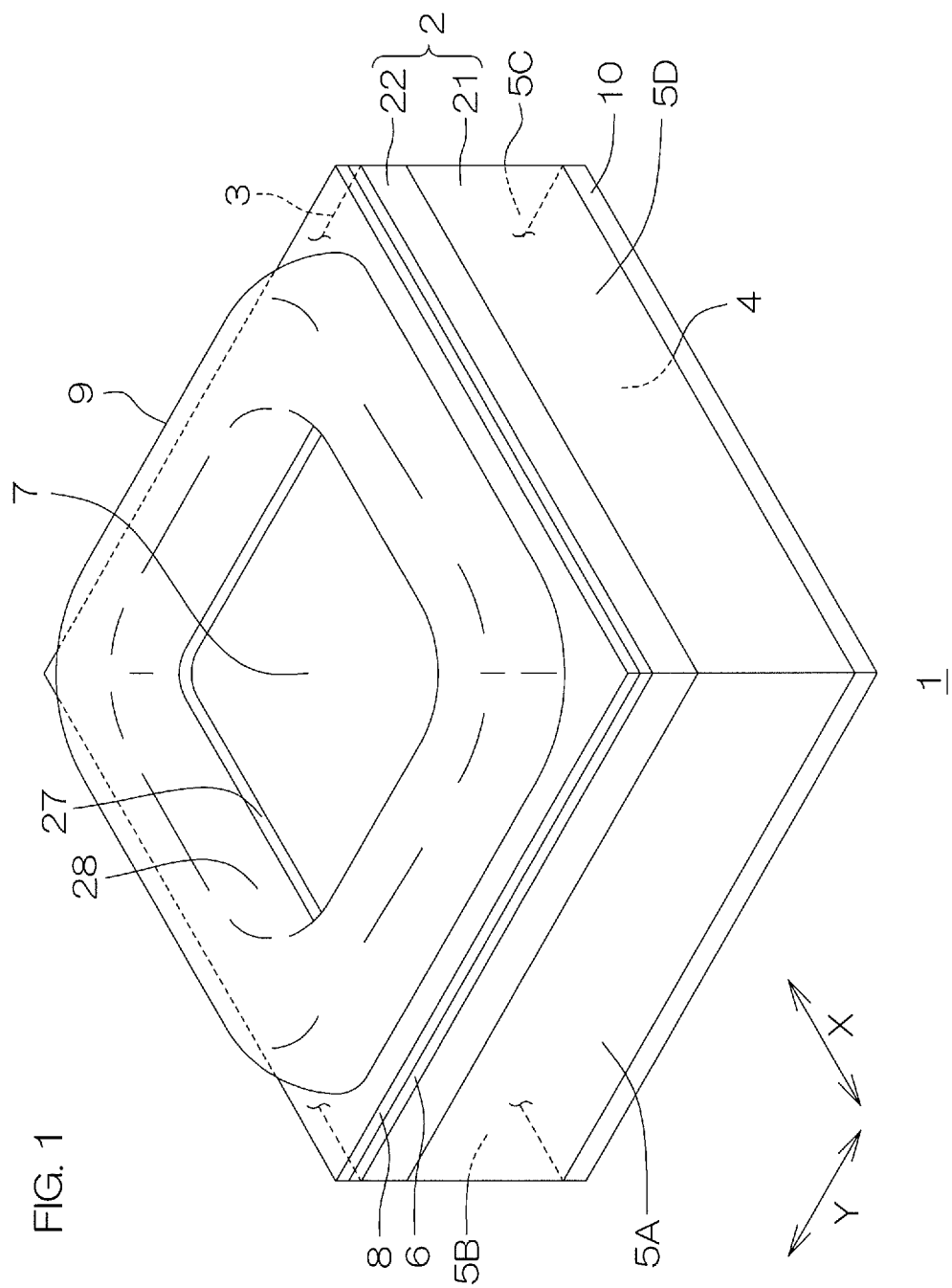
FIG. 1 is a perspective view which shows a semiconductor device according to a first preferred embodiment of the present invention.

FIG. 1 is a perspective view which shows a semiconductor device 1 according to a first preferred embodiment of the present invention. FIG. 2 is a top view of the semiconductor device 1 shown in FIG. 1. FIG. 3 is a bottom view of the semiconductor device 1 shown in FIG. 1 and a bottom view which shows a first configuration example of a raised portion group 12.

With reference to FIG. 1, the semiconductor device 1 has an SiC semiconductor layer 2 which includes an SiC (silicon carbide) monocrystal. The SiC semiconductor layer 2 may include a 4H—SiC monocrystal.

The SiC semiconductor layer 2 has an off angle inclined at an angle of not more than 10° from a (0001) plane to a [11–20] direction. The off angle is, more specifically, not less than 0° and not more than 4° (for example, 2° or 4°). The off angle may be greater than 0° and less than 4°. The off angle is typically 2° or 4° and more specifically is set in a range of 2°±10% or a range of 4°±10%.

The SiC semiconductor layer 2 has a first main surface 3 on one side, a second main surface 4 on the other side and side surfaces 5A, 5B, 5C, 5D which connect the first main surface 3 and the second main surface 4. The first main surface 3 and the second main surface 4 are formed in quadrilateral shapes in a plan view as viewed in their normal directions (hereinafter, referred to simply as "plan view").

The side surface 5A faces the side surface 5D. The side surface 5B faces the side surface 5C. The four side surfaces 5A to 5D respectively extend as planes along the normal directions of the first main surface 3 and the second main surface 4. A length of each of the side surfaces 5A to 5D may be not less than 1 mm and not more than 10 mm (for example, not less than 2 mm and not more than 5 mm).

With reference to FIG. 1 and FIG. 2, an insulating layer 6, an electrode 7, an insulating layer 8, and a resin layer 9 are formed on the first main surface 3. An electrode 10 is formed on the second main surface 4. Structures of the insulating layer 6, the electrode 7, the insulating layer 8, the resin layer 9, and the electrode 10 will be described later.

With reference to FIG. 3 and the enlarged view of FIG. 3, a raised portion group 12 which includes a plurality of raised portions 11 is formed in the second main surface 4. The plurality of raised portions 11 are portions which are raised on the second main surface 4 along the normal direction of the second main surface 4.

The plurality of raised portions 11 are formed at intervals from each other along an arbitrary first direction X and a second direction Y which intersect the first direction X. The first direction X is one of the plane directions of the first main surface 3 of the Sic semiconductor layer 2.

In this embodiment, the first direction X is set in a direction parallel to the side surfaces 5B, 5D. The second direction Y is, more specifically, a direction orthogonal to the first direction X. That is, in this embodiment, the second direction Y is set in a direction parallel to the side surfaces 5A, 5C.

The raised portion group 12 has a first portion 17 in which some of the raised portions 11 among the plurality of raised portions 11 overlap in the first direction X in a first direction view as viewed in the first direction X. The raised portion group 12 has a second portion 18 in which some of the raised portions 11 among the plurality of raised portions 11 are formed separate from the first portion 17 and also overlap in the first direction X as viewed in the first direction view.

The plurality of raised portions 11 are formed successively along the first direction X. More specifically, the plurality of raised portions 11 have a dotted pattern in which the plurality of raised portions 11 are dotted at intervals along the first direction X and the second direction Y.

The plurality of raised portions 11 are formed successively along the first direction X, with this dotted pattern kept. In this embodiment, the plurality of raised portions 11 are formed over from a peripheral edge of the side surface 5A side on one side to a peripheral edge of the side surface 5C side on the other side in plan view.

A distance between the plurality of raised portions 11 of the raised portion group 12 formed at intervals in the first direction X may be different from each other. A distance between the plurality of raised portions 11 of the raised portion group 12 formed at intervals in the second direction Y may be different from each other.

The plurality of raised portions 11 may be formed to be of non-uniform shape, size and thickness, respectively. The thickness of the raised portion 11 is a distance from a base portion of the raised portion 11 to a top portion (leading end portion) thereof in terms of the normal direction of the second main surface 4.

The plurality of raised portions 11 may each have a size greater than 0 µm and not more than 10 µm in plan view. A thickness of each of the raised portions 11 may be greater than 0 µm and not more than 2 µm, not less than 2 µm and not more than 4 µm, not less than 4 µm and not more than 6 µm, not less than 6 µm and not more than 8 µm, or not less than 8 µm and not more than 10 µm.

The thickness of each of the raised portions 11 may be greater than 0 nm and not more than 500 nm. The thickness of each of the raised portions 11 may be greater than 0 nm and not less than 1 nm, not less than 1 nm and not more than 50 nm, not less than 50 nm and not more than 100 nm, not less than 100 nm and not more than 200 nm, not less than 200 nm and not more than 300 nm, not less than 300 nm and not more than 400 nm, or not less than 400 nm and not more than 500 nm.

The raised portion group 12 is formed in a range narrower than a width of each of the side surfaces 5A to 5D of the second main surface 4 (in this embodiment, the side surfaces 5A, 5C). The raised portion group 12 may be formed in a range of not less than 1/1000 and not more than 1/5 with respect to the width of each of the side surfaces 5A to 5D (in this embodiment, the side surfaces 5A, 5C).

The raised portion group 12 may be formed in a range of not less than 1/1000 and not more than 1/500, not less than 1/500 and not more than 1/100, not less than 1/100 and not more than 1/50, not less than 1/50 and not more than 1/10, or not less than 1/10 and not more than 1/5 with respect to the width of each of the side surfaces 5A to 5D.

The raised portion group 12 may be formed in a range of not less than 1/200 and not more than 1/10 with respect to the width of each of the side surfaces 5A to 5D (in this embodiment, the side surfaces 5A, 5C). The raised portion group 12 may be formed in a range of not less than 10 µm and not more than 200 µm in terms of the second direction Y.

The raised portion group 12 may be formed in a range of not less than 10 µm and not more than 50 µm, not less than 50 µm and not more than 100 µm, not less than 100 µm and not more than 150 µm, or not less than 150 µm and not more than 200 µm in terms of the second direction Y. The raised portion group 12 may be formed in a range of not less than 50 µm and not more than 150 µm or not less than 80 µm and not more than 120 µm in terms of the second direction Y.

The raised portion group 12 is laid out so that the plurality of raised portions 11 overlap in the first direction X in the first direction view as viewed in the first direction X. The raised portion group 12 forms a raised portion group region 13 which extends in a band shape along the first direction X by a collective pattern of the plurality of raised portions 11 that are dotted successively along the first direction X.

In other words, the raised portion group region 13 includes the plurality of raised portions 11 (the raised portion group 12) formed in a band-shaped region of the second main surface 4 which extends along the first direction X. A plurality of raised portion groups 12 (raised portion group regions 13) having the above-described configuration are formed at intervals along the second direction Y on the second main surface 4.

That is, the dotted pattern of the plurality of raised portions 11 is formed intermittently in a second direction view as viewed in the second direction Y. A distance between the plurality of raised portion groups 12 may have a value of not less than 1% and not more than 25% of a range in which the raised portion group 12 is formed. The distance between the plurality of raised portion groups 12 may have a value of not less than 1% and not more than 5%, not less than 5% and not more than 10%, not less than 10% and not more than 15%, not less than 15% and not more than 20% or not less than 20% and not more than 25% of the range in which the raised portion group 12 is formed.

A distance between the plurality of mutually adjacent raised portion groups 12 in terms of the second direction Y may be greater than 0 µm and not more than 100 µm. The distance between the plurality of raised portion groups 12 may be greater than 0 µm and not more than 20 µm, not less than 20 µm and not more than 40 µm, not less than 40 µm and not more than 60 µm, not less than 60 µm and not more than 80 µm, or not less than 80 µm and not more than 100 µm. The distance between the plurality of raised portion groups 12 may be not less than 5 µm and not more than 50 µm.

The first direction X may be set to the [11–20] direction and the second direction Y may be set to a [1–100] direction. That is, the raised portion groups 12 may each form a band-shaped raised portion group region 13 extending substantially parallel to or parallel to the [11–20] direction and may be formed in plurality at intervals along the [1–100] direction.

The first direction X may be set to the [1–100] direction and the second direction Y may be set to the [11–20] direction. That is, the raised portion groups 12 may each form a band-shaped raised portion group region 13 extending substantially parallel to or parallel to the [1–100] direction and may be formed in plurality at intervals along the [11–20] direction.

A space 14 is demarcated in a region of the second main surface 4 between the mutually adjacent raised portion groups 12 in the second direction Y. The space 14 is free from the dotted pattern which includes the plurality of raised portions 11.

The space 14 is demarcated in a band shape extending parallel to the first direction X by the mutually adjacent raised portion groups 12 (the raised portion group region 13). Thereby, on the second main surface 4, a stripe pattern including the raised portion group 12 and the space 14 which are formed alternately along the second direction Y is formed.

A plurality of grooves 16 are formed in the second main surface 4. In FIG. 3 and the enlarged view of FIG. 3, the groove 16 is indicated by a line. The groove 16 is formed in the raised portion group 12 and the space 14.

The plurality of grooves 16 include grinding marks formed due to grinding performed on a second wafer main surface 43 of an SiC semiconductor wafer 41 which will be described later. Therefore, a direction in which the groove 16 extends is different depending on a position at which the SiC semiconductor layer 2 is cut out from the SiC semiconductor wafer 41.

The groove 16 may extend substantially parallel to or parallel to each of the raised portion groups 12. The groove 16 may include a portion which intersects the raised portion group 12. The groove 16 may extend along a direction intersecting or orthogonal to each of the raised portion groups 12. The groove 16 may extend rectilinearly or may extend in a circular arc shape.

Some of the plurality of raised portions 11 included in each of the raised portion groups 12 are formed at intervals along the groove 16. That is, each of the raised portion groups 12 includes a third portion 19 in which some of the raised portions 11 among the plurality of raised portions 11 are formed at intervals along the groove 16 in plan view.

Each of the raised portion groups 12 is formed, for example, by an annealing method. The plurality of raised portions 11 may be laser processing marks formed by a laser annealing method.

The plurality of raised portions 11 along the grooves 16 (the third portion 19 of the raised portion group 12) may be formed by an annealing method performed on an unevenness demarcated by the groove 16 on the second main surface 4 (the second wafer main surface 43 of the SiC semiconductor wafer 41).

As shown in FIG. 4A to FIG. 4D, each of the raised portion groups 12 can assume a variety of configurations by adjusting annealing conditions (here, laser annealing conditions).

Figure 4A:
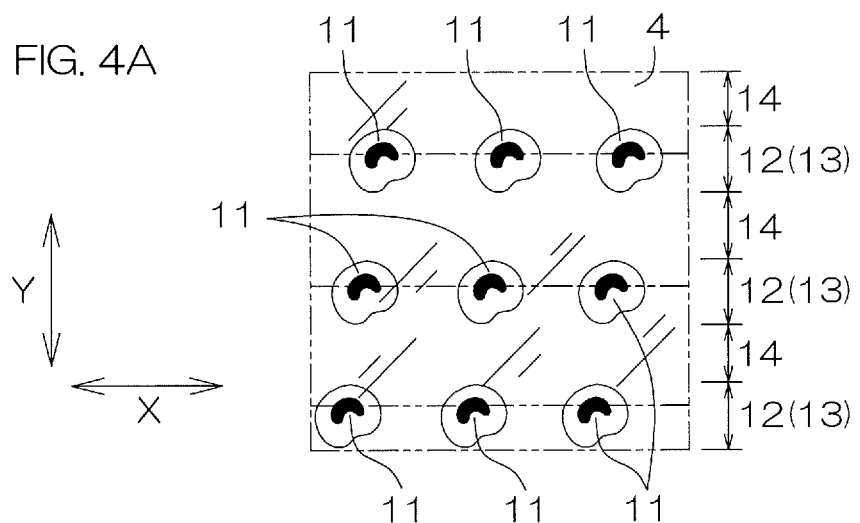
FIG. 4A is a diagram which shows a second configuration example of the raised portion group.

FIG. 4A is a diagram which shows a second configuration example of each of the raised portion groups 12.

As shown in FIG. 4A, the raised portion group 12 may include a raised portion 11 in a convex curved shape which extends along the first direction X and protrudes along the second direction Y (the side surface 5B side in FIG. 4A) in plan view. The raised portion 11 may be formed by a plurality of raised portions 11 which overlap each other.

A distance between the most separated two points in the raised portion 11 may be not less than 1 µm and not more than 200 µm (in the present configuration example, approximately 50 µm). A distance between a plurality of mutually adjacent raised portions 11 in terms of the first direction X is set at a value not less than 10% of the size of the raised portion 11. The plurality of raised portions 11 are formed by shifting mutually adjacent laser irradiation positions in the first direction X.

Figure 4B:
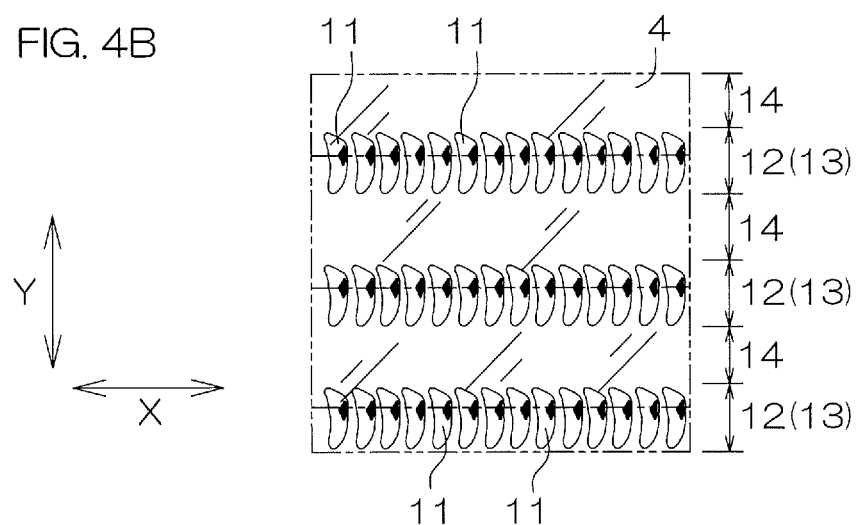
FIG. 4B is a diagram which shows a third configuration example of the raised portion group.

FIG. 4B is a diagram which shows a third configuration example of the raised portion group 12.

As shown in FIG. 4B, the raised portion group 12 may include a raised portion 11 in a concave curved shape which extends along the second direction Y and which is recessed along the first direction X in plan view. The raised portion 11 may also be formed by a plurality of raised portions 11 which overlap each other.

A distance between the most separated two points in each raised portion 11 may be not less than 1 µm and not more than 200 µm (in the present configuration example, approximately 50 µm). The plurality of raised portions 11 are formed by overlapping the mutually adjacent laser irradiation positions in a range of not less than 50% and not more than 70%.

FIG. 4C is a diagram which shows a fourth configuration example of the raised portion group 12.

As shown in FIG. 4C, the raised portion group 12 may include a raised portion 11 in a line shape which extends along the second direction Y and which is recessed along the first direction X in plan view. The raised portion 11 may include a protruding portion which protrudes along the first direction X. The raised portion 11 may also be formed by a plurality of raised portions 11 which overlap each other.

A distance between the most separated two points in the raised portion 11 may be not less than 1 µm and not more than 200 µm (in the present configuration example, approximately 50 µm). The plurality of raised portions 11 are formed by overlapping the mutually adjacent laser irradiation positions in a range of not less than 70% and not more than 90%.

FIG. 4D is a diagram which shows a fifth configuration example of the raised portion group 12.

As shown in FIG. 4D, the raised portion group 12 may be laid out so that raised portion column each including a plurality of raised portions 11 aligned at intervals along the second direction Y are formed at intervals along the first direction X.

A distance between the most separated two points in the raised portion 11 may be not less than 1 µm and not more than 200 µm (in the present configuration example, approximately 5 µm). The plurality of raised portions 11 are formed by overlapping the mutually adjacent laser irradiation positions in a range of not less than 90% and less than 100%.

Figure 5:
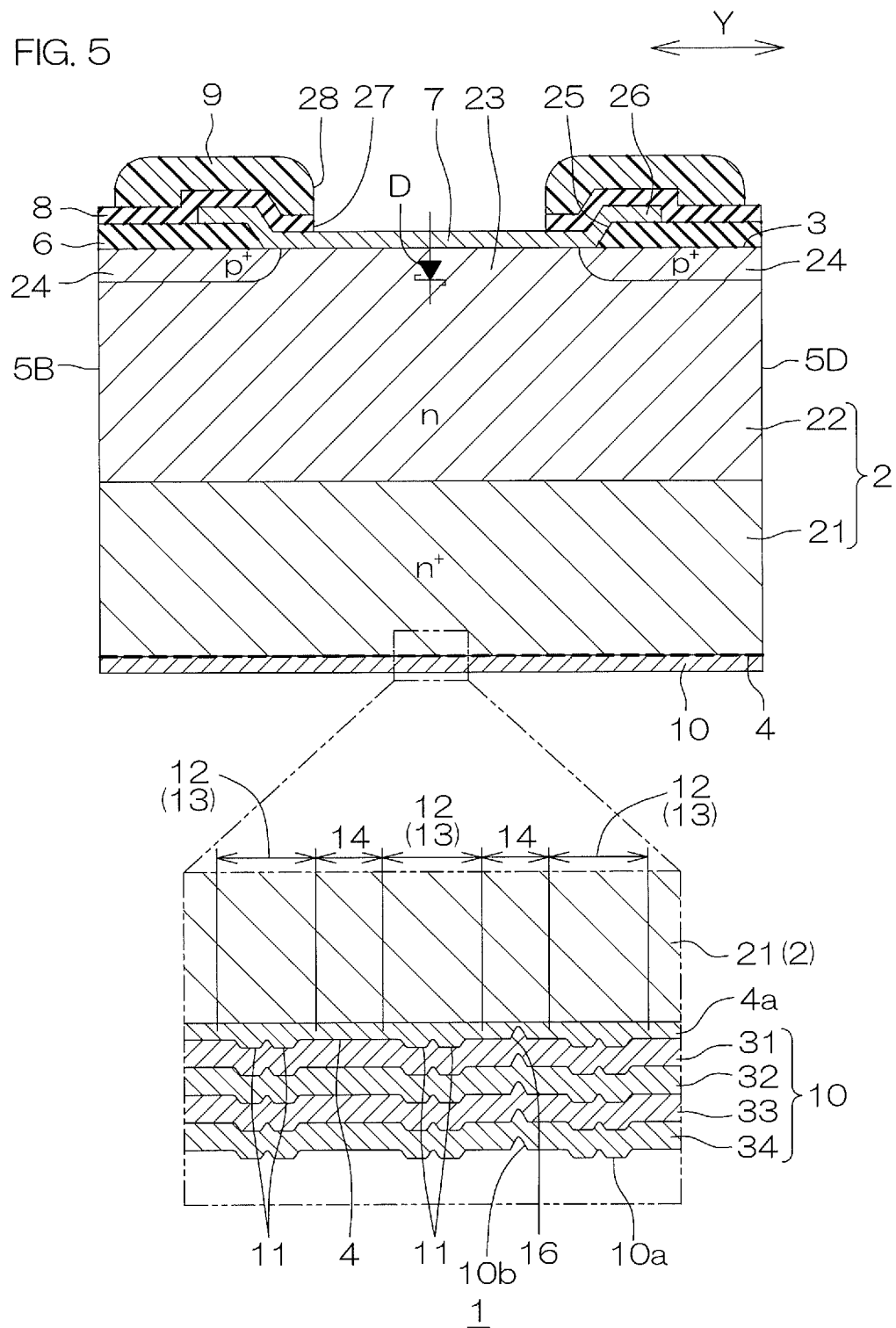
FIG. 5 is a sectional view taken along line V-V shown in FIG. 2.

FIG. 5 is a sectional view taken along line V-V shown in FIG. 3.

With reference to FIG. 5, in this embodiment, the SiC semiconductor layer 2 has a laminated structure which includes an $n^+$-type SiC semiconductor substrate 21 and an n-type SiC epitaxial layer 22. The SiC semiconductor substrate 21 forms the second main surface 4. The SiC epitaxial layer 22 forms the first main surface 3. The SiC semiconductor substrate 21 and the SiC epitaxial layer 22 form the side surfaces 5A to 5D.

A thickness of the SiC semiconductor substrate 21 may be not less than 5 µm and not more than 400 µm. The thickness of the SiC semiconductor substrate 21 may be not less than 5 µm and not more than 50 µm, not less than 50 µm and not more than 100 µm, not less than 100 µm and not more than 150 µm, not less than 150 µm and not more than 200 µm, not less than 200 µm and not more than 250 µm, not less than 250 µm and not more than 300 µm, not less than 300 µm and not more than 350 µm, or not less than 350 µm and not more than 400 µm.

The thickness of the SiC semiconductor substrate 21 is preferably not less than 80 µm and not more than 200 µm (for example, approximately 150 µm). Making the thickness of the SiC semiconductor substrate 21 small shortens a current path, thus making it possible to reduce a resistance value.

The SiC epitaxial layer 22 forms the first main surface 3 and portions of the side surfaces 5A to 5D. A thickness of the SiC epitaxial layer 22 may be not less than 1 µm and not more than 100 µm.

The thickness of the SiC epitaxial layer 22 may be not less than 1 µm and not more than 25 µm, not less than 25 µm and not more than 50 µm, not less than 50 µm and not more than 75 µm, or not less than 75 µm and not more than 100 µm. The thickness of the SiC epitaxial layer 22 is preferably not less than 5 µm and not more than 15 µm (for example, approximately 10 µm).

An n-type impurity concentration of the SiC epitaxial layer 22 is not more than an n-type impurity concentration of the SiC semiconductor substrate 21. The n-type impurity concentration of the SiC semiconductor substrate 21 may be not less than $1.0 \times 10^{18}$ cm$^{-3}$ and not more than $1.0 \times 10^{21}$ cm$^{-3}$. The n-type impurity concentration of the SiC epitaxial layer 22 may be not less than $1.0 \times 10^{15}$ cm$^{-3}$ and not more than $1.0 \times 10^{18}$ cm$^{-3}$.

With reference to FIG. 5 and the enlarged view of FIG. 5, the raised portion group 12 and the groove 16 described above are formed in the SiC semiconductor substrate 21. In a surface layer portion of the second main surface 4, a modified layer 4a in which SiC of the SiC semiconductor layer 2 (the SiC semiconductor substrate 21) is partially modified to have different properties is formed. The modified layer 4a is formed by an annealing method performed on the second main surface 4.

The modified layer 4a includes Si atoms and C atoms. More specifically, the modified layer 4a has a carbon density lower than a carbon density of a region of the SiC semiconductor layer 2 (the SiC semiconductor substrate 21) outside the modified layer 4a.

The modified layer 4a has a silicon density greater than the carbon density. That is, the modified layer 4a includes an Si modified layer in which SiC of the SiC semiconductor layer 2 (the SiC semiconductor substrate 21) is modified to Si. The modified layer 4a may be an Si amorphous layer.

The modified layer 4a may include a lattice defect due to the modification of SiC. That is, the modified layer 4a may include a lattice defect region having a defect level which is introduced due to the modification of SiC.

In this embodiment, the modified layer 4a is formed in a region of the surface layer portion of the second main surface 4 along the raised portion group 12. The plurality of raised portions 11 of each raised portion group 12 are formed by the modified layer 4a. That is, the plurality of raised portions 11 include the modified layer 4a.

In this embodiment, the modified layer 4a is also formed in the space 14. The modified layer 4a extends from the raised portion group 12 to the space 14. That is, the annealing method performed on the second main surface 4 extends to the space 14 as well.

A thickness of a portion of the modified layer 4a along the raised portion group 12 is not less than a thickness of a portion of the modified layer 4a along the space 14 due to the presence of the raised portion 11. More specifically, the thickness of the portion of the modified layer 4a along the raised portion group 12 is larger than the thickness of the portion of the modified layer 4a along the space 14.

The thickness of the modified layer 4a may be not less than 1 nm and not more than 1000 nm. A thickness Ta of a region of the modified layer 4a which forms the raised portion 11 may be not less than 50 nm and not more than 1000 nm. A thickness Tb of a region of the modified layer 4a outside the raised portion 11 may be not less than 1 nm and not more than 300 nm.

The thickness Ta may be not less than 50 nm and not more than 100 nm, not less than 100 nm and not more than 200 nm, not less than 200 nm and not more than 300 nm, not less than 300 nm and not more than 400 nm, not less than 400 nm and not more than 500 nm, not less than 500 nm and not more than 600 nm, not less than 600 nm and not more than 700 nm, not less than 700 nm and not more than 800 nm, not less than 800 nm and not more than 900 nm, or not less than 900 nm and not more than 1000 nm.

The thickness Tb may be not less than 1 nm and not more than 10 nm, not less than 10 nm and not more than 50 nm, not less than 50 nm and not more than 100 nm, not less than 100 nm and not more than 150 nm, not less than 150 nm and not more than 200 nm, not less than 200 nm and not more than 250 nm, or not less than 250 nm and not more than 300 nm.

The thickness Tb may be not more than $1/2$, not more than $1/3$, not more than $1/4$, not more than $1/5$, not more than $1/6$, not more than $1/7$, not more than $1/8$, not more than $1/9$, not more than $1/10$, not more than $1/11$, not more than $1/12$, not more than $1/13$, not more than $1/14$, not more than $1/15$, not more than $1/16$, not more than $1/17$, not more than $1/18$, not more than $1/19$, or not more than $1/20$ of the thickness Ta.

A resistance value of the second main surface 4 in a case where the raised portion group 12 is not present on the second main surface 4 is larger than a resistance value of the second main surface 4 in a case where the raised portion group 12 is present on the second main surface 4. That is, the plurality of raised portion groups 12 have a resistance value not more than a resistance value of an SiC monocrystal alone as electrical characteristics.

More specifically, the plurality of raised portion groups 12 have a resistance value less than the resistance value of the SiC monocrystal alone. Further, the plurality of raised portion groups 12 have a resistance value not more than a resistance value of the space 14. More specifically, the plurality of raised portion groups 12 have a resistance value less than the resistance value of the space 14.

The resistance value as electrical characteristics of the raised portion group 12 is reduced by the modified layer 4a. That is, the resistance value of the raised portion group 12 is not more than the resistance value of the SiC monocrystal due to the modified layer 4a. The resistance value as electrical characteristics of the space 14 is also not more than the resistance value of the SiC monocrystal due to the modified layer 4a.

The above-described electrode 10 is formed on the second main surface 4. The electrode 10 is directly connected to the second main surface 4. The electrode 10 covers the raised portion group 12 on the second main surface 4. In this embodiment, the electrode 10 collectively covers the plurality of raised portion groups 12.

The electrode 10 is formed as a film in conformity with an outer surface of the raised portion group 12 (outer surfaces of the plurality of raised portions 11) and an inner surface of the groove 16. Thereby, in a portion of an outer surface of the electrode 10 which covers the raised portion group 12 (the plurality of raised portions 11), a raised portion 10a which is raised in a direction away from the second main surface 4 is formed. Further, in a portion of the outer surface of the electrode 10 which covers the groove 16, a recess portion 10b which is recessed toward the second main surface 4 is formed.

The electrode 10 forms an ohmic contact with the second main surface 4. More specifically, the electrode 10 forms an ohmic contact with the raised portion group 12. Even more specifically, the electrode 10 forms an ohmic contact with the plurality of raised portion groups 12. In this embodiment, the electrode 10 forms an ohmic contact with the space 14 as well.

The electrode 10 has a laminated structure which includes a plurality of electrode layers laminated on the second main surface 4. In this embodiment, the electrode 10 has a four-layer structure which includes a Ti layer 31, an Ni layer 32, an Au layer 33, and an Ag layer 34 laminated in this order from the second main surface 4.

The Ti layer 31, the Ni layer 32, the Au layer 33, and the Ag layer 34 are respectively formed as films in conformity with the outer surface of the raised portion group 12 (outer surfaces of the plurality of raised portions 11) and the inner surface of the groove 16. The raised portion 10a and the recess portion 10b of the electrode 10 are formed in an outer surface of the Ag layer 34.

The Ti layer 31 is directly connected to the second main surface 4. The Ti layer 31 collectively covers the plurality of raised portion groups 12 to form an ohmic contact with the second main surface 4. In this embodiment, the Ti layer 31 forms an ohmic contact with the space 14 as well.

The Ni layer 32 covers a substantially entire region or an entire region of the Ti layer 31. The Au layer 33 covers a substantially entire region or an entire region of the Ni layer 32. The Ag layer 34 covers a substantially entire region or an entire region of the Au layer 33.

A thickness of the Ti layer 31 may be not less than 0.01 μm and not more than 5 μm (for example, approximately 0.07 µm). A thickness of the Ni layer 32 may be not less than 0.1 µm and not more than 40 µm (for example, approximately 1.2 µm).

A thickness of the Au layer 33 may be not less than 0.1 µm and not more than 40 µm (for example, approximately 0.07 µm). A thickness of the Ag layer 34 may be not less than 0.1 µm and not more than 40 µm (for example, approximately 0.3 µm). The electrode 10 may have a single layer structure constituted of the Ti layer 31, the Ni layer 32, the Au layer 33, or the Ag layer 34.

The electrode 10 forms an ohmic contact with the second main surface 4 not via a silicide layer which includes silicide as a major constituent. The electrode 10 forms an ohmic contact with the raised portion group 12 not via the silicide layer which includes silicide as a major constituent.

The electrode 10 forms an ohmic contact with the second main surface 4 not via a carbon layer which includes carbon as a major constituent. The electrode 10 forms an ohmic contact with the raised portion group 12 not via the carbon layer which includes carbon as a major constituent.

The electrode 10 does not include a region in which a material which includes silicide as a major constituent is formed as a layer. The electrode 10 also does not include a region in which a material which includes carbon as a major constituent is formed as a layer.

The electrode 10 is engaged with an uneven portion which is demarcated by the raised portion group 12 (the plurality of raised portions 11) and the plurality of grooves 16. A contact area of the electrode 10 with the second main surface 4 is increased by the raised portion group 12 (the plurality of raised portions 11). Thereby, adhesion of the electrode 10 to the second main surface 4 is enhanced. The contact area of the electrode 10 with the second main surface 4 is increased by the plurality of grooves 16 as well.

An n-type diode region 23 is formed in the SiC epitaxial layer 22. The diode region 23 is partially exposed from the first main surface 3. In this embodiment, the diode region 23 is formed by a partial region of the SiC epitaxial layer 22.

The diode region 23 may be formed by introducing an n-type impurity (donor) into a surface layer portion of the SiC epitaxial layer 22. In this case, the diode region 23 may have an n-type impurity concentration higher than the n-type impurity concentration of the SiC epitaxial layer 22.

The diode region 23 is formed in a central portion of the first main surface 3 in plan view. The diode region 23 is formed in a quadrilateral shape having four sides parallel to the side surfaces 5A to 5D in plan view. The diode region 23 may be formed in a circular shape in plan view.

An impurity region 24 is formed at a periphery of the diode region 23 in the surface layer portion of the SiC epitaxial layer 22. The impurity region 24 is a region into which a p-type impurity (acceptor) is introduced along the periphery of the diode region 23. The impurity region 24 has a p-type impurity concentration higher than the n-type impurity concentration of the SiC epitaxial layer 22.

In this embodiment, no activation treatment is applied to the p-type impurity which forms the impurity region 24. The impurity region 24 is formed as a non-semiconductor region which is not a p-type semiconductor region. The p-type impurity which forms the impurity region 24 may be activated. In this case, the impurity region 24 becomes a p-type semiconductor region.

The impurity region 24 extends in a band shape along a peripheral edge of the diode region 23. In this embodiment, the impurity region 24 is formed in an endless shape (quadrilateral annular shape) which surrounds the diode region 23. The impurity region 24 is referred to also as a guard ring region. An inner peripheral edge of the impurity region 24 defines the diode region 23.

The impurity region 24 may be exposed from the side surfaces 5A to 5D. The impurity region 24 may be formed at intervals from the side surfaces 5A to 5D toward an inner region thereof.

The above-described insulating layer 6 is formed on the first main surface 3. The insulating layer 6 may include silicon oxide. The insulating layer 6 has an opening 25 exposing the diode region 23. In this embodiment, the opening 25 also exposes a boundary between the diode region 23 and the impurity region 24. The opening 25 is formed in a quadrilateral shape having four sides parallel to the side surfaces 5A to 5D in plan view.

An electrode 7 is formed on the diode region 23 of the first main surface 3. The electrode 7 forms a Schottky junction with the diode region 23. Thereby, a Schottky barrier diode D in which the electrode 7 is deemed to be an anode and the diode region 23 is deemed to be a cathode is formed.

A peripheral edge portion of the electrode 7 is formed at intervals from the side surfaces 5A to 5D to an inner region thereof. The peripheral edge portion of the electrode 7 may overlap with the impurity region 24 in plan view. The electrode 7 is formed in a quadrilateral shape having four sides parallel to the side surfaces 5A to 5D in plan view.

The electrode 7 has a covering portion 26. The covering portion 26 is led out from on the first main surface 3 to on the insulating layer 6, and covers a portion of the insulating layer 6. A width of the covering portion 26 may be not less than a line width of the raised portion group 12.

The electrode 7 includes at least one type of aluminum, copper, molybdenum, nickel, an aluminum-copper alloy, an aluminum-silicon alloy and an aluminum-silicon-copper alloy. In this embodiment, the electrode 7 includes an aluminum-copper alloy.

The above-described insulating layer 8 is formed on the insulating layer 6. In this embodiment, the insulating layer 8 includes silicon nitride. The insulating layer 8 may include silicon oxide in place of or in addition to silicon nitride. The insulating layer 8 covers the electrode 7. The insulating layer 8 has a first opening 27 exposing the electrode 7.

In this embodiment, the first opening 27 covers the peripheral edge portion of the electrode 7 and exposes the inner region of the electrode 7. The first opening 27 is formed in a quadrilateral shape having four sides parallel to the side surfaces 5A to 5D in plan view.

The above-described resin layer 9 is formed on the insulating layer 8. In this embodiment, the resin layer 9 includes a photosensitive resin. The resin layer 9 may include a negative type or a positive type photosensitive resin.

In this embodiment, the resin layer 9 includes polybenzoxazole as an example of the positive type photosensitive resin. The resin layer 9 may include polyimide as an example of the negative type photosensitive resin.

The resin layer 9 is formed in a quadrilateral shape having four sides parallel to the side surfaces 5A to 5D in plan view. A peripheral edge portion of the resin layer 9 is formed at intervals from the side surfaces 5A to 5D to an inner region thereof and exposes the first main surface 3. More specifically, the peripheral edge portion of the resin layer 9 exposes the insulating layer 8.

A second opening 28 is formed in an inner portion of the resin layer 9. The second opening 28 is in communication with the first opening 27 and exposes the electrode 7. An inner wall of the second opening 28 may be positioned outside the first opening 27. The inner wall of the second opening 28 may be positioned inside the first opening 27.

FIG. 6A is a top view which shows an SiC semiconductor wafer 41 that is used in manufacturing of the semiconductor device 1 shown in FIG. 1. FIG. 6B is a bottom view of the SiC semiconductor wafer 41 shown in FIG. 6A and a view which shows a state after a grinding step and annealing performed on a second wafer main surface 43 of the SiC semiconductor wafer 41.

With reference to FIG. 6A and FIG. 6B, the SiC semiconductor wafer 41 is constituted of a plate-shaped SiC monocrystal which is formed in a discoid shape. The SiC semiconductor wafer 41 has a first wafer main surface 42 on one side, a second wafer main surface 43 on the other side, and a wafer side surface 44 which connects the first wafer main surface 42 and the second wafer main surface 43.

The SiC semiconductor wafer 41 may include a 4H—SiC monocrystal. The first wafer main surface 42 has an off angle inclined at an angle of not more than 10° from a (0001) plane with respect to the [11−20] direction. The off angle may be not less than 0° and not more than 4°. The off angle may be greater than 0° and less than 4°. The off angle is typically 2° or 4°, and more specifically is set in a range of 2°±10% or a range of 4°±10%.

The SiC semiconductor wafer 41 includes one or a plurality of (in this embodiment, one) orientation flats 45 formed in the wafer side surface 44. The orientation flat 45 is formed as an example of a marker indicating a crystal orientation. The orientation flat 45 includes a notched portion formed at a peripheral edge of the SiC semiconductor wafer 41. In this embodiment, the orientation flat 45 extends rectilinearly along the [11−20] direction.

The first wafer main surface 42 is an element forming surface in which a semiconductor element (in this embodiment, a Schottky barrier diode D) is formed. In the first wafer main surface 42, a plurality of device forming regions 46 each of which corresponds to the semiconductor device 1 are set.

In this embodiment, the plurality of device forming regions 46 are arrayed in a matrix along the [11−20] direction ([−1−120] direction) and the [1−100] direction ([−1100] direction).

The plurality of device forming regions 46 are demarcated by lattice-shaped dicing lines 47. The semiconductor device 1 is cut out by cutting the SiC semiconductor wafer 41 along peripheral edges (the dicing lines 47) of the plurality of device forming regions 46.

With reference to FIG. 6B, in a state after the grinding step and annealing performed on the second wafer main surface 43, the plurality of raised portion groups 12 and a plurality of grinding marks 48 are formed in the second wafer main surface 43.

The plurality of raised portion groups 12 are formed in a stripe shape that is substantially parallel to or parallel to the orientation flat 45. The plurality of raised portion groups 12 may be formed in a stripe shape intersecting or orthogonal to the orientation flat 45.

The plurality of grinding marks 48 each extend in a circular arc shape from a central portion of the SiC semiconductor wafer 41 to a peripheral edge portion thereof. In general, the plurality of grinding marks 48 include grinding marks 48 intersecting the [11−20] direction and the [1−100] direction.

The plurality of grinding marks 48 include a grinding mark 48 extending substantially parallel to or parallel to the [11−20] direction or the [1−100] direction in a portion where a tangent line of the circular arc runs along the [11−20] direction or the [1−100] direction. The grooves 16 formed in the second main surface 4 of the SiC semiconductor layer 2 may be formed by portions of the grinding marks 48.

FIG. 7 is a flowchart which describes an example of a method for manufacturing the semiconductor device 1 shown in FIG. 1. FIG. 8A to FIG. 8R are each a sectional view which shows the method for manufacturing the semiconductor device 1 shown in FIG. 1. In FIG. 8A to FIG. 8R, only one device forming region 46 is shown.

With reference to FIG. 8A, the $n^+$-type SiC semiconductor wafer 41 described above is first prepared (Step S1 in FIG. 7). The SiC semiconductor wafer 41 serves as a base of the SiC semiconductor substrate 21.

Figure 8B:
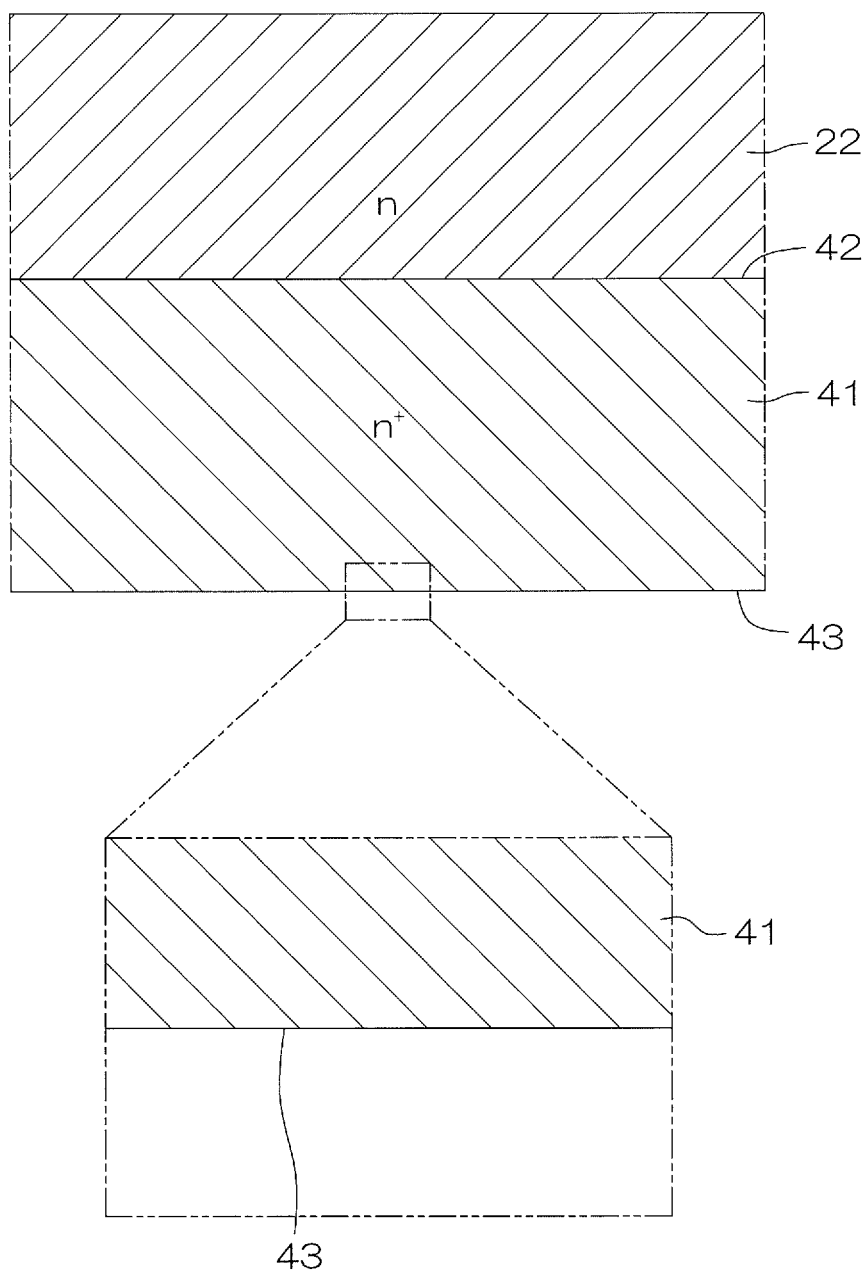
FIG. 8B is a sectional view which shows a step after FIG. 8A.

Then, with reference to FIG. 8B, the n-type SiC epitaxial layer 22 is formed on the first wafer main surface 42 (Step S2 in FIG. 7). The SiC epitaxial layer 22 is formed by growing SiC from above the first wafer main surface 42 by an epitaxial growth method.

Next, with reference to FIG. 8C, the diode region 23 is set in a main surface of the SiC epitaxial layer 22. Then, the impurity region 24 is formed in the surface layer portion of the SiC epitaxial layer 22 so as to demarcate the diode region 23 (Step S3 in FIG. 7). In this step, a p-type impurity is introduced into the surface layer portion of the SiC epitaxial layer 22 by an ion implantation method via an ion implantation mask 51.

Figure 8D:
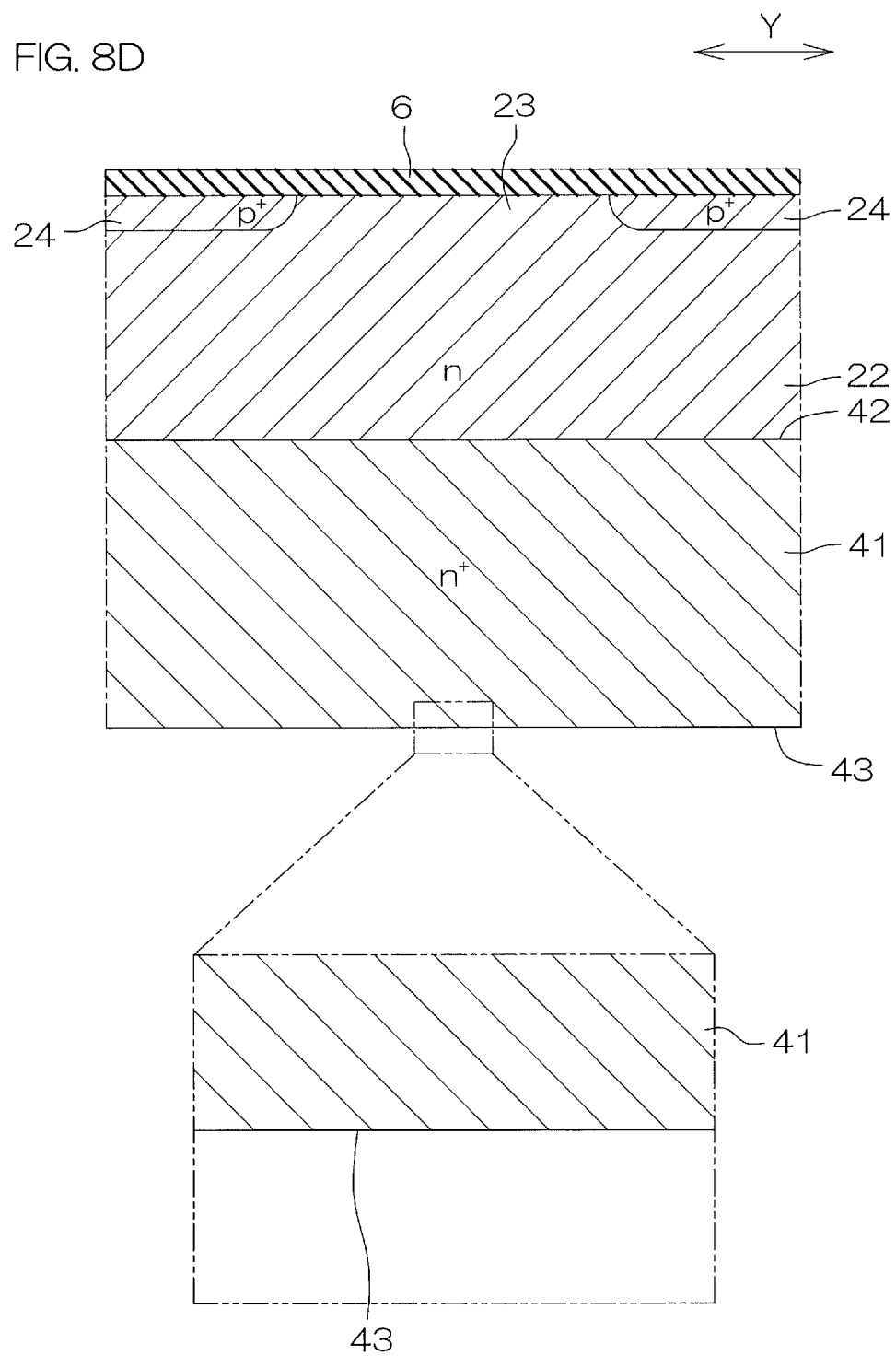
FIG. 8D is a sectional view which shows a step after FIG. 8C.

Next, with reference to FIG. 8D, the insulating layer 6 is formed on the main surface of the SiC epitaxial layer 22 (Step S4 in FIG. 7). The insulating layer 6 may include silicon oxide. The insulating layer 6 may be formed by a thermal oxidation treatment method or a CVD (chemical vapor deposition) method.

Next, with reference to FIG. 8E, an unnecessary portion of the insulating layer 6 is removed (Step S5 in FIG. 7). The unnecessary portion of the insulating layer 6 may be removed by an etching method via a mask 52 having a predetermined pattern (for example, a wet etching method). The mask 52 has an opening 53 exposing a region of the insulating layer 6 at which the opening 25 is to be formed. Thereby, the opening 25 is formed in the insulating layer 6.

Next, with reference to FIG. 8F, the electrode 7 is formed on the main surface of the SiC epitaxial layer 22 (Step S6 in FIG. 7). The electrode 7 may include an aluminum-copper alloy. The electrode 7 may be formed by a sputtering method or a CVD method.

Figure 8G:
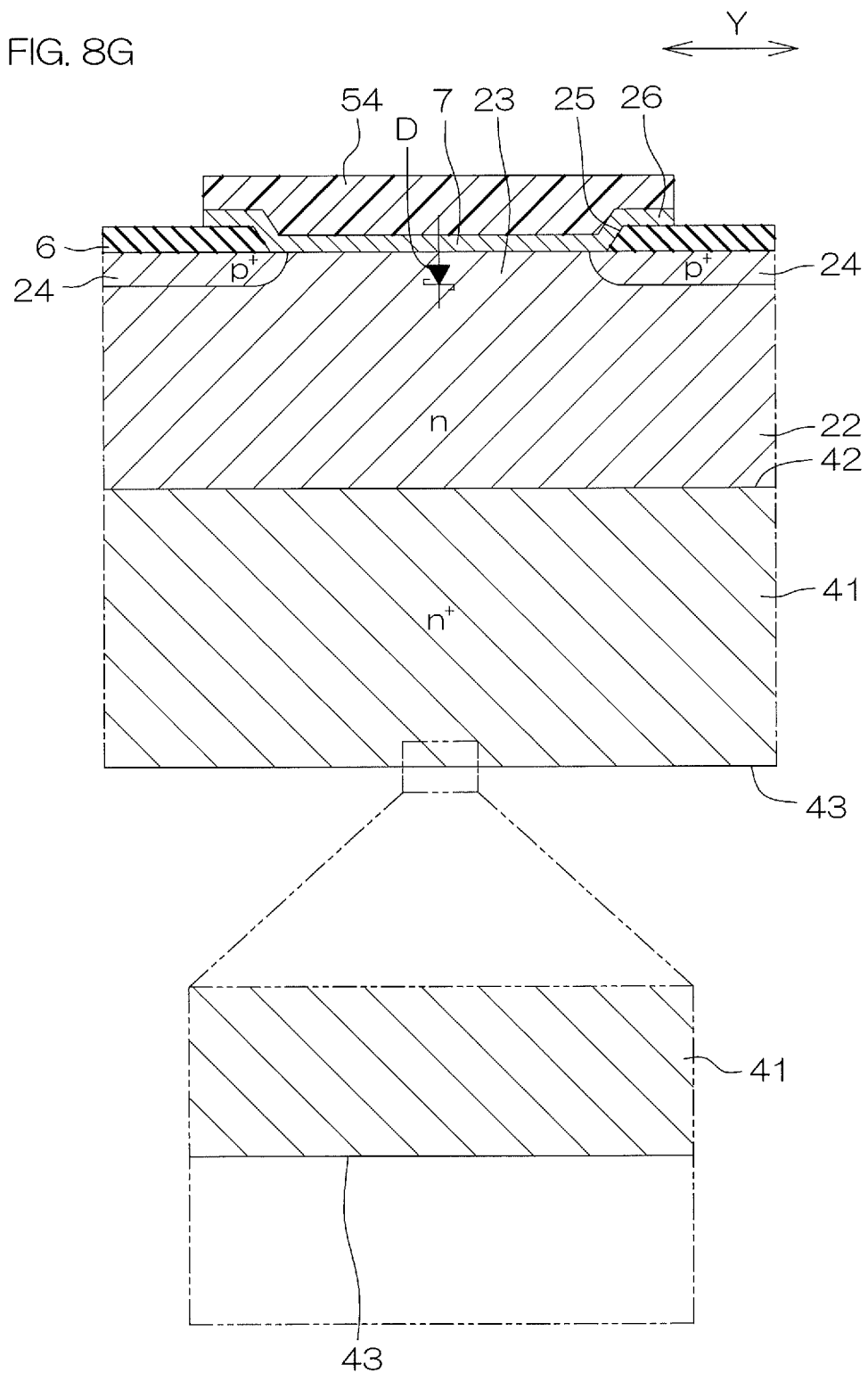
FIG. 8G is a sectional view which shows a step after FIG. 8F.

Next, with reference to FIG. 8G, an unnecessary portion of the electrode 7 is removed (Step S7 in FIG. 7). The unnecessary portion of the electrode 7 may be removed by an etching method via a mask 54 having a predetermined pattern (for example, a dry etching method). Thereby, the electrode 7 is patterned into a predetermined shape.

Figure 8H:
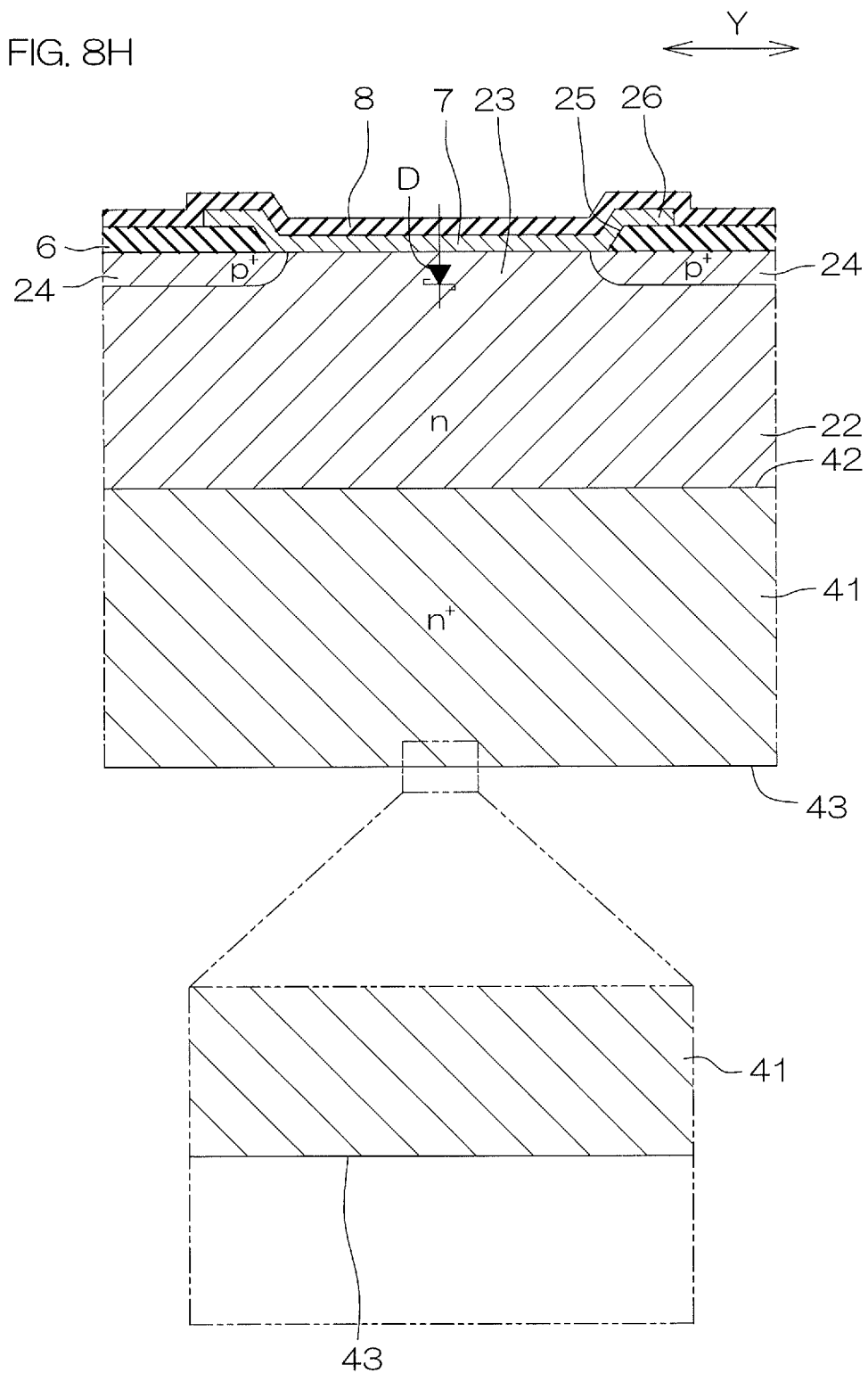
FIG. 8H is a sectional view which shows a step after FIG. 8G.
Figure 8:
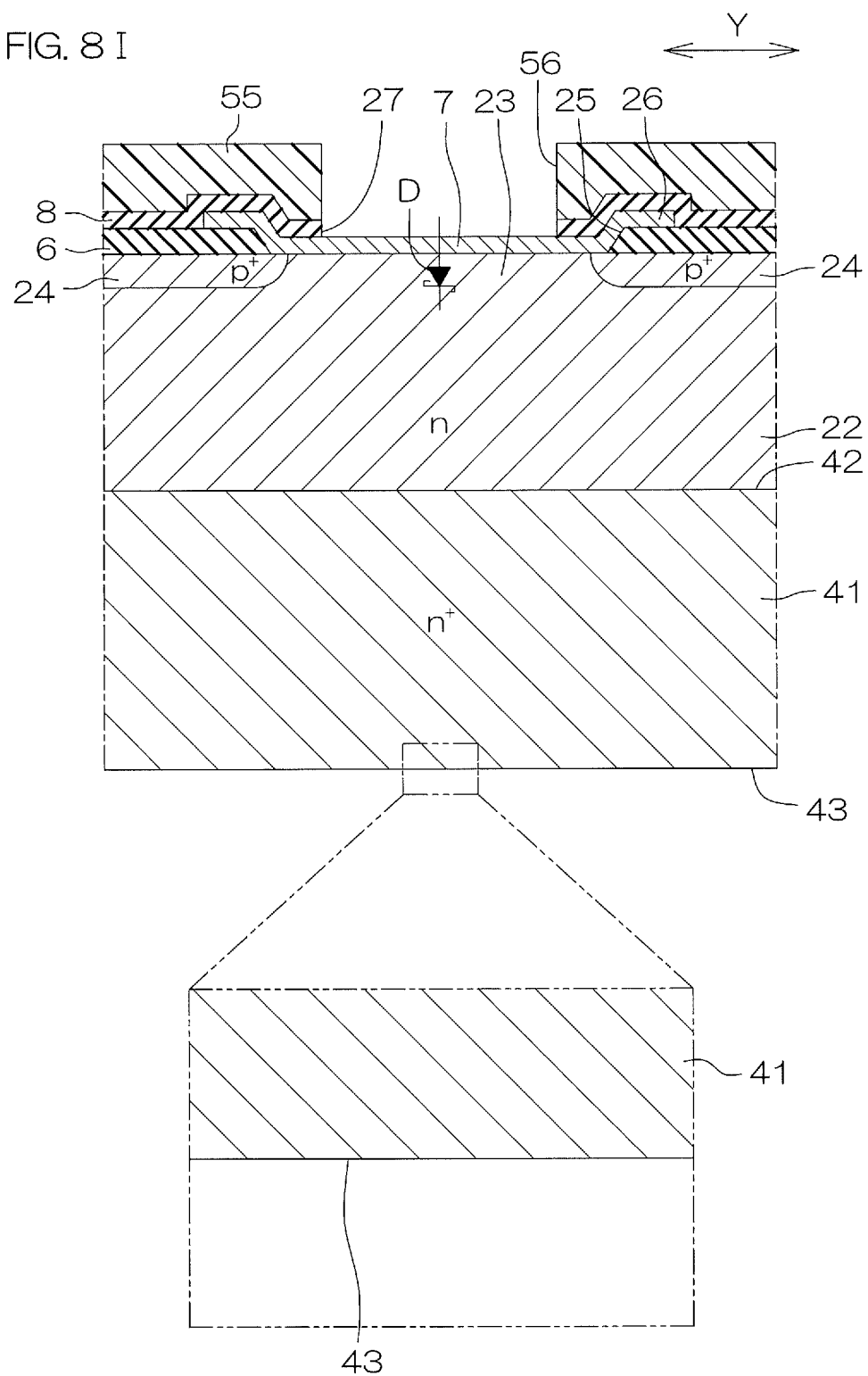
FIG. 8A is a sectional view which shows the method for manufacturing the semiconductor device shown in FIG. 1.
FIG. 8C is a sectional view which shows a step after FIG. 8B.
FIG. 8E is a sectional view which shows a step after FIG. 8D.
FIG. 8F is a sectional view which shows a step after FIG. 8E.
FIG. 8I is a sectional view which shows a step after FIG. 8H.
FIG. 8J is a sectional view which shows a step after FIG. 8I.
FIG. 8K is a sectional view which shows a step after FIG. 8J.
FIG. 8L is a sectional view which shows a step after FIG. 8K.
FIG. 8M is a sectional view which shows a step after FIG. 8L.
FIG. 8N is a sectional view which shows a step after FIG. 8M.
FIG. 8O is a sectional view which shows a step after FIG. 8N.
FIG. 8P is a sectional view which shows a step after FIG. 8O.
FIG. 8Q is a sectional view which shows a step after FIG. 8P.
FIG. 8R is a sectional view which shows a step after FIG. 8Q.

Next, with reference to FIG. 8H, the insulating layer 8 is formed on the insulating layer 6 so as to cover the electrode 7 (Step S8 in FIG. 7). The insulating layer 8 includes silicon nitride. The insulating layer 8 may be formed by a CVD method.

Next, with reference to FIG. 8I, an unnecessary portion of the insulating layer 8 is removed (Step S9 in FIG. 7). The unnecessary portion of the insulating layer 8 may be removed by an etching method via a mask 55 having a predetermined pattern (for example, a wet etching method). The mask 55 has an opening 56 exposing a region of the insulating layer 8 at which the first opening 27 is to be formed. Thereby, the first opening 27 is formed in the insulating layer 8.

Figure 8J:
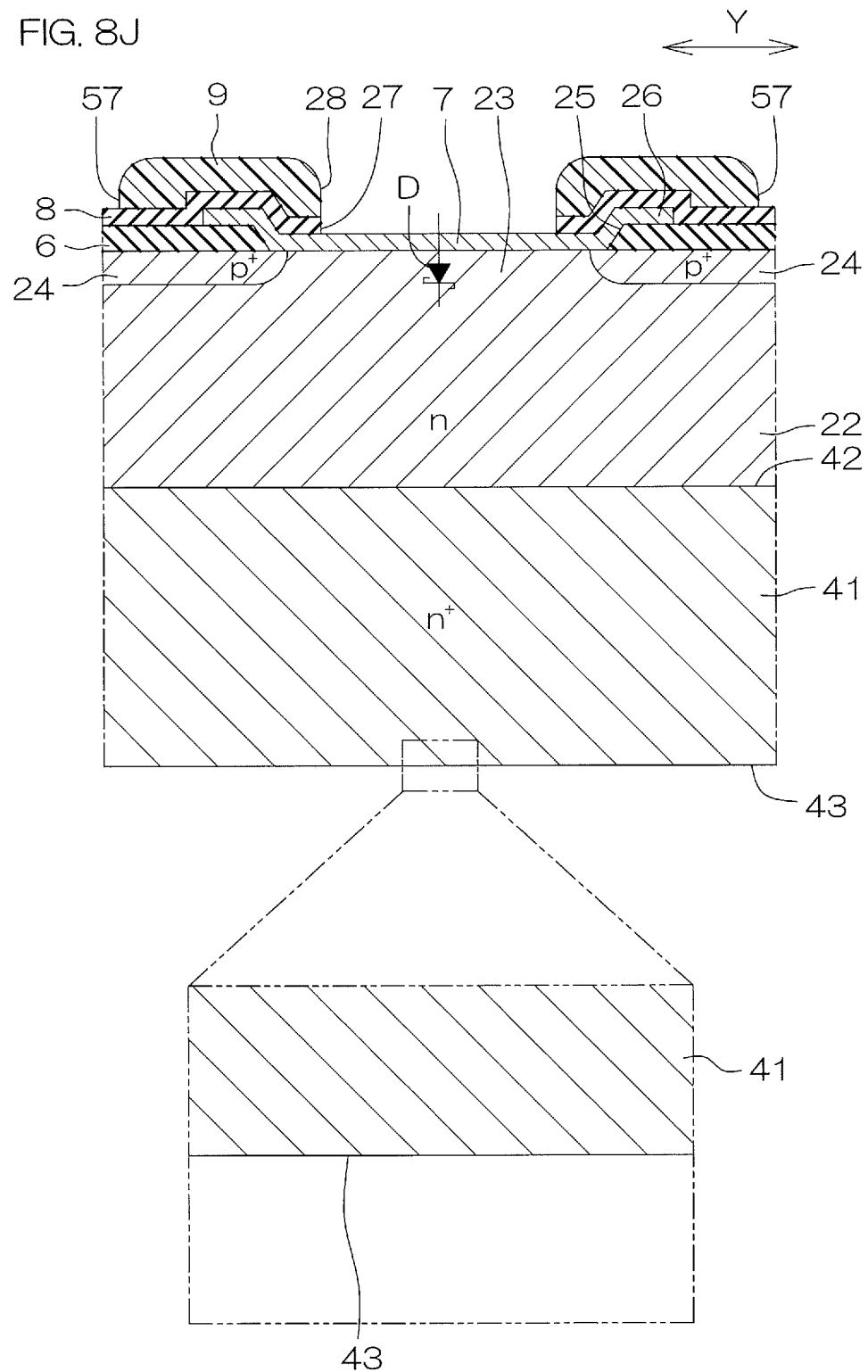

Next, with reference to FIG. 8J, the resin layer 9 is applied on the insulating layer 8 so as to cover the electrode 7 (Step S12 in FIG. 7). In this embodiment, the resin layer 9 includes polybenzoxazole as an example of the positive type photosensitive resin.

Next, the resin layer 9 is selectively exposed and thereafter developed (Step S11 in FIG. 7). Thereby, the second opening 28 in communication with the first opening 27 and a dicing opening 57 exposing the dicing lines 47 are formed in the resin layer 9.

Figure 8K:
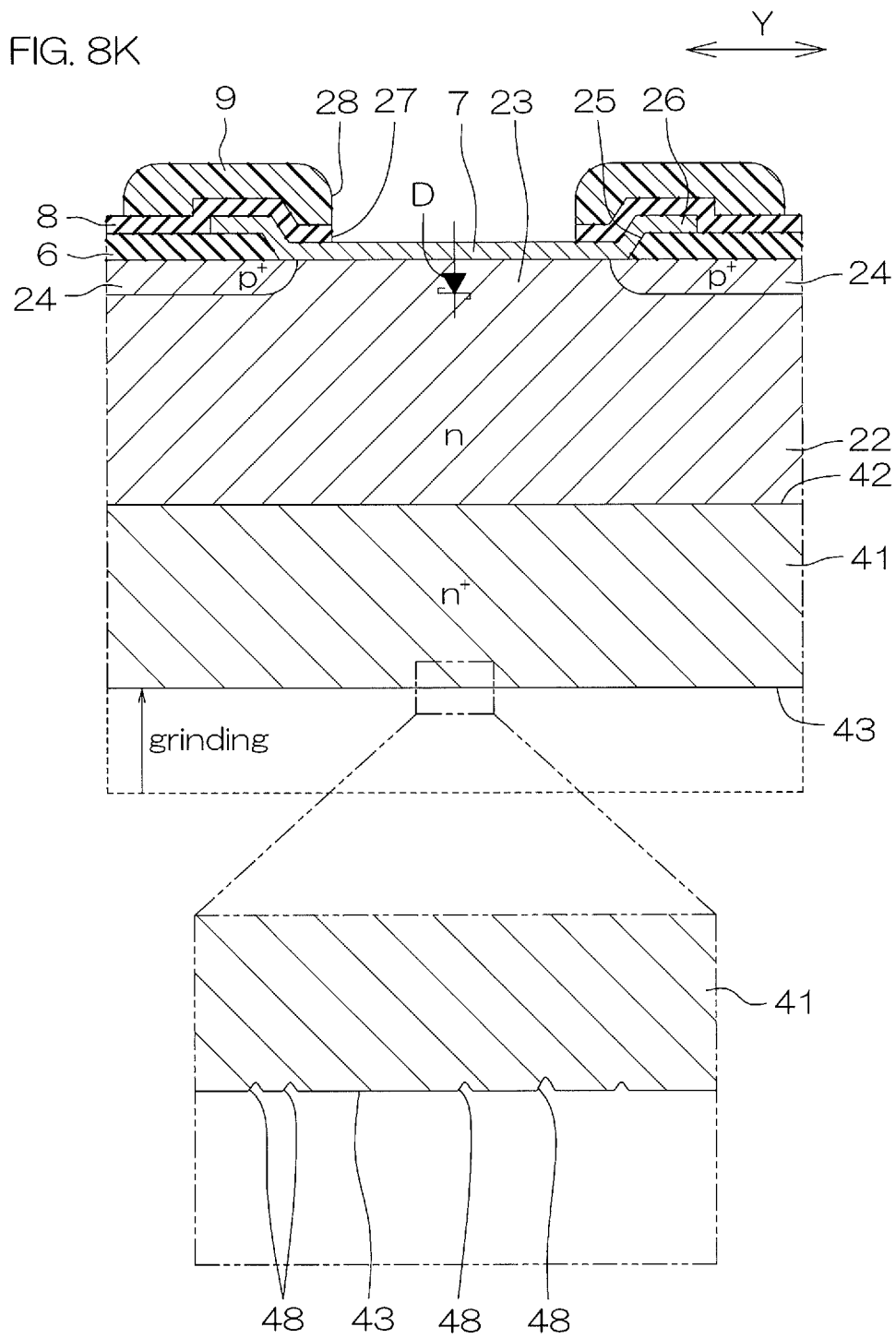

Next, with reference to FIG. 8K, the second wafer main surface 43 is ground (Step S12 in FIG. 7). In this step, the second wafer main surface 43 is ground by using abrasive grains with a grain size of #500 or higher. The grain size of the abrasive grains is preferably not less than #1000 and not more than #5000. Thereby, the plurality of grinding marks 48 are formed in the second wafer main surface 43 (refer also to FIG. 6B). Further, the second wafer main surface 43 is flattened and at the same time the SiC semiconductor wafer 41 is made thin.

Next, with reference to FIG. 8L, a metal layer 61 is formed on the second wafer main surface 43 (Step S13 in FIG. 7). In this embodiment, the metal layer 61 is constituted of an Ni layer. The Ni layer may be formed by a sputtering method. A thickness of the Ni layer may be not less than 100 Å and not more than 1000 Å.

Figure 8M:
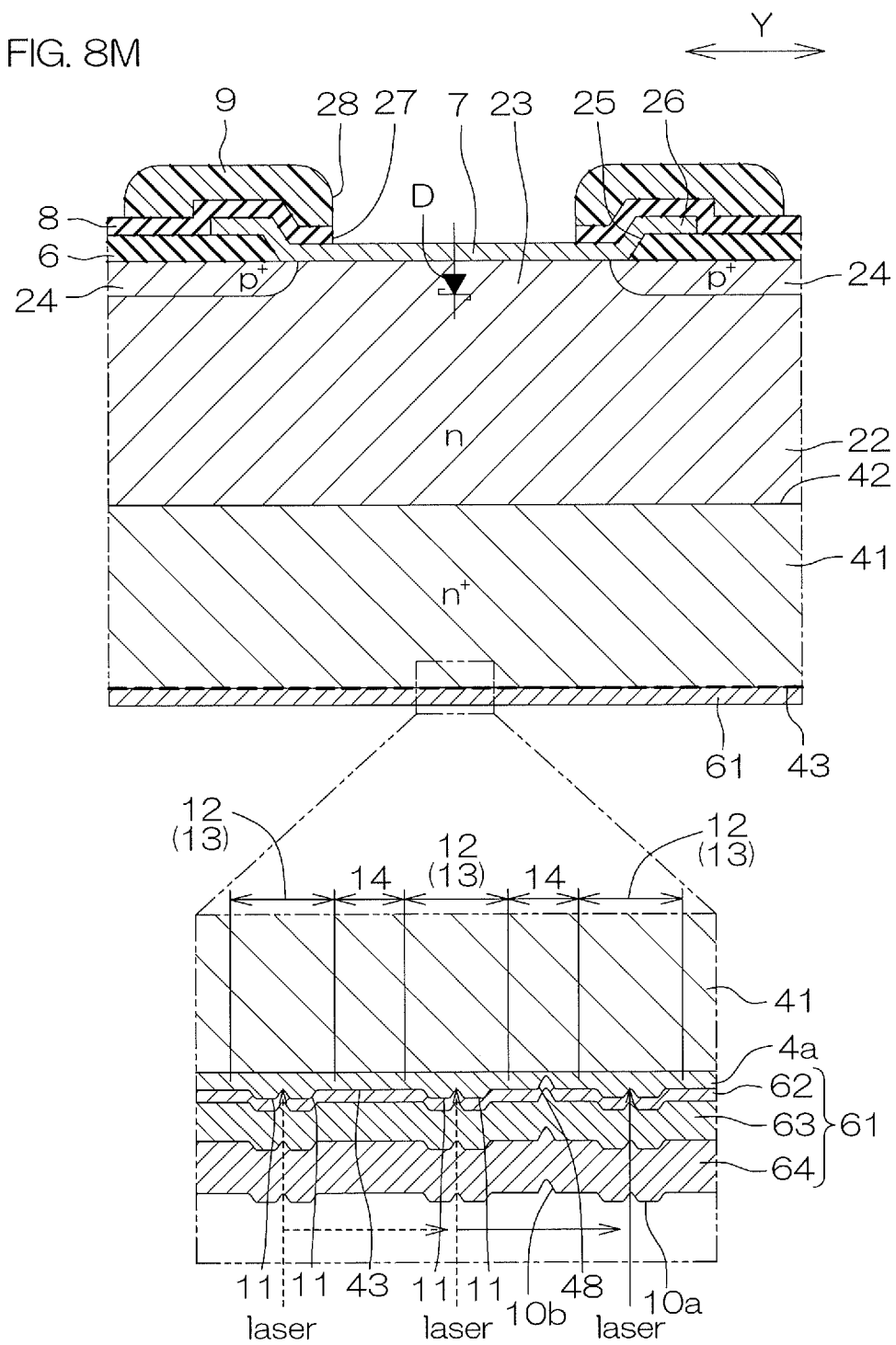
Figure 80:
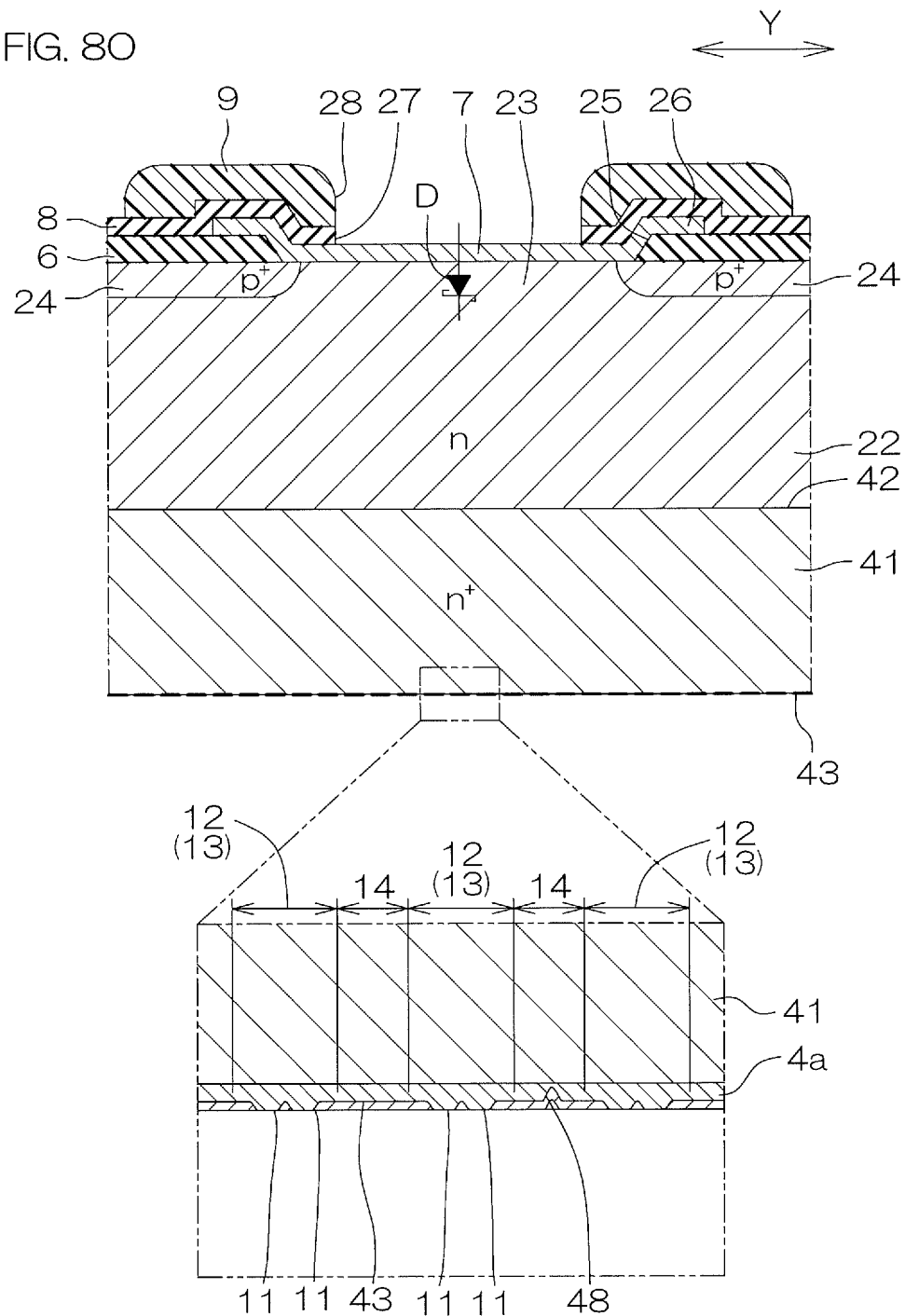

Next, with reference to FIG. 8M, an annealing method is performed on the second wafer main surface 43 (Step S14 in FIG. 7). In this step, a laser annealing method is performed as an example of the annealing method.

In the laser annealing method, pulsed laser light having a laser diameter φ of not less than 50 μm and not more than 200 μm (for example, approximately 100 μm) is used. The pulsed laser light is UV laser light having a wavelength in the ultraviolet region. Energy of the pulsed laser light may be not less than 1.0 J/cm$^2$ and not more than 4.0 J/cm$^2$ (for example, approximately 3.0 J/cm$^2$).

The pulsed laser light is shot onto the second wafer main surface 43 via the metal layer 61. In parallel with irradiation of the pulsed laser light onto the second wafer main surface 43, an irradiation position of the pulsed laser light onto the second wafer main surface 43 is moved along the orientation flat 45. One or a plurality of raised portions 11 are formed in a region of the second wafer main surface 43 onto which the pulsed laser light is shot.

Further, in the region of the second wafer main surface 43 onto which the pulsed laser light is shot, the modified layer 4a in which SiC of the SiC semiconductor wafer 41 is modified to have different properties is formed. More specifically, SiC of the SiC semiconductor wafer 41 is modified to Si by eliminating and/or sublimating C atoms from SiC by heating.

Thereby, the modified layer 4a which includes the Si modified layer is formed. The modified layer 4a may include a silicon amorphous layer. The modified layer 4a may include C atoms. One or the plurality of raised portions 11 formed in the second wafer main surface 43 may be formed by the modified layer 4a. Thereby, one raised portion group 12 which includes the plurality of raised portions 11 and runs along the orientation flat 45 ([11–20] direction) is formed in the second wafer main surface 43.

After formation of one raised portion group 12 (the raised portion group region 13), the irradiation position of the pulsed laser light is moved in the [1–100] direction. Then, in parallel with irradiation of the pulsed laser light onto the second wafer main surface 43, the irradiation position of the pulsed laser light onto the second wafer main surface 43 is moved along the orientation flat 45.

Thereby, another raised portion group 12 which extends substantially parallel to or parallel to one raised portion group 12 is formed in the second wafer main surface 43. In the laser annealing method, the above-described step is repeated until the plurality of raised portion groups 12 are formed across a substantially entire region or an entire region of the second wafer main surface 43 (refer also to FIG. 6B).

In this embodiment, the metal layer 61 after the laser annealing method has a laminated structure which includes a carbon layer 62, an NiSi (nickel silicide) layer 63, and an Ni layer 64 laminated in this order from the second wafer main surface 43 side. That is, the laser annealing treatment method includes a step of reacting the metal layer 61 with the SiC semiconductor wafer 41 to forma silicide. More specifically, the laser annealing method includes a step of forming the NiSi layer 63.

In the laser annealing method, the carbon layer 62 which includes C atoms is formed as a by-product inside the metal layer 61 in addition to the NiSi layer 63. The carbon layer 62 is formed by segregation of the C atoms which have constituted SiC.

The carbon layer 62 and the NiSi layer 63 can serve as peeling starting points in the metal layer 61. That is, although the metal layer 61 can be used as the electrode 10 as it is, the metal layer 61 has such problems of a connection failure and an increase in resistance value due to the connection failure. Therefore, it is preferable that a metal layer different from the metal layer 61 is formed as the electrode 10.

A temperature applied to the metal layer 61 with the formation of the NiSi layer 63 is not less than a melting point of the electrode 7 (for example, not less than 1000°). According to the laser annealing method, a temperature of the second wafer main surface 43 can be locally increased, thus making it possible to suppress an increase in temperature of the electrode 7. It is, therefore, possible to appropriately suppress melting of the electrode 7.

Next, with reference to FIG. 8N, a step of removing the metal layer 61 is performed. The step of removing the metal layer 61 is performed until the second wafer main surface 43 is exposed.

In this step, the NiSi layer 63 and the Ni layer 64 inside the metal layer 61 are first removed (Step S15 in FIG. 7). The NiSi layer 63 and the Ni layer 64 may be removed by a wet etching method.

Next, with reference to FIG. 8O, the carbon layer 62 inside the metal layer 61 is removed (Step S16 in FIG. 7). The carbon layer 62 may be removed by a dry etching method.

Next, with reference to FIG. 8P, a residue of the NiSi layer 63 and a residue of the Ni layer 64 attached to the second wafer main surface 43 are removed (Step S17 in FIG. 7). The NiSi layer 63 and the Ni layer 64 may be removed by a wet etching method.

Figure 8Q:
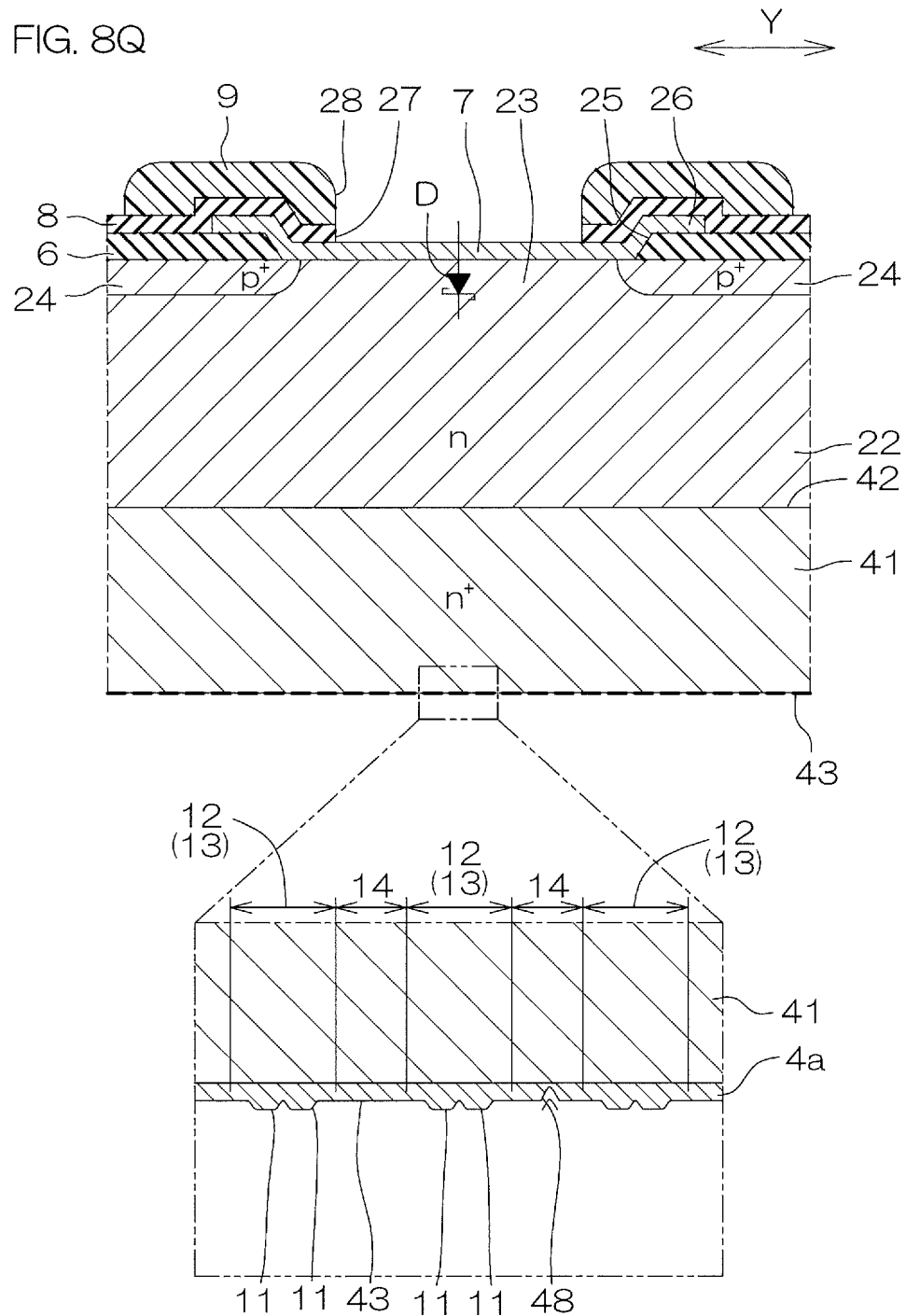
Figure 8R:
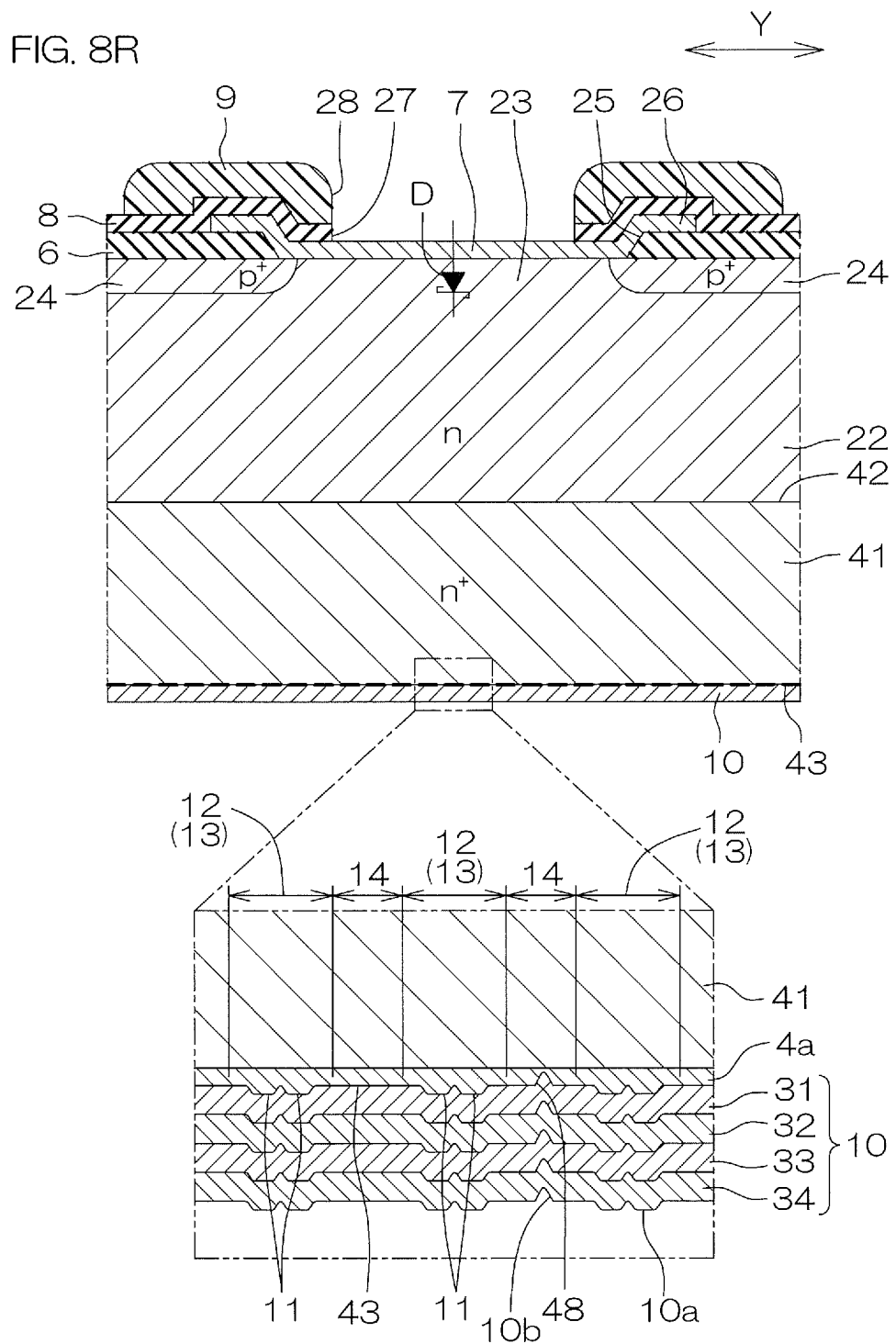

Next, with reference to FIG. 8Q, a residue of the carbon layer 62 attached to the second wafer main surface 43 is removed (Step S18 in FIG. 7). The carbon layer 62 may be removed by a dry etching method. Then, a natural oxide film is removed from the second wafer main surface 43 (Step S19 in FIG. 7). The natural oxide film may be removed by a wet etching method.

As described above, in this embodiment, the step of removing the Ni-containing layers (the NiSi layer 63 and the Ni layer 64) and the step of removing the carbon-containing layer (the carbon layer 62) are repeated twice. Thereby, the metal layer 61 can be appropriately removed. After the step of removing the metal layer 61, the second wafer main surface 43 which is reduced in resistance value by a laser annealing is exposed.

Next, with reference to FIG. 8R, the electrode 10 is formed on the second wafer main surface 43 (Step S20 in FIG. 7). This step includes a step in which the Ti layer 31, the Ni layer 32, the Au layer 33, and the Ag layer 34 are formed in this order from above the second wafer main surface 43. The Ti layer 31, the Ni layer 32, the Au layer 33, and the Ag layer 34 may each be formed by a sputtering method, respectively.

The Ti layer 31 of the electrode 10 is directly connected to the second wafer main surface 43. The Ti layer 31 collectively covers the plurality of raised portion groups 12 and forms an ohmic contact with the plurality of raised portion groups 12 and with the plurality of spaces 14.

Then, the SiC semiconductor wafer 41 is cut along the peripheral edges of the plurality of device forming regions (dicing lines 47) (Step S21 in FIG. 7). Thereby, the plurality of semiconductor devices 1 are cut out from the SiC semiconductor wafer 41. The semiconductor device 1 is manufactured through steps including the above.

Figure 9:
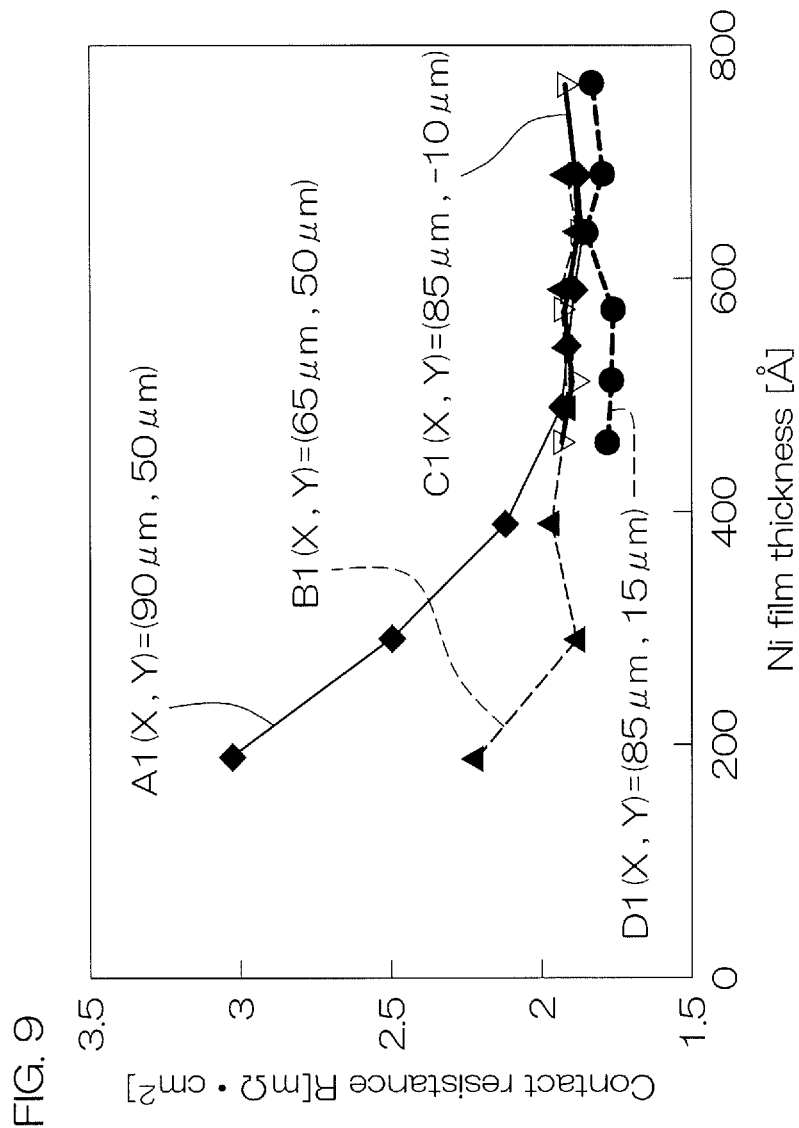
FIG. 9 is a graph which shows a relationship between a resistance value and a thickness of a metal layer.

FIG. 9 is a graph which shows a relationship between a resistance value and a thickness of the metal layer 61. In FIG. 9, the vertical axis indicates the resistance value (ON resistance) [$\Omega \cdot cm^2$]. In FIG. 9, the horizontal axis indicates the thickness [Å] of the metal layer 61.

In FIG. 9, "X" indicates an overlapping amount [μm] of mutually adjacent laser irradiation positions in terms of the first direction X. In FIG. 9, "Y" indicates a distance [μm] between the mutually adjacent laser irradiation positions in terms of the second direction Y.

"+Y" means that the mutually adjacent laser irradiation positions are apart in terms of the second direction Y. "−Y" means that the mutually adjacent laser irradiation positions are overlapping in terms of second direction Y. The laser diameter φ of laser light is approximately 100 μm. Energy of the laser light is fixed to a predetermined value for measurement.

In FIG. 9, a first broken line A1, a second broken line B1, a third broken line C1, and a fourth broken line D1 are shown.

The first broken line A1 shows a relationship when (X, Y)=(90 μm, 50 μm). The second broken line B1 shows a relationship when (X, Y)=(65 μm, 50 μm). The third broken line C1 shows a relationship when (X, Y)=(85 μm, −10 μm). The fourth broken line D1 shows a relationship when (X, Y)=(80 μm, 15 μm).

With reference to the first to fourth broken lines A1 to D1, it has been found that the resistance value tends to increase with a smaller thickness of the metal layer 61. This may be due to the fact that in a case where the metal layer 61 is small in thickness, the metal layer 61 is partially sublimated by irradiation of the pulsed laser light, resulting in a failure of appropriate performance of annealing.

On the other hand, it has been found that where the thickness of the metal layer 61 is increased to some extent, the resistance value is decreased. Where the thickness of the metal layer 61 becomes not less than 500 Å, the resistance value becomes not more than 2 $\Omega \cdot cm^2$, irrespective of an overlapping amount of the irradiation positions.

It has been found from the results of FIG. 9 that a resistance value of the second main surface 4 is dependent on the thickness of the metal layer 61 formed in the course of manufacturing. It has also been found that the resistance value is made optimal by adjusting the thickness of the metal layer 61 and the overlapping amount of mutually adjacent laser irradiation positions.

Figure 10:
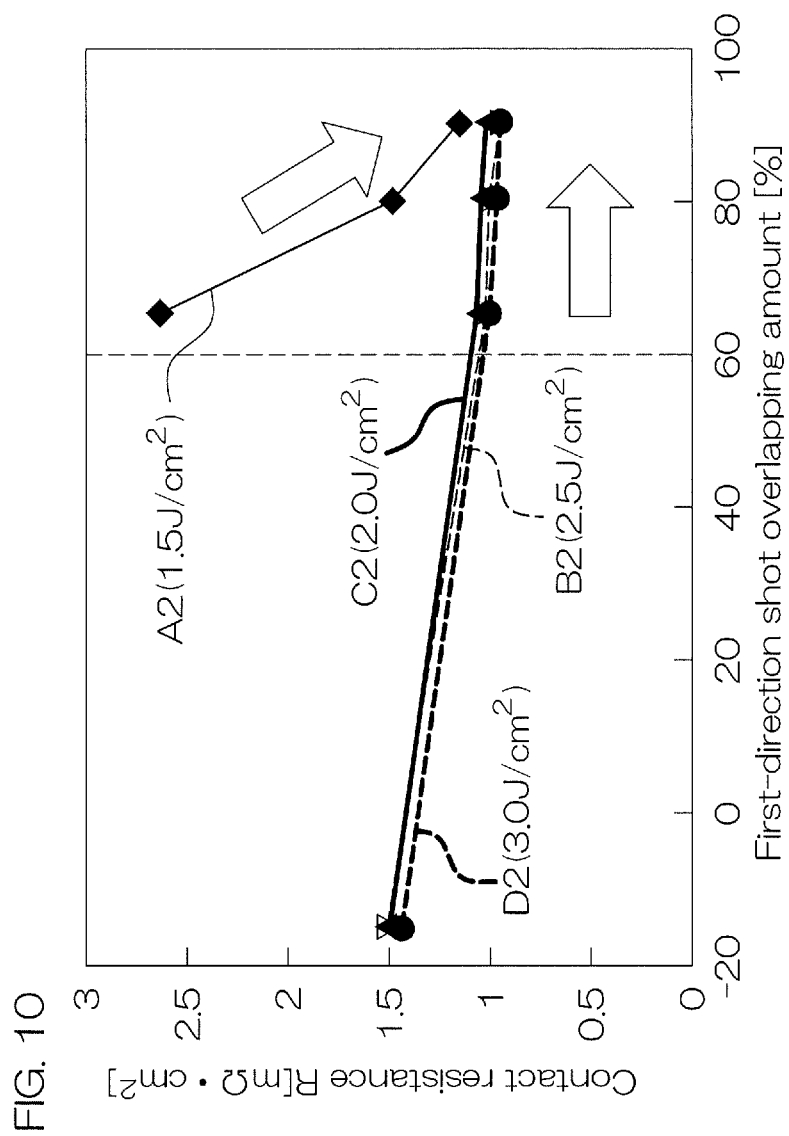
FIG. 10 is a graph which shows a relationship between a resistance value and an overlapping amount of laser irradiation positions.

FIG. 10 is a graph which shows a relationship between a resistance value and an overlapping amount of laser irradiation positions. In FIG. 10, the vertical axis indicates the resistance value (ON resistance) [$\Omega \cdot cm^2$]. In FIG. 10, the horizontal axis indicates the overlapping amount [μm] of mutually adjacent laser irradiation positions in terms of the first direction X. The thickness of the metal layer 61 is fixed to a predetermined value.

In FIG. 10, a first broken line A2, a second broken line B2, a third broken line C2, and a fourth broken line D2 are shown.

The first broken line A2 shows a relationship when the energy of laser light is 1.5 J/cm². The second broken line B2 shows a relationship when the energy of laser light is 2.0 J/cm². The third broken line C2 shows a relationship when the energy of laser light is 2.5 J/cm². The fourth broken line D2 shows a relationship when the energy of laser light is 3.0 J/cm².

With reference to the first to fourth broken lines A2 to D2, it has been found that the resistance value is decreased with an increase in energy of laser light. It has also been found that the resistance value can be decreased by increasing an overlapping amount of mutually adjacent laser irradiation positions even when the energy of laser light is fixed.

It has been found from results of FIG. 10 that the resistance value of the second main surface 4 depends on the energy of laser light and the overlapping amount of mutually adjacent laser irradiation positions. It has also been found that the resistance value can be made optimal by adjusting them.

As described above, according to the semiconductor device 1, the connection area of the electrode 10 to the second main surface 4 can be increased by the raised portion group 12. It is, thereby, possible to improve electrical characteristics.

More specifically, the electrode 10 forms an ohmic contact with the raised portion group 12. Thereby, favorable ohmic characteristics can be obtained between the SiC semiconductor layer 2 and the electrode 10, thus making it possible to improve the electrical characteristics.

Further, according to the semiconductor device 1, the electrode 10 is directly connected to the second main surface 4. More specifically, the electrode 10 forms an ohmic contact with the raised portion group 12 not via the carbon layer. The electrode 10 also forms an ohmic contact with the raised portion group 12 not via the silicide layer.

The carbon layer and the silicide layer are likely to serve as peeling starting points. Therefore, the connection failure and an increase in resistance value due to the connection failure can be appropriately suppressed by a structure in which the electrode 10 is directly connected to the second main surface 4.

Figure 11:
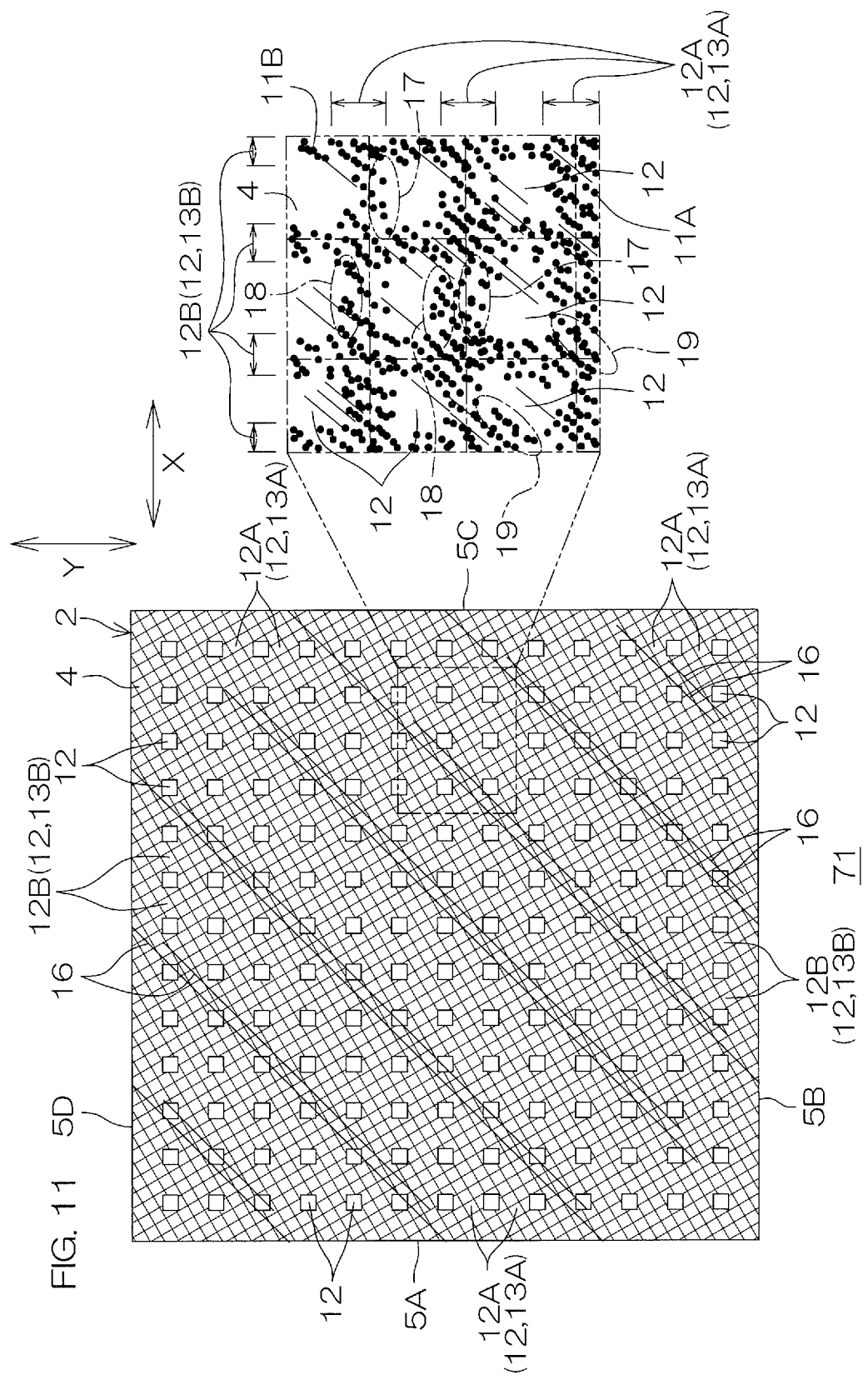
FIG. 11 is a bottom view corresponding to FIG. 2 and a bottom view which shows a semiconductor device according to a second preferred embodiment of the present invention.

FIG. 11 is a bottom view corresponding to FIG. 2 and a bottom view which shows a semiconductor device 71 according to a second preferred embodiment of the present invention. In the following, structures corresponding to structures described in the semiconductor device 1 shall be provided with the same reference symbols and description thereof shall be omitted.

With reference to FIG. 11, the semiconductor device 71 has a plurality of raised portion groups 12 which include a first raised portion group 12A and a second raised portion group 12B. The first raised portion group 12A includes a plurality of first raised portions 11A formed in a second main surface 4. The plurality of first raised portions 11A are portions of the second main surface 4 which are raised along a normal direction of the second main surface 4.

The plurality of first raised portions 11A are formed at intervals from each other along a first direction X and a second direction Y which intersects the first direction X. The first raised portion 11A has a first portion 17A in which some of the first raised portions 11A among the plurality of first raised portions 11A overlap in the first direction X in a first direction view as viewed in the first direction X.

The first raised portion 11A also has a second portion 18A in which some of the first raised portions 11A among the plurality of first raised portions 11A are formed separate from the first portion 17A and also overlap in the first direction X in the first direction view.

The plurality of first raised portions 11A are formed successively along the first direction X. More specifically, the plurality of first raised portions 11A have a dotted pattern in which they are dotted at intervals in the first direction X and the second direction Y.

The plurality of first raised portions 11A are formed successively along the first direction X, with the dotted pattern kept. In this embodiment, the dotted pattern of the plurality of first raised portions 11A is formed over from a peripheral edge of a side surface 5A side on one side to a peripheral edge of a side surface 5C side on the other side in plan view.

The first raised portion group 12A are laid out so that a plurality of raised portions 11 overlap in the first direction X when viewed in the first direction X. Thereby, the first raised portion group 12A forms a first raised portion group region 13A which extends in a band shape along the first direction X by a collective pattern of the plurality of raised portions 11 that are dotted successively along the first direction X.

The second raised portion group 12B includes a plurality of second raised portions 11B formed in the second main surface 4. The plurality of second raised portions 11B are portions of the second main surface 4 which are raised along a normal direction of the second main surface 4.

The plurality of second raised portion 11B are formed at intervals from each other along the first direction X and the second direction Y which intersects the first direction X. The second raised portion group 12B has a first portion 17B in which some of the second raised portions 11B among the plurality of second raised portions 11B overlap in the second direction Y in a second direction view as viewed in the second direction Y.

The second raised portion group 12B also has a second portion 18B in which some of the second raised portions 11B among the plurality of second raised portions 11B are formed separate from the first portion 17B and also overlap in the second direction Y in the second direction view.

The plurality of second raised portions 11B are formed successively along the second direction Y. More specifically, the plurality of second raised portions 11B have a dotted pattern in which they are dotted at intervals along the first direction X and the second direction Y.

The plurality of second raised portions 11B are formed successively along the second direction Y, with the dotted pattern kept. In this embodiment, the dotted pattern of the plurality of second raised portions 11B is formed over from a peripheral edge of a side surface 5B side on one side to a peripheral edge of a side surface 5D side on the other side in plan view.

The second raised portion group 12B is laid out so that the plurality of second raised portions 11B overlap in the second direction Y when viewed in the second direction Y. Thereby, the second raised portion group 12B forms a second raised portion group region 13B which extends in a band shape along the second direction Y by a collective pattern of the plurality of second raised portions 11B that are dotted successively along the second direction Y.

The second raised portion group 12B (the second raised portion group region 13B) crosses the first raised portion group 12A (the first raised portion group region 13A). Thereby, an intersecting region 72 is formed in the second main surface 4. The intersecting region 72 includes the first raised portion group 12A (the first raised portion group region 13A) and the second raised portion group 12B (the second raised portion group region 13B) which intersect each other.

In this embodiment, a plurality of first raised portion groups 12A are formed at intervals along the second direction Y on the second main surface 4. That is, the dotted pattern of the plurality of first raised portions 11A is formed intermittently with respect to the second direction Y.

In this embodiment, a plurality of second raised portion groups 12B are also formed at intervals along the first direction X on the second main surface 4. That is, the dotted pattern of the plurality of second raised portions 11B is formed intermittently with respect to the first direction X.

Therefore, in this embodiment, the intersecting regions 72 are formed as a matrix array at intervals from each other along the first direction X and the second direction Y. Further, spaces 14 are demarcated by the first raised portion group 12A and the second raised portion group 12B. The spaces 14 are formed as a matrix array at intervals from each other along the first direction X and the second direction Y.

At the intersecting region 72, the plurality of first raised portions 11A and the plurality of second raised portions 11B may overlap each other. A thickness of the plurality of first raised portions 11A and that of the plurality of second raised portions 11B formed in the intersecting region 72 may be larger than a thickness of the first raised portion 11A and that of the second raised portion 11B formed in a region outside the intersecting region 72.

Further, the number of the plurality of first raised portions 11A and that of the plurality of second raised portions 11B formed in the intersecting region 72 may be larger than the number of the first raised portions 11A and that of the second raised portions 11B formed in a region outside the intersecting region 72.

The first direction X may be set to a [11–20] direction and the second direction Y may be set to a [1–100] direction. That is, the first raised portion group 12A (the first raised portion group region 13A) may be formed substantially parallel to or parallel to the [11–20] direction, and the second raised portion group 12B (the second raised portion group region 13B) may be formed substantially parallel to or parallel to the [1–100] direction.

The first direction X may be set to the [1–100] direction, and the second direction Y may be set to the [11–20] direction. That is, the first raised portion group 12A (the first raised portion group region 13A) may be formed substantially parallel to or parallel to the [1–100] direction, and the second raised portion group 12B (the second raised portion group region 13B) may be formed substantially parallel to or parallel to the [11–20] direction.

The first raised portion 11A and the first raised portion group 12A correspond to the raised portion 11 and the raised portion group 12 according to the first preferred embodiment. The description of the raised portion 11 and the raised portion group 12 according to the first preferred embodiment shall be applied to a description of the first raised portion 11A and the first raised portion group 12A, and other specific descriptions of the first raised portion 11A and the first raised portion group 12A shall be omitted.

The second raised portion 11B and the second raised portion group 12B correspond to the raised portion 11 and the raised portion group 12 according to the first preferred embodiment. The description of the raised portion 11 and the raised portion group 12 according to the first preferred embodiment shall be applied to a description of the second raised portion 11B and the second raised portion group 12B, and other specific descriptions of the second raised portion 11B and the second raised portion group 12B shall be omitted.

In this embodiment, the electrode 10 covers the first raised portion group 12A and the second raised portion group 12B on the second main surface 4. In this embodiment, the electrode 10 collectively covers the plurality of first raised portion groups 12A and the plurality of second raised portion groups 12B.

The electrode 10 is formed as a film in conformity with an outer surface of the first raised portion group 12A (an outer surface of the first raised portion 11A), an outer surface of the second raised portion group 12B (an outer surface of the second raised portion 11B) and an inner surface of a groove 16.

Thereby, although not shown, a raised portion 10a is formed in a portion of the outer surface of the electrode 10 which covers the outer surface of the first raised portion group 12A (the outer surface of the first raised portion 11A) and the outer surface of the second raised portion group 12B (the outer surface of the second raised portion 11B). Further, a recess portion 10b is formed in a portion of the outer surface of the electrode 10 which covers the groove 16.

The electrode 10 forms an ohmic contact with the second main surface 4. More specifically, the electrode 10 forms an ohmic contact with the first raised portion group 12A and with the second raised portion group 12B.

Even more specifically, the electrode 10 forms an ohmic contact with the plurality of first raised portion groups 12A and with the plurality of second raised portion groups 12B. In this embodiment, the electrode 10 forms an ohmic contact with the space 14 as well.

A portion of the electrode 10 which covers the first raised portion group 12A and the second raised portion group 12B is engaged with an uneven portion which is demarcated by the plurality of first raised portion groups 12A, the plurality of second raised portion groups 12B, and the plurality of grooves 16.

An area of the electrode 10 in contact with the second main surface 4 is increased by the plurality of first raised portion groups 12A and the plurality of second raised portion groups 12B. An area of the electrode 10 in contact with the second main surface 4 is also increased by the plurality of grooves 16. Thereby, adhesion of the electrode 10 to the second main surface 4 is enhanced.

The above-structured semiconductor device 71 is manufactured by performing the following steps in the step of FIG. 8M described above (Step S14 in FIG. 7).

The plurality of first raised portion groups 12A are first formed by a laser annealing method substantially parallel to or along a direction parallel to an orientation flat 45. The plurality of second raised portion groups 12B are then formed by the laser annealing method along a direction intersecting (orthogonal to) the orientation flat 45.

In this step, the plurality of first raised portion groups 12A may be formed in the direction intersecting (orthogonal to) the orientation flat 45, and the plurality of second raised portion groups 12B may be formed substantially parallel to or along a direction parallel to the orientation flat 45. Thereafter, the semiconductor device 71 is manufactured through the steps of FIG. 8N to FIG. 8R.

The first raised portion group 12A and the second raised portion group 12B may be formed in any order. Therefore, the plurality of first raised portion groups 12A may be formed after formation of the plurality of second raised portion groups 12B. Further, the plurality of first raised portion groups 12A and the plurality of second raised portion groups 12B may be formed alternately.

As described above, the semiconductor device 71 is also able to provide the same effects as those described for the semiconductor device 1.

Figure 12:
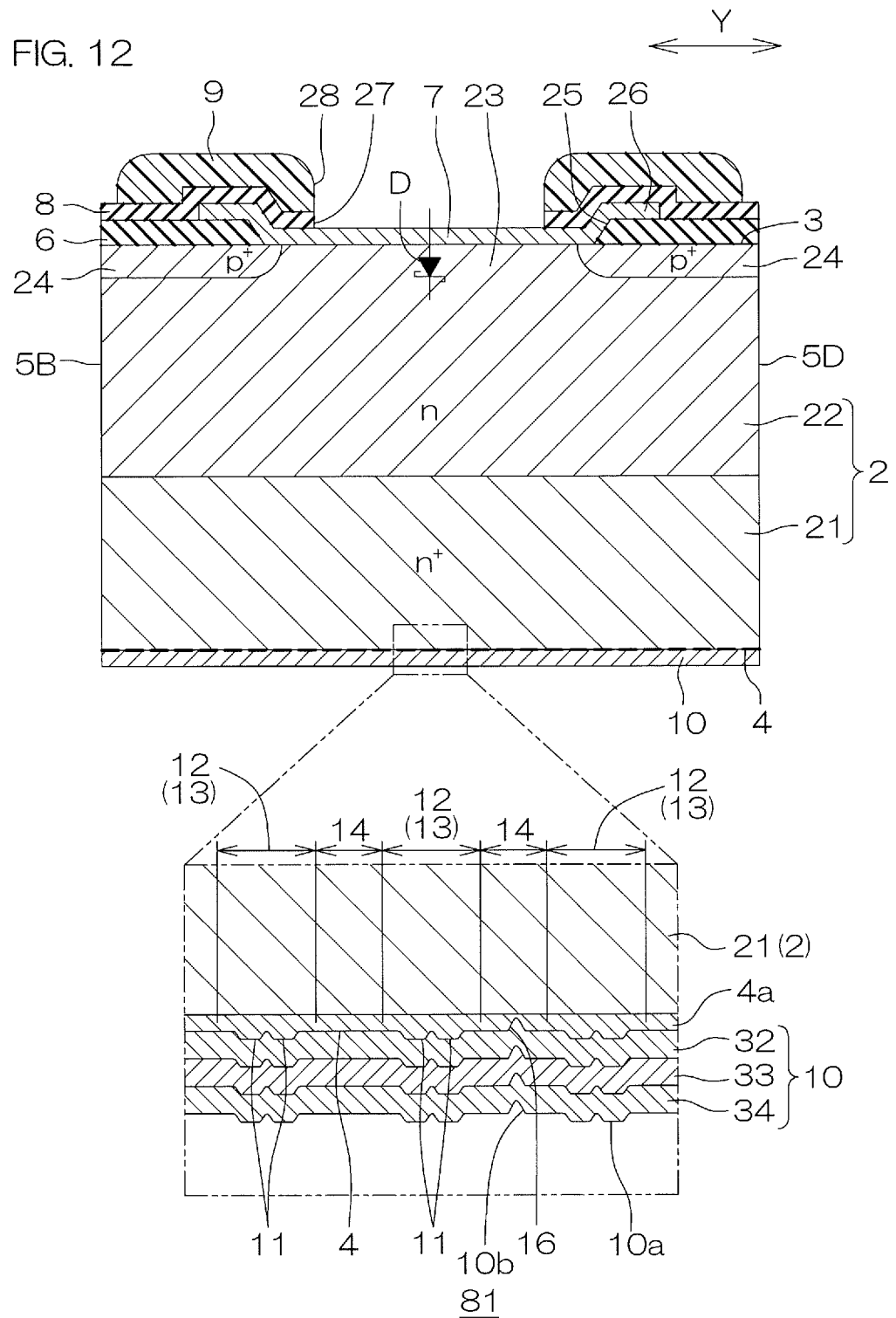
FIG. 12 is a sectional view corresponding to FIG. 5 and a sectional view which shows a semiconductor device according to a third preferred embodiment of the present invention.

FIG. 12 is a sectional view corresponding to FIG. 5 and a sectional view which shows a semiconductor device 81 according to a third preferred embodiment of the present invention. In the following, structures corresponding to structures described in the semiconductor device 1 shall be provided with the same reference symbols and description thereof shall be omitted.

In the semiconductor device 81, an electrode 10 has a three-layer structure which includes the Ni layer 32, the Au layer 33, and the Ag layer 34 laminated in this order from a second main surface 4.

The Ni layer 32 is directly connected to the second main surface 4. The Ni layer 32 collectively covers a plurality of raised portion groups 12. The Ni layer 32 forms an ohmic contact with the raised portion group 12 and with a space 14.

The Au layer 33 covers a substantially entire region or an entire region of the Ni layer 32. The Ag layer 34 covers a substantially entire region or an entire region of the Au layer 33. The above-structured electrode 10 is formed by omitting the step of forming a Ti layer 31 in Step S20 of FIG. 7.

As described above, the semiconductor device 81 is also able to provide the same effects as those described for the semiconductor device 1. In the semiconductor device 81, the electrode 10 may have a single layer structure constituted of the Ni layer 32.

Figure 13:
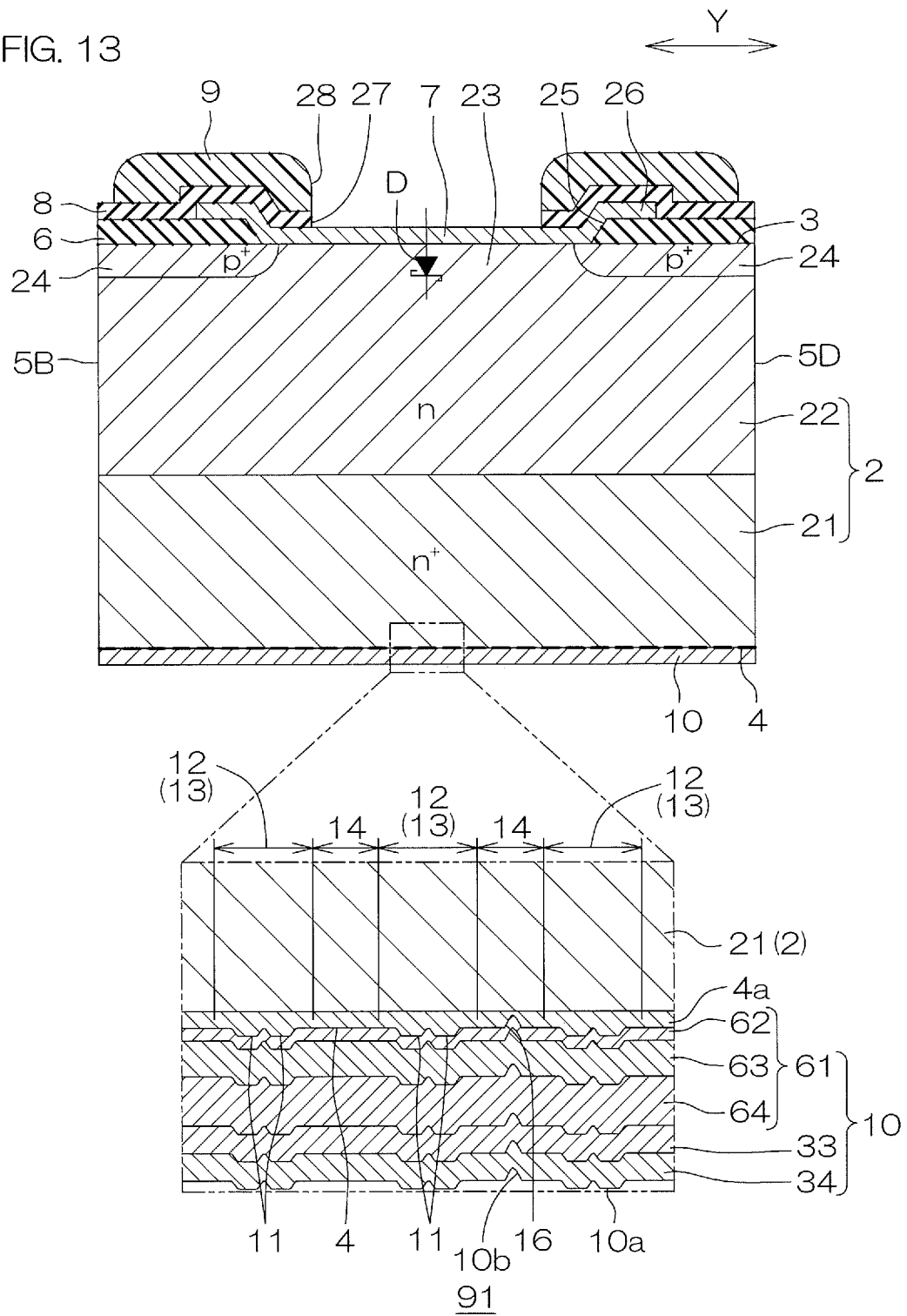
FIG. 13 is a sectional view corresponding to FIG. 5 and a sectional view which shows a semiconductor device according to a fourth preferred embodiment of the present invention.

FIG. 13 is a sectional view corresponding to FIG. 5 and a sectional view which shows a semiconductor device 91 of a fourth preferred embodiment of the present invention. In the following, structures corresponding to structures described in the semiconductor device 1 shall be provided with the same reference symbols and description thereof shall be omitted.

In the semiconductor device 91, the electrode 10 includes the metal layer 61, the Au layer 33, and the Ag layer 34. In this embodiment, the metal layer 61 has a laminated structure including the carbon layer 62, the NiSi layer 63, and the Ni layer 64 laminated in this order from a second main surface 4 side.

The metal layer 61 is connected to the second main surface 4. The metal layer 61 collectively covers the plurality of raised portion groups 12. The metal layer 61 forms an ohmic contact with the raised portion group 12 and with a space 14. The Au layer 33 covers a substantially entire region or an entire region of the metal layer 61. The Ag layer 34 covers a substantially entire region or an entire region of the Au layer 33.

The above-structured semiconductor device 91 is formed by omitting the steps of removing the metal layer 61 of FIG. 8N to FIG. 8Q described above (Step S15 to Step S19 in FIG. 7). In the semiconductor device 91, in the step of FIG. 8R described above, the Au layer 33 and the Ag layer 34 are formed on the metal layer 61.

As described above, according to the semiconductor device 91, the electrode 10 includes the carbon layer 62 and the NiSi layer 63 and, therefore, the electrode 10 cannot be enhanced in connection strength as compared with the semiconductor device 1. However, the semiconductor device 91 is able to provide substantially the same effects as those described for the semiconductor device 1. In the semiconductor device 91, the electrode 10 may have a laminated structure constituted of the metal layer 61.

Figure 14:
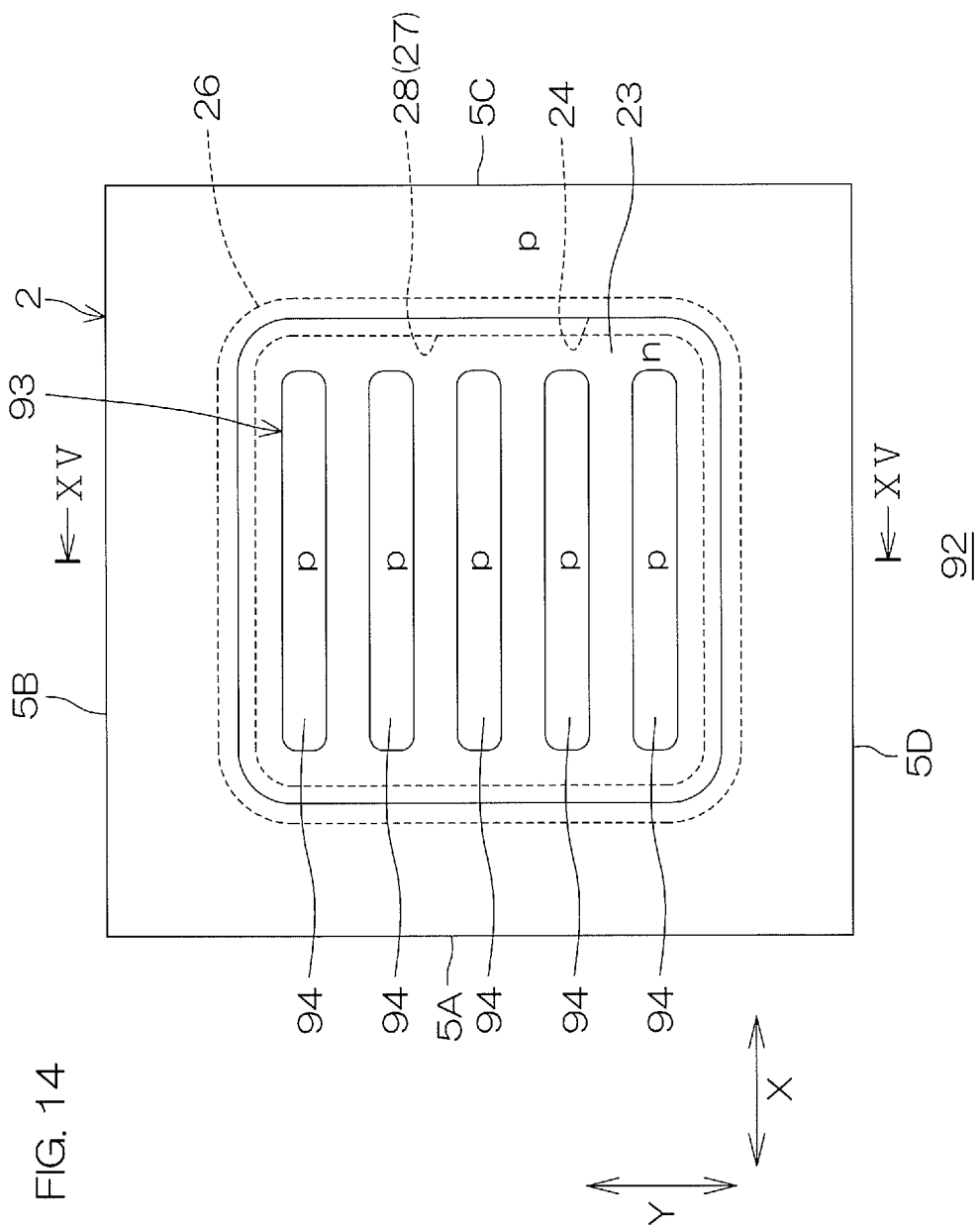
FIG. 14 is a top view which shows a semiconductor device according to a fifth preferred embodiment of the present invention and a view in which structures higher than a first main surface of an SiC semiconductor layer are removed.
Figure 15:
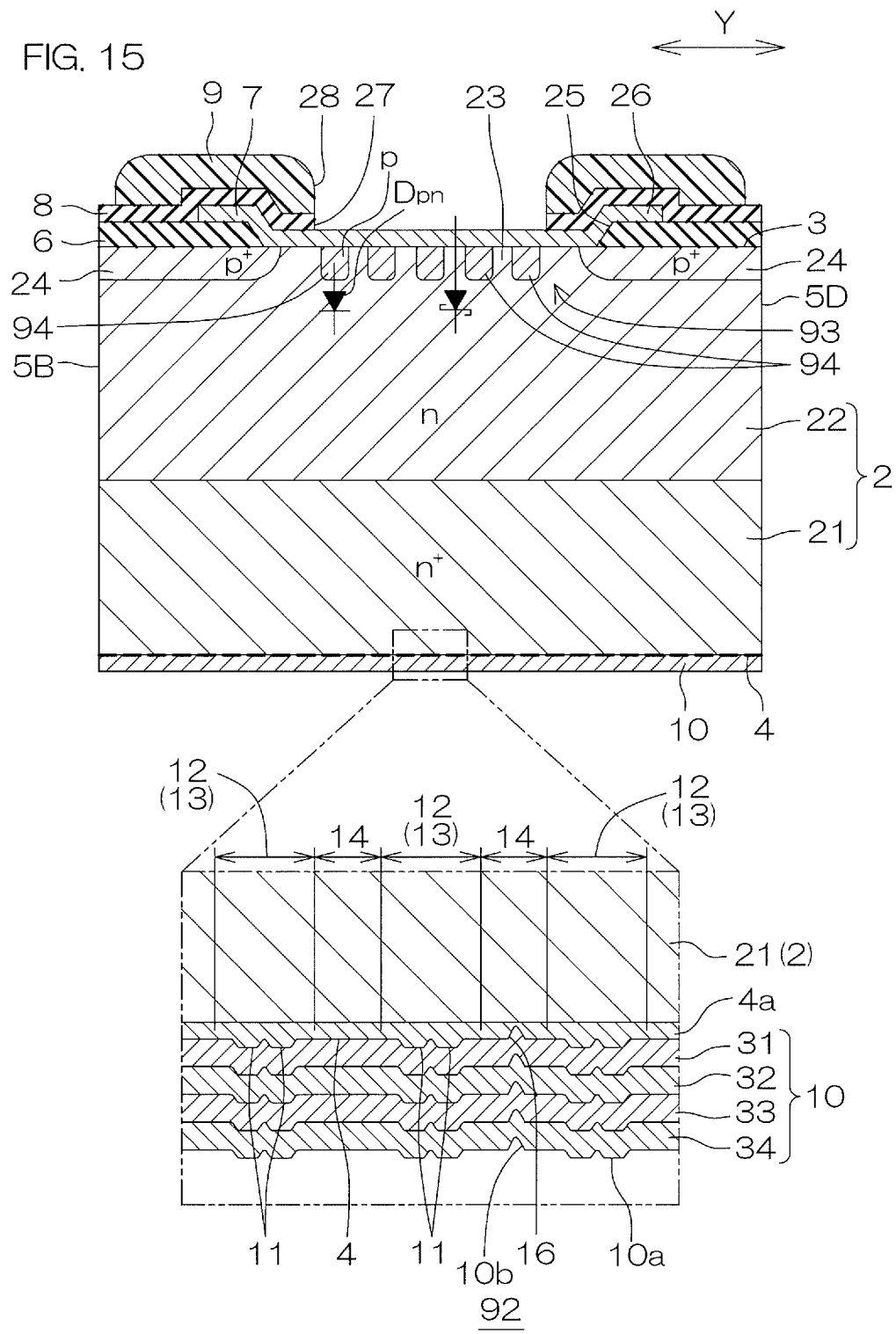
FIG. 15 is a sectional view taken along line XV-XV shown in FIG. 14.

FIG. 14 is a top view which shows a semiconductor device 92 according to a fifth preferred embodiment of the present invention and a view in which structures higher than a first main surface 3 are removed. FIG. 15 is a sectional view taken along line XV-XV shown in FIG. 14. In the following, structures corresponding to structures described in the semiconductor device 1 shall be provided with the same reference symbols and description thereof shall be omitted.

With reference to FIG. 14 and FIG. 15, the semiconductor device 92 has a JBS (junction barrier Schottky) structure 93 formed in a surface layer portion of a first main surface 3. More specifically, the JBS structure 93 includes the n-type diode region 23 and a p-type diode region 94. The diode region 94 forms a pn junction portion with the diode region 23.

In this embodiment, the plurality of diode regions 94 are formed at intervals from each other at a surface layer portion of the diode region 23. The plurality of diode regions 94 are each formed in a band shape extending parallel to an arbitrary first direction X. The plurality of diode regions 94 are formed at intervals along a second direction Y which intersects the first direction X.

The plurality of diode regions 94 are, thereby, aligned in a stripe shape so as to sandwich the diode region 23 between them in plan view. The plurality of diode regions 94 each form a pn junction portion with a corresponding diode region 23.

Where the first direction X is set in a [11–20] direction, the plurality of diode regions 94 may extend substantially parallel to or parallel to the [11–20] direction. Where the first direction X is set in a [1–100] direction, the plurality of diode regions 94 may extend substantially parallel to or parallel to the [1–100] direction.

In this embodiment, the plurality of diode regions 94 extend in the same direction as a plurality of raised portion groups 12. The plurality of diode regions 94 may extend along a direction intersecting (orthogonal to) the plurality of raised portion groups 12.

The electrode 7 forms a Schottky junction with the diode region 23 on the first main surface 3. Thereby, the Schottky barrier diode D in which the electrode 7 is deemed to be the anode and the diode region 23 is deemed to be the cathode is formed.

The electrode 7 forms an ohmic contact with the diode region 94 on the first main surface 3. Thereby, in the surface layer portion of the first main surface 3, a pn junction diode Dpn in which the diode region 94 is deemed to be an anode and the diode region 23 is deemed to be a cathode is formed.

As described above, the semiconductor device 92 is also able to provide the same effects as those described for the semiconductor device 1. Further, the semiconductor device 92 has the JBS structure 93 which includes the diode region 23 and the diode region 94 in the surface layer portion of the first main surface 3.

In the JBS structure 93, a depletion layer spreads from the pn junction portion between the diode region 23 and the diode region 94. Thereby, an electric field of the Schottky junction formed between the electrode 7 and the diode region 23 is relaxed. As a result, it is possible to reduce a leak current. The structures according to the first to fourth preferred embodiments described above may be combined with the semiconductor device 92.

Figure 16:
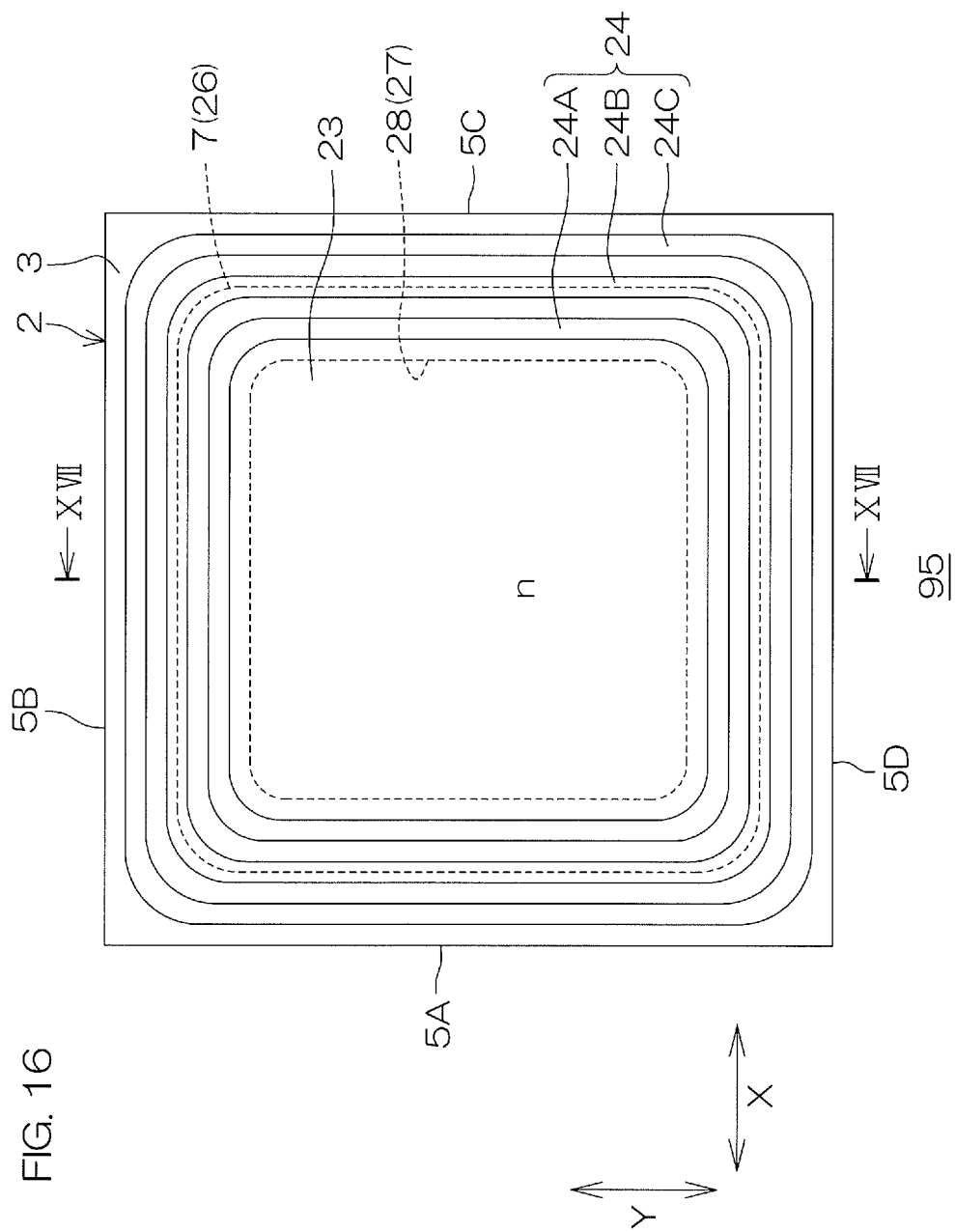
FIG. 16 is a top view which shows a semiconductor device according to a sixth preferred embodiment of the present invention and a view in which structures higher than a first main surface of an SiC semiconductor layer are removed.
Figure 17:
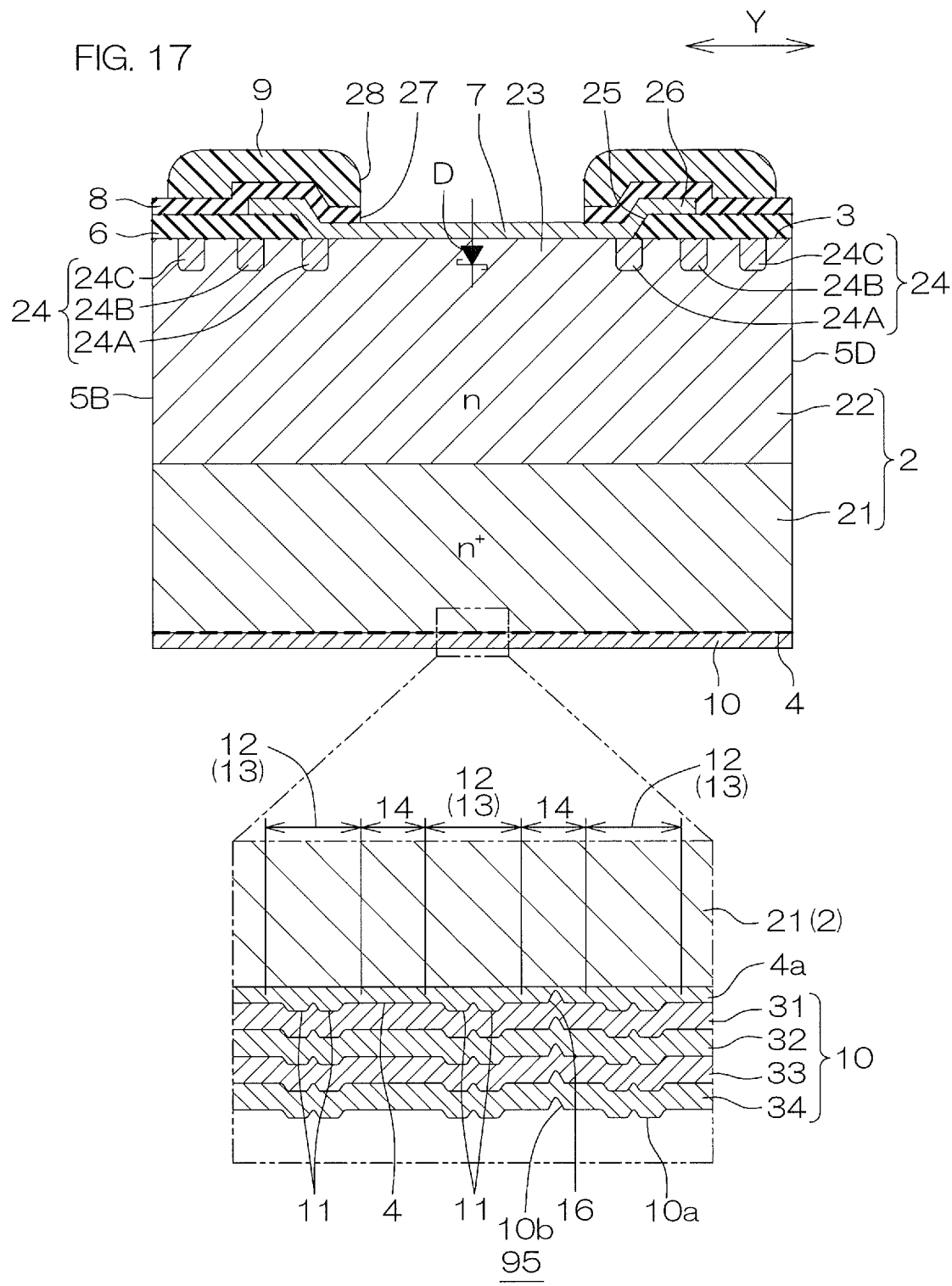
FIG. 17 is a sectional view taken along line XVII-XVII shown in FIG. 16.

FIG. 16 is a top view which shows a semiconductor device 95 according to a sixth preferred embodiment of the present invention and a view in which structures higher than a first main surface 3 are removed. FIG. 17 is a sectional view taken along line XVII-XVII shown in FIG. 16. In the following, structures corresponding to structures described in the semiconductor device 1 shall be provided with the same reference symbols and description thereof shall be omitted.

With reference to FIG. 16 and FIG. 17, in the semiconductor device 95, the impurity region 24 includes a plurality of (for example, not less than two and not more than 20) impurity regions formed in the surface layer portion of the first main surface 3. In this embodiment, the impurity region 24 includes three impurity regions 24A, 24B, and 24C.

The impurity regions 24A to 24C are formed at intervals in this order along a direction away from the diode region 23. The impurity regions 24A to 24C each extend in a band shape along a peripheral edge of the diode region 23. The impurity regions 24A to 24C may each be formed in an endless shape (quadrilateral annular shape) surrounding the diode region 23.

The impurity region 24A of the impurity regions 24A to 24C which is positioned at the innermost side may define the diode region 23. The impurity region 24B surrounds the impurity region 24A. The impurity region 24C surrounds the impurity region 24B.

As described above, the semiconductor device 95 is also able to provide the same effects as those described for the semiconductor device 1. The structures according to the first to fifth preferred embodiments described above may be combined with the semiconductor device 95.

Figure 18:
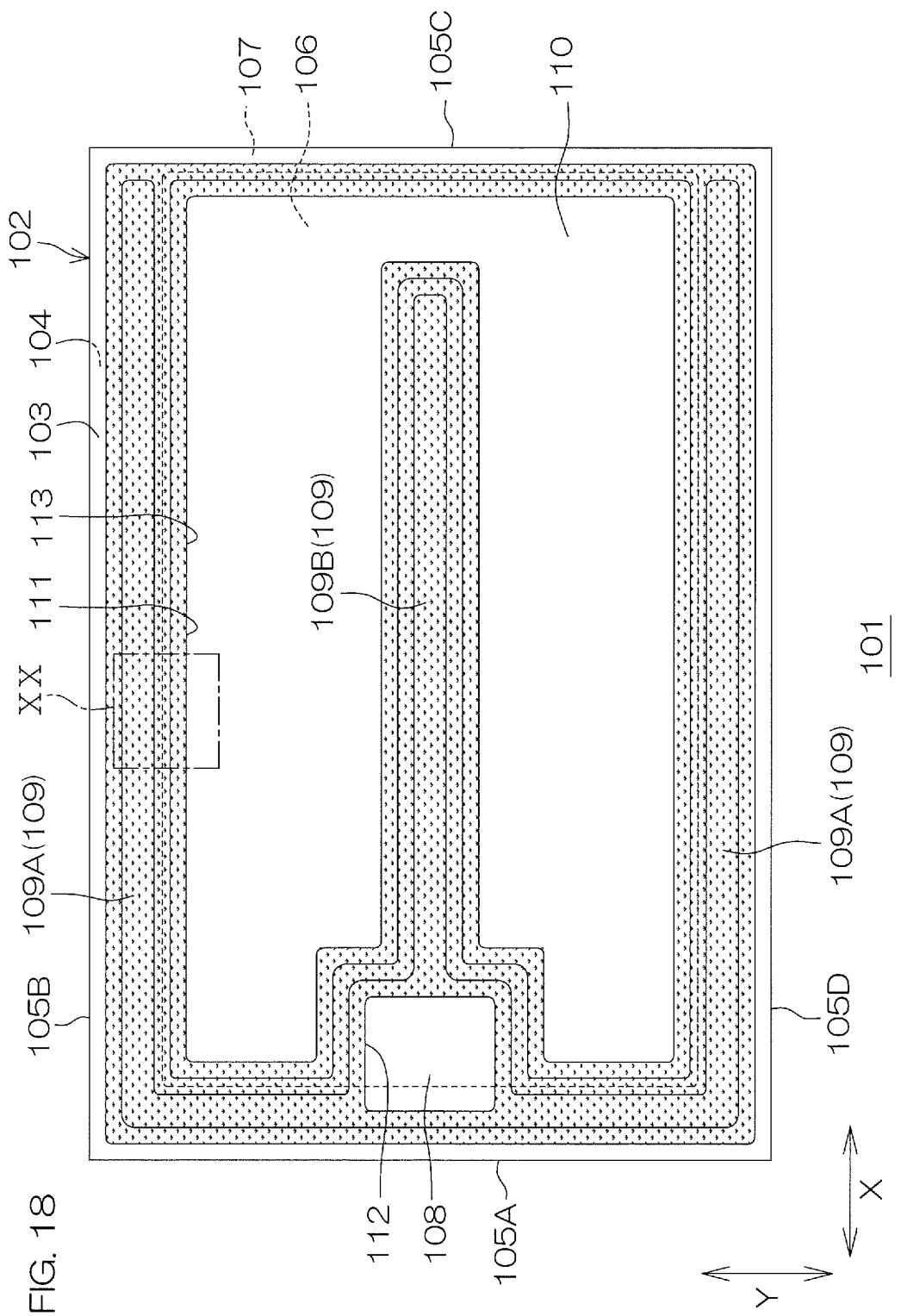
FIG. 18 is a top view which shows a semiconductor device according to a seventh preferred embodiment of the present invention.
Figure 19:
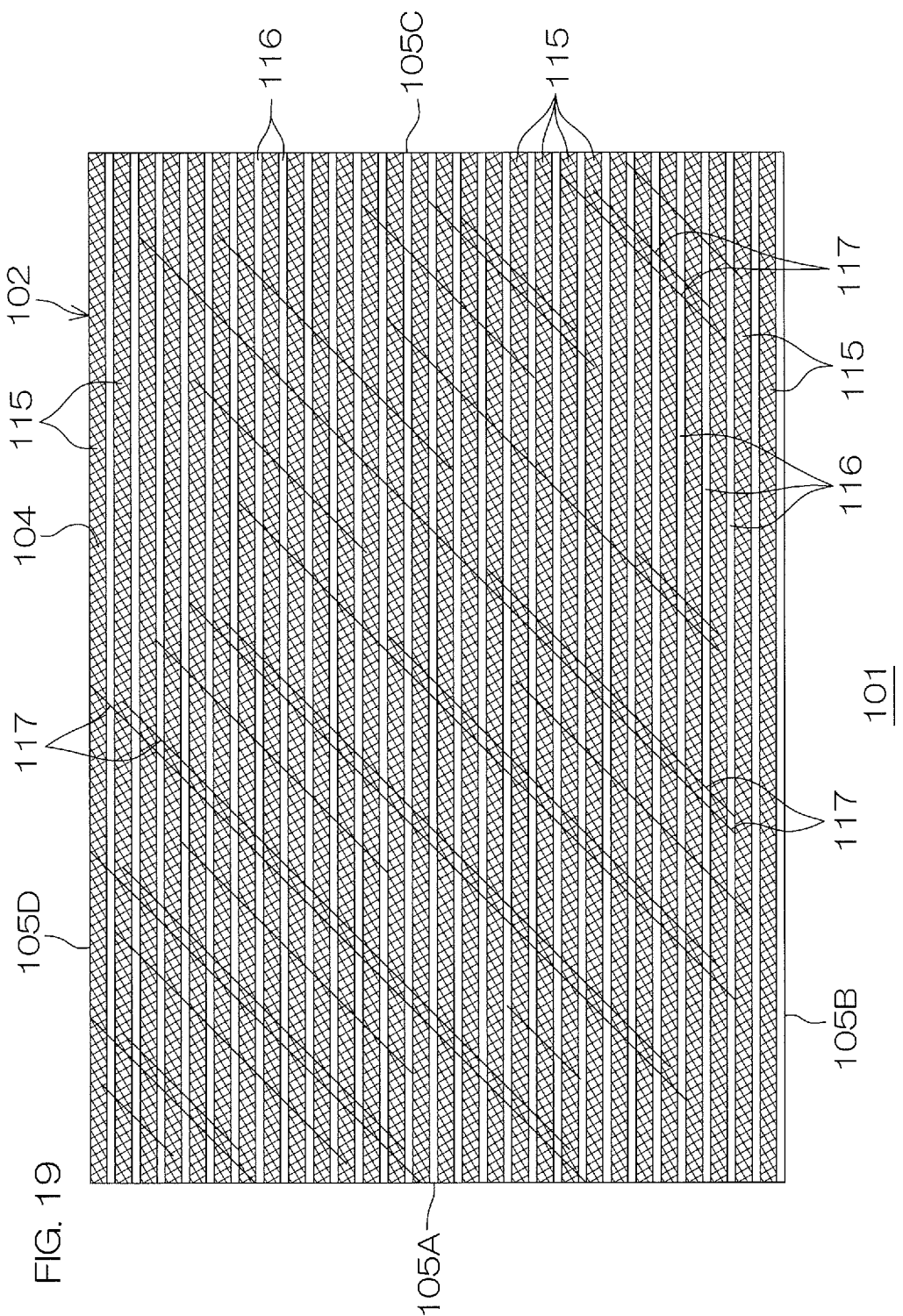
FIG. 19 is a bottom view of the semiconductor device shown in FIG. 18.
Figure 20:
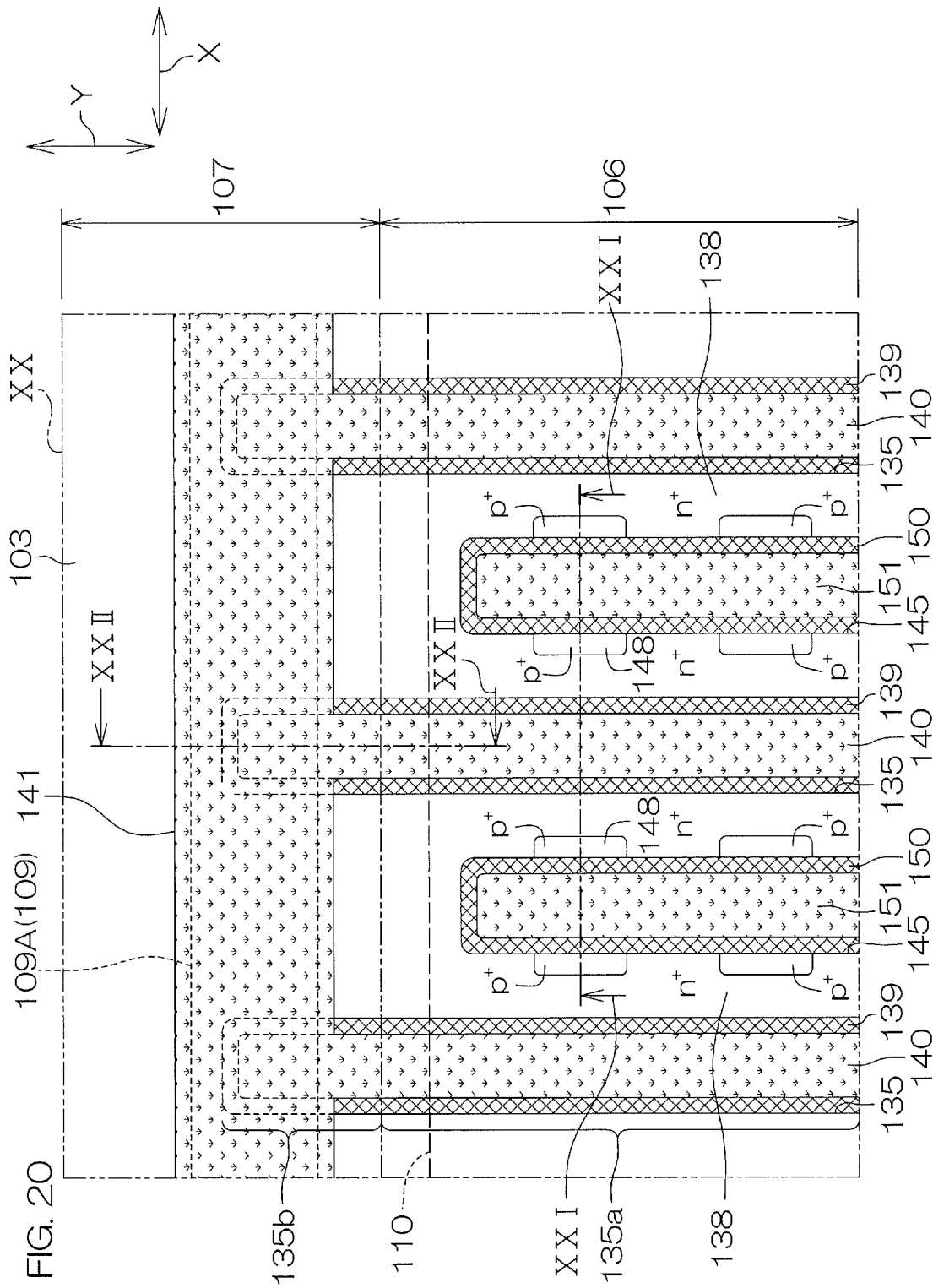
FIG. 20 is an enlarged view of a region XX shown in FIG. 18 and a view in which structures higher than a first main surface of an SiC semiconductor layer are removed.
Figure 21:
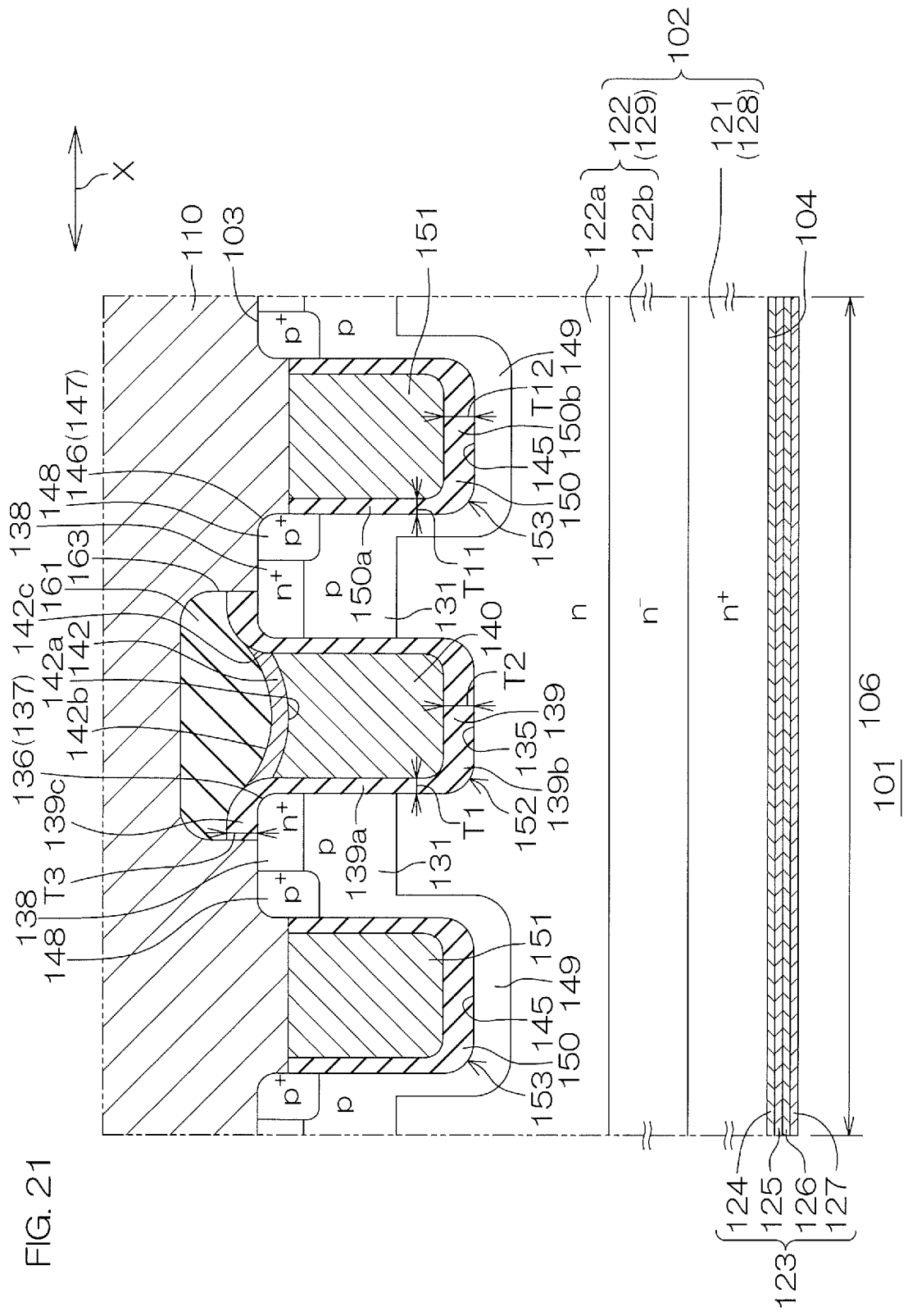
FIG. 21 is a sectional view taken along line XXI-XXI in FIG. 20.
Figure 22:
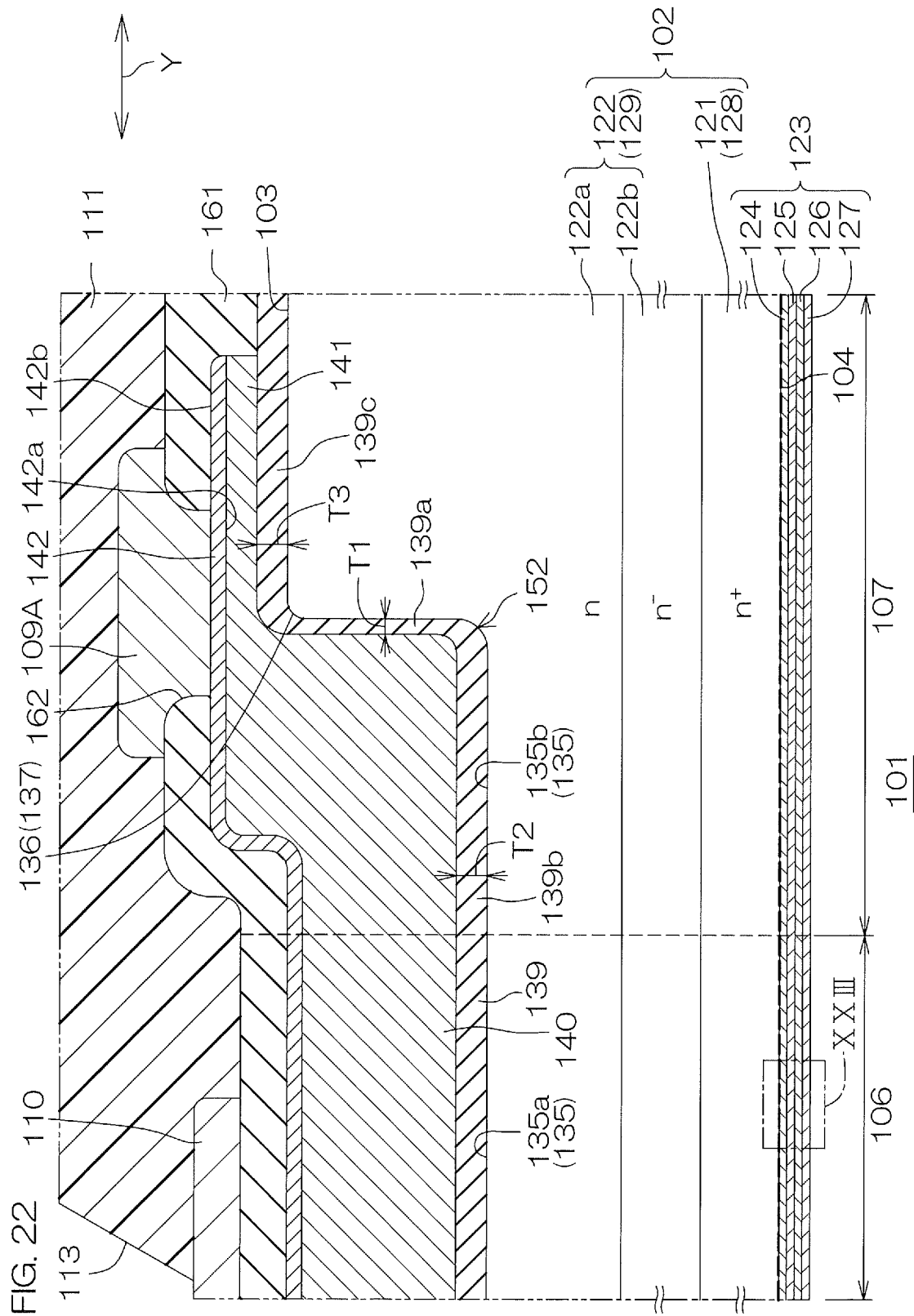
FIG. 22 is a sectional view taken along line XXII-XXII in FIG. 20.
Figure 23:
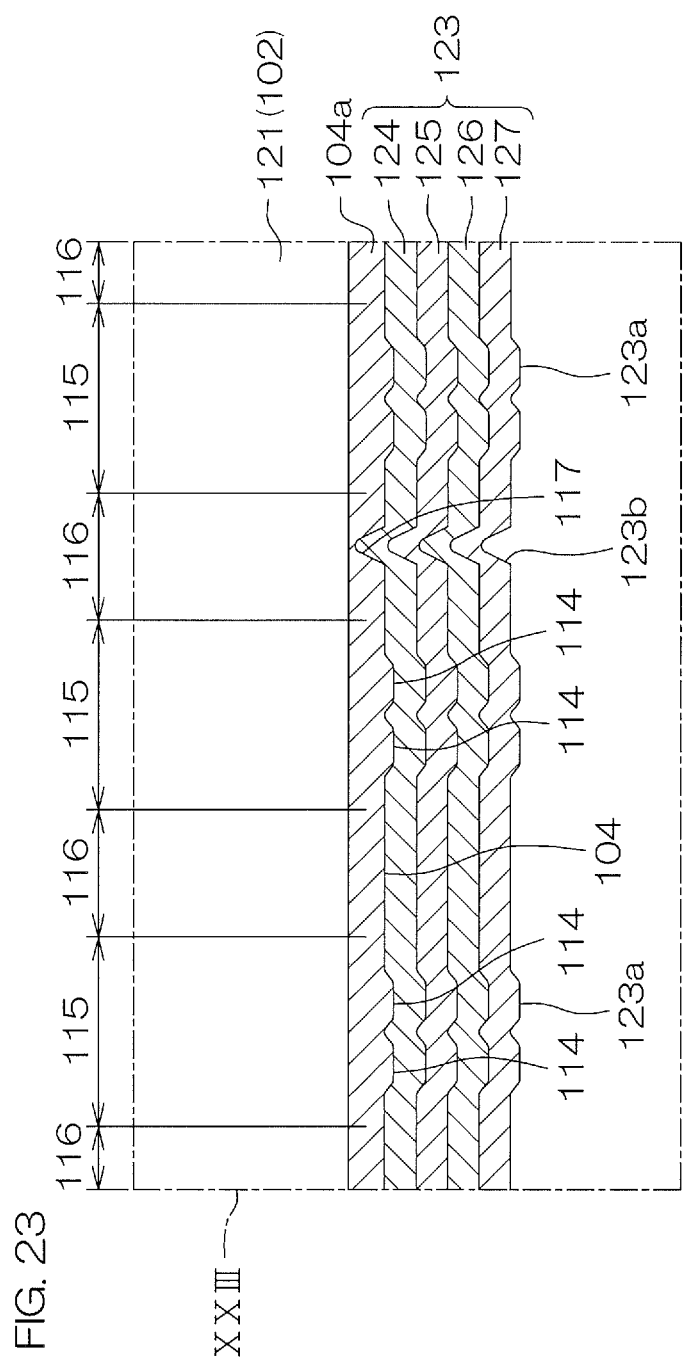
FIG. 23 is an enlarged view of a region XXIII in FIG. 22.

FIG. 18 is a top view which shows a semiconductor device 101 according to a seventh preferred embodiment of the present invention. FIG. 19 is a bottom view of the semiconductor device 101 shown in FIG. 18. FIG. 20 is an enlarged view of a region XX shown in FIG. 18 and a view in which structures higher than a first main surface 103 of an SiC semiconductor layer 102 are removed. FIG. 21 is a sectional view taken alone line XXI-XXI in FIG. 20. FIG. 22 is a sectional view taken along line XXII-XXII in FIG. 20. FIG. 23 is an enlarged view of a region XXIII in FIG. 22.

With reference to FIG. 18 to FIG. 23, the semiconductor device 101 has an SiC semiconductor layer 102 which includes an SiC (silicon carbide) monocrystal. The SiC semiconductor layer 102 may include a 4H—SiC monocrystal.

The 4H—SiC monocrystal has an off angle inclined at an angle of not more than 10° from a [0001] plane with respect to a [11–20] direction. The off angle may be not less than 0° and not more than 4°. The off angle may be greater than 0° and less than 4°. The off angle is typically 2° or 4° and more specifically is set in a range of 2°±10% or a range of 4°±10%.

The SiC semiconductor layer 102 has a first main surface 103 on one side, a second main surface 104 on the other side, and side surfaces 105A, 105B, 105C, 105D which connect the first main surface 103 and the second main surface 104. The first main surface 103 and the second main surface 104 are formed in quadrilateral shapes (in this embodiment, rectangular shapes) in a plan view as viewed in their normal directions (hereinafter, simply referred to as "plan view").

The side surface 105A faces the side surface 105C. The side surface 105B faces the side surface 105D. The four side surfaces 105A to 105D respectively extend as planes along the normal directions of the first main surface 103 and the second main surface 104. A length of each of the side surfaces 105A to 105D may be not less than 1 mm and not more than 10 mm (for example, not less than 2 mm and not more than 5 mm).

The SiC semiconductor layer 102 includes an active region 106 and an outer region 107. The active region 106 is a region where a vertical MISFET (metal insulator semiconductor field effect transistor) is formed. The outer region 107 is a region outside the active region 106.

The active region 106 is formed at a central portion of the SiC semiconductor layer 102 at intervals from the side surfaces 105A to 105D to an inner region thereof in plan view. The active region 106 is formed in a quadrilateral shape (in this embodiment, in a rectangular shape) having four sides parallel to the four side surfaces 105A to 105D in plan view.

The outer region 107 is formed in a region between the side surfaces 105A to 105D and a peripheral edge of the active region 106. The outer region 107 is formed in an endless shape (quadrilateral annular shape) which surrounds the active region 106 in plan view.

A gate pad 108, a gate finger 109 and a source pad 110 are formed on the first main surface 103. The gate pad 108, the gate finger 109 and the source pad 110 may include aluminum and/or copper.

The gate pad 108 is formed in a region along the side surface 105A in plan view. The gate pad 108 is formed in a region along a central portion of the side surface 105A in plan view. The gate pad 108 may be formed along a corner portion which connects any two of the four side surfaces 105A to 105D in plan view.

The gate pad 108 is formed in a quadrilateral shape in plan view. The gate pad 108 is led out from the outer region 107 into the active region 106 and crosses a boundary between the outer region 107 and the active region 106 in plan view.

The gate finger 109 includes an outer gate finger 109A and an inner gate finger 109B. The outer gate finger 109A is led out from the gate pad 108 to the outer region 107. The outer gate finger 109A extends in a band shape in the outer region 107.

In this embodiment, the outer gate finger 109A is formed along the three side surfaces 105A, 105B, and 105D of the SiC semiconductor layer 102 to demarcate the active region 106 from three directions.

The inner gate finger 109B is led out from the gate pad 108 to the active region 106. The inner gate finger 109B extends in a band shape in the active region 106. The inner gate finger 109B extends from the side surface 105B side to the side surface 105D side.

The source pad 110 is formed in the active region 106 at intervals from the gate pad 108 and the gate finger 109. The source pad 110 covers a region demarcated by the gate pad 108 and the gate finger 109 and is formed in an inverted C-letter shape in plan view.

A gate voltage is applied to the gate pad 108 and the gate finger 109. The gate voltage may be not less than 10 V and not more than 50 V (for example, approximately 30 V). A source voltage is applied to the source pad 110. The source voltage may be a reference voltage (for example, a GND voltage).

A resin layer 111 is formed above the first main surface 103. In FIG. 18, the resin layer 111 is shown with hatching for clarity. The resin layer 111 covers the gate pad 108, the gate finger 109, and the source pad 110.

The resin layer 111 may include a negative type or positive type photosensitive resin. In this embodiment, the resin layer 111 includes polybenzoxazole as an example of the positive type photosensitive resin. The resin layer 111 may include polyimide as an example of the negative type photosensitive resin.

A peripheral edge portion of the resin layer 111 is formed at intervals from the side surfaces 105A to 105D to an inner region thereof and exposes the first main surface 103. More specifically, the peripheral edge portion of the resin layer 111 exposes an interlayer insulating layer 161 which will be described later.

A gate pad opening 112 and a source pad opening 113 are formed in an inner portion of the resin layer 111. The gate pad opening 112 exposes the gate pad 108. The source pad opening 113 exposes the source pad 110.

With reference to FIG. 19 and FIG. 23, a raised portion group 115 which includes a plurality of raised portions 114, a space 116, and a groove 117 are formed in the second main surface 104. The raised portion group 115 (the plurality of raised portions 114), the spaces 116, and the groove 117 each include a region which faces the active region 106 and the outer region 107.

The raised portion group 115 (the plurality of raised portions 114), the space 116, and the groove 117 have structures respectively corresponding to those of the raised portion group 12 (the plurality of raised portions 11), the space 14 and the groove 16 according to the first preferred embodiment (refer also to FIG. 3 to FIG. 5, etc.).

The description of the raised portion group 12 (the plurality of raised portions 11), the space 14, and the groove 16 according to the first preferred embodiment shall be applied to a description of the raised portion group 115, the space 116, and the groove 117 according to the present preferred embodiment, and other specific descriptions of the raised portion group 115 (the plurality of raised portions 114), the space 116, and the groove 117 shall be omitted.

The raised portion group 115, the space 116, and the groove 117 may have structures respectively corresponding to those of the raised portion group 12, the space 14, and the groove 16 of the semiconductor device 71 according to the second preferred embodiment (refer also to FIG. 11). In this case, the description of the raised portion group 12, the space 14, and the groove 16 according to the second preferred embodiment shall be applied to a description of the raised portion group 115, the space 116, and the groove 117 according to the present preferred embodiment.

With reference to FIG. 20 to FIG. 22, in this embodiment, the SiC semiconductor layer 102 has a laminated structure which includes an n$^+$-type SiC semiconductor substrate 121 and an n-type SiC epitaxial layer 122. The second main surface 104 is formed by the SiC semiconductor substrate 121. The first main surface 103 is formed by the SiC epitaxial layer 122.

A thickness of the SiC semiconductor substrate 121 may be not less than 5 μm and not more than 400 μm. The thickness of the SiC semiconductor substrate 121 may be not less than 5 μm and not more than 50 μm, not less than 50 μm and not more than 100 μm, not less than 100 μm and not more than 150 μm, not less than 150 μm and not more than 200 μm, not less than 200 μm and not more than 250 μm, not less than 250 μm and not more than 300 μm, not less than 300 μm and not more than 350 μm, or not less than 350 μm and not more than 400 μm.

The thickness of the SiC semiconductor substrate 121 is preferably not less than 80 μm and not more than 200 μm (for example, approximately 150 μm). Making the thickness of the SiC semiconductor substrate 121 small shortens a current path, thus making it possible to reduce a resistance value.

A thickness of the SiC epitaxial layer 122 may be not less than 1 μm and not more than 100 μm. The thickness of the SiC epitaxial layer 122 may be not less than 1 μm and not more than 25 μm, not less than 25 μm and not more than 50 μm, not less than 50 μm and not more than 75 μm, or not less than 75 μm and not more than 100 μm. The thickness of the SiC epitaxial layer 122 is preferably not less than 5 μm and not more than 15 μm (for example, approximately 10 μm).

An n-type impurity concentration of the SiC epitaxial layer 122 is not more than an n-type impurity concentration of the SiC semiconductor substrate 121. The n-type impurity concentration of the SiC epitaxial layer 122 is less than the n-type impurity concentration of the SiC semiconductor substrate 121.

The n-type impurity concentration of the SiC semiconductor substrate 121 may be not less than $1.0 \times 10^{18}$ cm$^{-3}$ and not more than $1.0 \times 10^{21}$ cm$^{-3}$. The n-type impurity concentration of the SiC epitaxial layer 122 may be not less than $1.0 \times 10^{15}$ cm$^{-3}$ and not more than $1.0 \times 10^{18}$ cm$^{-3}$.

In this embodiment, the SiC epitaxial layer 122 has a plurality of regions different in n-type impurity concentration along a normal direction of the first main surface 103. More specifically, the SiC epitaxial layer 122 includes a high concentration region 122a which is relatively high in the n-type impurity concentration and a low concentration region 122b lower in the n-type impurity concentration than the high concentration region 122a.

The high concentration region 122a is formed in a region on the first main surface 103 side. The low concentration region 122b is formed in a region on the second main surface 104 side with respect to the high concentration region 122a.

The n-type impurity concentration of the high concentration region 122a may be not less than $1 \times 10^{16}$ cm$^{-3}$ and not more than $1 \times 10^{18}$ cm$^{-3}$. The n-type impurity concentration of the low concentration region 122b may be not less than $1 \times 10^{15}$ cm$^{-3}$ and not more than $1 \times 10^{16}$ cm$^{-3}$.

A thickness of the high concentration region 122a is not more than a thickness of the low concentration region 122b. More specifically, the thickness of the high concentration region 122a is less than the thickness of the low concentration region 122b. That is, the thickness of the high concentration region 122a is less than half a total thickness of the SiC epitaxial layer 122.

With reference to FIG. 23, the raised portion group 115 (the plurality of raised portions 114), and the groove 117 are formed in the SiC semiconductor substrate 121. A modified layer 104a in which SiC of the SiC semiconductor layer 102 (the SiC semiconductor substrate 121) is partially modified to have different properties is formed in a surface layer portion of the second main surface 104. The modified layer 104a is formed by an annealing method performed on the second main surface 104.

The modified layer 104a includes Si atoms and C atoms. More specifically, the modified layer 104a has a carbon density lower than a carbon density of a region of the SiC semiconductor layer 102 (the SiC semiconductor substrate 121) outside the modified layer 104a.

The modified layer 104a has a silicon density greater than the carbon density. That is, the modified layer 104a includes an Si modified layer in which SiC of the SiC semiconductor layer 102 (the SiC semiconductor substrate 121) is modified to Si. The Si modified layer may be an Si amorphous layer.

The modified layer 104a may include a lattice defect due to the modification of SiC. That is, the modified layer 104a may include a lattice defect region having a defect level which is introduced due to the modification of SiC.

In this embodiment, the modified layer 104a is formed in a region of the second main surface 104 along the raised portion group 115. Thereby, the plurality of raised portions 114 of each raised portion group 115 are formed by the modified layer 104a.

In this embodiment, the modified layer 104a is also formed in the space 116. The modified layer 104a extends from the raised portion group 115 to the space 116. That is, an annealing method performed on the second main surface 104 extends the space 116 as well.

A thickness of the portion of the modified layer 104a along the raised portion group 115 is not less than a thickness of the portion of the modified layer 104a along the space 116 due to the presence of the raised portion 114. More specifically, the thickness of the portion of the modified layer 104a along the raised portion group 115 is larger than the thickness of the portion of the modified layer 104a along the space 116.

A resistance value of the second main surface 104 in a case where the raised portion group 115 is not present on the second main surface 104 is larger than a resistance value of the second main surface 104 in a case where the raised portion group 115 is present on the second main surface 104.

That is, the plurality of raised portion groups 115 have a resistance value not more than a resistance value of an SiC monocrystal alone as electrical characteristics. More specifically, the plurality of raised portion groups 115 have a resistance value less than the resistance value of the SiC monocrystal alone. Further, the plurality of raised portion groups 115 have a resistance value not more than a resistance value of the space 116. More specifically, the plurality of raised portion groups 115 have a resistance value less than the resistance value of the space 116.

The resistance value as electrical characteristics of the raised portion group 115 is reduced by the modified layer 104a. That is, the resistance value of the raised portion group 115 is not more than the resistance value of the SiC monocrystal due to the modified layer 104a. The resistance value as electrical characteristics of the space 116 is also not more than the resistance value of the SiC monocrystal due to the modified layer 104a.

A drain pad 123 is formed on the second main surface 104. A maximum voltage that can be applied across the source pad 110 and the drain pad 123 in an off state may be not less than 1000 V and not more than 10000 V.

With reference to FIG. 23, the drain pad 123 is directly connected to the second main surface 104. The drain pad 123 covers the raised portion group 115 on the second main surface 104. In this embodiment, the drain pad 123 collectively covers the plurality of raised portion groups 115.

The drain pad 123 is formed as a film in conformity with an outer surface of the raised portion group 115 (outer surfaces of the plurality of raised portions 114) and an inner surface of the groove 117. Thereby, in a portion of an outer surface of the drain pad 123 which covers the outer surface of the raised portion group 115 (the outer surfaces of the plurality of raised portions 114), a raised portion 123a which is raised in a direction away from the second main surface 104 is formed. Further, in a portion of the outer surface of the drain pad 123 which covers the groove 117, a recess portion 123b which is recessed toward the second main surface 104 is formed.

The drain pad 123 forms an ohmic contact with the second main surface 104. More specifically, the drain pad 123 forms an ohmic contact with the raised portion group 115.

Even more specifically, the drain pad 123 forms an ohmic contact with the plurality of raised portion groups 115. In this embodiment, the drain pad 123 forms an ohmic contact with the space 116 as well.

The drain pad 123 has a laminated structure which includes a plurality of electrode layers laminated on the second main surface 104. In this embodiment, the drain pad 123 has a four-layer structure which includes a Ti layer 124, an Ni layer 125, an Au layer 126, and an Ag layer 127 laminated in this order from the second main surface 104.

The Ti layer 124, the Ni layer 125, the Au layer 126, and the Ag layer 127 are respectively formed as films in conformity with an outer surface of the raised portion group 115 (outer surfaces of the plurality of raised portions 114) and the inner surface of the groove 117. The raised portion 123a and the recess portion 123b of the drain pad 123 are formed on an outer surface of the Ag layer 127.

The Ti layer 124 is directly connected to the second main surface 104. The Ti layer 124 collectively covers the plurality of raised portion groups 115 to form an ohmic contact with the second main surface 104. In this embodiment, the Ti layer 124 forms an ohmic contact with the space 116 as well.

The Ni layer 125 covers a substantially entire region or an entire region of the Ti layer 124. The Au layer 126 covers a substantially entire region or an entire region of the Ni layer 125. The Ag layer 127 covers a substantially entire region or an entire region of the Au layer 126.

A thickness of the Ti layer 124 may be not less than 0.01 µm and not more than 5 µm (for example, approximately 0.07 µm). A thickness of the Ni layer 125 may be not less than 0.1 µm and not more than 40 µm (for example, approximately 1.2 µm).

A thickness of the Au layer 126 may be not less than 0.1 µm and not more than 40 µm (for example, approximately 0.07 µm). A thickness of the Ag layer 127 may be not less than 0.1 µm and not more than 40 µm (for example, approximately 0.3 µm). The drain pad 123 may have a single layer structure constituted of the Ti layer 124, the Ni layer 125, the Au layer 126, or the Ag layer 127.

The drain pad 123 forms an ohmic contact with the second main surface 104 not via a silicide layer which includes silicide as a major constituent. The drain pad 123 forms an ohmic contact with each of the raised portion groups 115 not via the silicide layer which includes silicide as a major constituent.

The drain pad 123 forms an ohmic contact with the second main surface 104 not via a carbon layer which includes carbon as a major constituent. The drain pad 123 forms an ohmic contact with each of the raised portion groups 115 not via the carbon layer which includes carbon as a major constituent.

The drain pad 123 does not include a region in which a material which includes silicide as a major constituent is formed as a layer. Further, the drain pad 123 does not include a region in which a material which includes carbon as a major constituent is formed as a layer.

The drain pad 123 may have a structure similar to the structure of the electrode 10 according to the third preferred embodiment described above. The drain pad 123 may have a structure similar to the structure of the electrode 10 according to the fourth preferred embodiment described above.

The SiC semiconductor substrate 121 is formed as a drain region 128 of the MISFET. The SiC epitaxial layer 122 is formed as a drift region 129 of the MISFET.

A p-type body region 131 is formed in a surface layer portion of the first main surface 103 in the active region 106. A p-type impurity concentration of the body region 131 may be not less than $1\times10^{17}$ cm$^{-3}$ and not more than $1\times10^{20}$ cm$^{-3}$. The active region 106 is defined by the body region 131.

A plurality of gate trenches 135 are formed in the surface layer portion of the first main surface 103 in the active region 106. The plurality of gate trenches 135 are formed at intervals along a first direction X.

The plurality of gate trenches 135 are formed in a band shape extending substantially parallel to or parallel to a second direction Y. The plurality of gate trenches 135 are formed in a stripe shape extending substantially parallel to or parallel to the second direction Y in plan view. That is, in this embodiment, the plurality of gate trenches 135 intersect the plurality of raised portion groups 115 in plan view.

The plurality of raised portion groups 115 may be formed in a stripe shape extending substantially parallel to or parallel to the second direction Y. In this case, the plurality of gate trenches 135 may extend substantially parallel to or parallel to the plurality of raised portion groups 115 in plan view.

The plurality of gate trenches 135 may be formed in a stripe shape extending parallel to the first direction X. In this case, the plurality of gate trenches 135 may extend substantially parallel to or parallel to the plurality of raised portion groups 115 in plan view.

That is, each of the gate trenches 135 may extend substantially parallel to or parallel to a [11−20] direction. Further, each of the gate trenches 135 may extend substantially parallel to or parallel to a [1−100] direction orthogonal to the [11−20] direction.

In this embodiment, each of the gate trenches 135 extends in a band shape from a peripheral edge portion of the first main surface 103 on one side (the side surface 105B side) to a peripheral edge portion thereof on the other side (the side surface 105D side) in plan view.

Each of the gate trenches 135 crosses an intermediate portion between the peripheral edge portion of the first main surface 103 on one side and the peripheral edge portion thereof on the other side. One end portion of each of the gate trenches 135 is positioned at the peripheral edge portion of the first main surface 103 on one side. The other end portion of each of the gate trenches 135 is positioned at the peripheral edge portion of the first main surface 103 on the other side.

Each of the gate trenches 135 has a length on the order of millimeters (not less than 1 mm). In this embodiment, the length of each of the gate trenches 135 is not less than 1 mm and not more than 10 mm (for example, not less than 2 mm and not more than 5 mm). A total extension of one or the plurality of gate trenches 135 per unit area may be not less than 0.5 µm/µm$^2$ and not more than 0.75 µm/µm$^2$.

Each of the gate trenches 135 includes an active trench portion 135a and a contact trench portion 135b. The active trench portion 135a is a portion of the gate trench 135 which is formed at the active region 106. The contact trench portion 135b is a portion of the gate trench 135 which is led out from the active trench portion 135a to the outer region 107.

Each of the gate trenches 135 penetrates through the body region 131 and reaches the SiC epitaxial layer 122. A bottom wall of each of the gate trenches 135 is positioned inside the SiC epitaxial layer 122. More specifically, the bottom wall of each of the gate trenches 135 is positioned in the high concentration region 122a of the SiC epitaxial layer 122.

A depth of the gate trench 135 in terms of the normal direction of the first main surface 103 may be not less than 0.5 μm and not more than 3 μm. The depth of the gate trench 135 may be not less than 0.5 μm and not more than 1 μm, not less than 1 μm and not more than 1.5 μm, not less than 1.5 μm and not more than 2 μm, not less than 2 μm and not more than 2.5 μm, or not less than 2.5 μm and not more than 4 μm. The depth of the gate trench 135 is preferably not less than 0.5 μm and not more than 1.0 μm.

A first direction X width of the gate trench 135 may be not less than 0.1 μm and not more than 2 μm. The first direction X width of the gate trench 135 may be not less than 0.1 μm and not more than 0.5 μm, not less than 0.5 μm and not more than 1 μm, not less than 1 μm and not more than 1.5 μm, or not less than 1.5 μm and not more than 2 μm. The first direction X width of the gate trench 135 is preferably not less than 0.1 μm and not more than 0.5 μm.

An opening edge portion 136 of each of the gate trenches 135 includes a curved portion 137 which is curved toward an interior of the gate trench 135. The opening edge portion 136 of the gate trench 135 is a corner portion which connects the first main surface 103 and a side wall of the gate trench 135. An electric field to the opening edge portion 136 of the gate trench 135 is relaxed by the curved portion 137.

An n$^+$-type source region 138 is formed at a region along the side wall of the gate trench 135 in a surface layer portion of the body region 131. An n-type impurity concentration of the source region 138 may be not less than $1.0 \times 10^{18}$ cm$^{-3}$ and not more than $1.0 \times 10^{21}$ cm$^{-3}$. A plurality of source regions 138 are formed along the side wall of the gate trench 135 on one side and the side wall thereof on the other side in terms of the first direction X.

The plurality of source regions 138 are each formed in a band shape extending substantially parallel to or parallel to the second direction Y. The plurality of source regions 138 are formed in a stripe shape in plan view. The plurality of source regions 138 intersect the plurality of raised portion groups 115 in plan view, in the same manner as with the case of the gate trenches 135.

A gate insulating layer 139 and a gate electrode layer 140 are formed inside each of the gate trenches 135. In FIG. 20, the gate insulating layer 139 and the gate electrode layer 140 are shown with hatching.

The gate insulating layer 139 includes silicon oxide. The gate insulating layer 139 may include another insulating film of silicon nitride, etc. The gate insulating layer 139 is formed as a film along an inner wall surface of the gate trench 135. The gate insulating layer 139 demarcates a recess space inside the gate trench 135.

The gate insulating layer 139 includes a first region 139a, a second region 139b, and a third region 139c. The first region 139a is formed along the side wall of the gate trench 135. The second region 139b is formed along the bottom wall of the gate trench 135. The third region 139c is formed along the first main surface 103.

A thickness T1 of the first region 139a of the gate insulating layer 139 is smaller than a thickness T2 of the second region 139b of the gate insulating layer 139 and a thickness T3 of the third region 139c of the gate insulating layer 139.

T2/T1 which is a ratio of the thickness T2 of the second region 139b in relation to the thickness T1 of the first region 139a may be not less than 2 and not more than 5. T3/T1 which is a ratio of the thickness T3 of the third region 139c in relation to the thickness T1 of the first region 139a may be not less than 2 and not more than 5.

The thickness T1 of the first region 139a may be not less than 0.01 μm and not more than 0.2 μm. The thickness T2 of the second region 139b may be not less than 0.05 μm and not more than 0.5 μm. The thickness T3 of the third region 139c may be not less than 0.05 μm and not more than 0.5 μm.

The first region 139a is formed thinly, thus making it possible to suppress an increase in carriers induced in a region of the body region 131 in the vicinities of the side walls of the gate trench 135. It is, thereby, possible to suppress an increase in channel resistance. The second region 139b is formed thickly, thus making it possible to relax the concentration of an electric field on the bottom wall of the gate trench 135.

The third region 139c is formed thickly, thus making it possible to improve a withstand voltage of the gate insulating layer 139 in the vicinity of the opening edge portion 136 of the gate trench 135. The third region 139c is formed thickly, thus making it possible to suppress loss of the third region 139c due to etching.

Thereby, it is possible to suppress removal of the first region 139a by etching due to the loss of the third region 139c. As a result, the gate electrode layer 140 is allowed to appropriately face the SiC semiconductor layer 102 across the gate insulating layer 139.

A gate electrode layer 140 is embedded in the gate trench 135 across the gate insulating layer 139. More specifically, the gate electrode layer 140 is embedded in a recess space demarcated by the gate insulating layer 139 inside the gate trench 135. The gate electrode layer 140 is controlled by a gate voltage.

The gate electrode layer 140 is formed as a wall extending along the normal direction of the first main surface 103 in sectional view. The gate electrode layer 140 has an upper end portion positioned at an opening side of the gate trench 135. The upper end portion of the gate electrode layer 140 is formed in a curved shape which is recessed toward the bottom wall of the gate trench 135.

A cross-sectional area of the gate electrode layer 140 may be not less than 0.05 μm$^2$ and not more than 0.5 μm$^2$. The cross-sectional area of the gate electrode layer 140 is a cross-sectional area when the gate electrode layer 140 is cut in a direction orthogonal to the direction in which the gate trench 135 extends.

The cross-sectional area of the gate electrode layer 140 may be not less than 0.05 μm$^2$ and not more than 0.1 μm$^2$, not less than 0.1 μm$^2$ and not more than 0.2 μm$^2$, not less than 0.2 μm$^2$ and not more than 0.3 μm$^2$, not less than 0.3 μm$^2$ and not more than 0.4 μm$^2$, or not less than 0.4 μm$^2$ and not more than 0.5 μm$^2$. The cross-sectional area of the gate electrode layer 140 is defined by a product of a depth of the gate electrode layer 140 and a width of the gate electrode layer 140.

The depth of the gate electrode layer 140 is a distance from the upper end portion of the gate electrode layer 140 to a lower end portion thereof. The width of the gate electrode layer 140 is a width of the gate electrode layer 140 at an intermediate position between the upper end portion of the gate electrode layer 140 and the lower end portion thereof.

A position of the upper end portion of the gate electrode layer 140 is deemed to be an intermediate position of an upper surface of the gate electrode layer 140 in a case where the upper end portion is a curved surface (in this embodiment, a curved shape which is recessed downward).

The gate electrode layer 140 includes a p-type polysilicon to which a p-type impurity is added. The p-type impurity may include at least one type of boron (B), aluminum (Al), indium (In) and gallium (Ga).

A p-type impurity concentration of the gate electrode layer 140 is not less than the p-type impurity concentration of the body region 131. More specifically, the p-type impurity concentration of the gate electrode layer 140 is higher than the p-type impurity concentration of the body region 131.

The p-type impurity concentration of the gate electrode layer 140 may be not less than $1 \times 10^{18}$ cm$^{-3}$ and not more than $1 \times 10^{22}$ cm$^{-3}$. A sheet resistance of the gate electrode layer 140 may be not less than 10Ω/□) and not more than 500Ω/□ (in this embodiment, approximately 200Ω/□).

With reference to FIG. 20 and FIG. 22, a gate wiring layer 141 is formed in the outer region 107. The gate wiring layer 141 is electrically connected to the gate pad 108 and the gate finger 109.

The gate wiring layer 141 is formed on the first main surface 103. More specifically, the gate wiring layer 141 is formed at the third region 139c of the gate insulating layer 139.

In this embodiment, the gate wiring layer 141 is formed along the gate finger 109. The gate wiring layer 141 is formed along the three side surfaces 105A, 105B, and 105D of the SiC semiconductor layer 102 to demarcate the active region 106 from three directions.

The gate wiring layer 141 is connected to the gate electrode layer 140 exposed from the contact trench portion 135b of each of the gate trenches 135. In this embodiment, the gate wiring layer 141 is formed by a lead-out portion led out from the gate electrode layer 140 onto the first main surface 103. An upper end portion of the gate wiring layer 141 is connected to the upper end portion of the gate electrode layer 140.

With reference to FIG. 21, a low resistance electrode layer 142 is formed on the gate electrode layer 140. The low resistance electrode layer 142 covers the upper end portion of the gate electrode layer 140 inside the gate trench 135.

The low resistance electrode layer 142 includes a conductive material having a sheet resistance which is less than the sheet resistance of the gate electrode layer 140. The sheet resistance of the low resistance electrode layer 142 may be not less than 0.01Ω/□) and not more than 10Ω/□. The sheet resistance of the low resistance electrode layer 142 may be not less than 0.01Ω/□ and not more than 0.1Ω/□, not less than 0.1Ω/□ and not more than 1Ω/□, not less than 1Ω/□ and not more than 2Ω/□, not less than 2Ω/□ and not more than 4Ω/□, not less than 4Ω/□ and not more than 6Ω/□, not less than 6Ω/□ and not more than 8Ω/□, or not less than 8Ω/□ and not more than 10Ω/□.

A current supplied into the gate trench 135 flows through the low resistance electrode layer 142 having a relatively low sheet resistance and is transmitted to the gate electrode layer 140. Thereby, an entirety of the gate electrode layer 140 can be made to transition rapidly from an off state to an on state. It is, thus, possible to suppress a delay of switching response.

In particular, although time is required for transmission of a current in the case of the gate trench 135 having a length on the order of millimeters (not less than 1 mm), the low resistance electrode layer 142 is able to suppress a delay of switching response appropriately. That is, the low resistance electrode layer 142 is formed as a current diffusing electrode layer which diffuses the current into the gate trench 135.

The low resistance electrode layer 142 is formed as a film. The low resistance electrode layer 142 has a connection portion 142a in contact with the upper end portion of the gate electrode layer 140 and a non-connection portion 142b opposite thereto.

The connection portion 142a and the non-connection portion 142b of the low resistance electrode layer 142 may be formed in a curved shape in conformity with the upper end portion of the gate electrode layer 140. The connection portion 142a and the non-connection portion 142b can assume any of various configurations.

An entirety of the connection portion 142a may be positioned higher than the first main surface 103. The entirety of the connection portion 142a may be positioned lower than the first main surface 103. The connection portion 142a may include a portion which is positioned higher than the first main surface 103. The connection portion 142a may include a portion which is positioned lower than the first main surface 103. A central portion of the connection portion 142a may be positioned lower than the first main surface 103, and a peripheral edge portion of the connection portion 142a may be positioned higher than the first main surface 103.

An entirety of the non-connection portion 142b may be positioned higher than the first main surface 103. The entirety of the non-connection portion 142b may be positioned lower than the first main surface 103. The non-connection portion 142b may include a portion which is positioned higher than the first main surface 103. The non-connection portion 142b may include a portion which is positioned lower than the first main surface 103. A central portion of the non-connection portion 142b may be positioned lower than the first main surface 103, and a peripheral edge portion of the non-connection portion 142b may be positioned higher than the first main surface 103.

The low resistance electrode layer 142 has an edge portion 142c in contact with the gate insulating layer 139. The edge portion 142c is in contact with a corner portion of the gate insulating layer 139 which connects the first region 139a and the second region 139b.

The edge portion 142c is formed on the first main surface 103 side with respect to a bottom portion of the source region 138. The edge portion 142c is formed closer to the first main surface 103 side than a boundary between the body region 131 and the source region 138. The edge portion 142c faces the source region 138 across the gate insulating layer 139. The edge portion 142c does not face the body region 131 across the gate insulating layer 139.

Thereby, it is possible to suppress the formation of a current path in a region of the gate insulating layer 139 between the low resistance electrode layer 142 and the body region 131. The current path may be formed by an undesired diffusion of an electrode material of the low resistance electrode layer 142 into the gate insulating layer 139.

In particular, a structure in which the edge portion 142c of the low resistance electrode layer 142 is connected to the relatively thick third region 139c of the gate insulating layer 139 (a corner portion of the gate insulating layer 139) is effective in reducing a risk of the current path.

A thickness TR of the low resistance electrode layer 142 is not more than a thickness TG of the gate electrode layer 140 (TR≤TG) in terms of the normal direction of the first main surface 103. More specifically, the thickness TR of the low resistance electrode layer 142 is not more than half the thickness TG of the gate electrode layer 140 (TR≤TG/2).

TR/TG which is a ratio of the thickness TR of the low resistance electrode layer 142 in relation to the thickness TG of the gate electrode layer 140 is not less than 0.01 and not more than 1. The ratio TR/TG may be not less than 0.01 and not more than 0.1, not less than 0.1 and not more than 0.25, not less than 0.25 and not more than 0.5, not less than 0.5 and not more than 0.75, or not less than 0.75 and not more than 1.

The thickness TG of the gate electrode layer 140 may be not less than 0.5 µm and not more than 3 µm. The thickness TG may be not less than 0.5 µm and not more than 1 µm, not less than 1 µm and not more than 1.5 µm, not less than 1.5 µm and not more than 2 µm, not less than 2 µm and not more than 2.5 µm, or not less than 2.5 µm and not more than 3 µm.

The thickness TR of the low resistance electrode layer 142 may be not less than 0.01 µm and not more than 3 µm. The thickness TR may be not less than 0.01 µm and not more than 0.1 µm, not less than 0.1 µm and not more than 0.5 µm, not less than 0.5 µm and not more than 1 µm, not less than 1 µm and not more than 1.5 µm, not less than 1.5 µm and not more than 2 µm, not less than 2 µm and not more than 2.5 µm, or not less than 2.5 µm and not more than 3 µm.

With reference to FIG. 22, in this embodiment, the low resistance electrode layer 142 also covers an upper end portion of the gate wiring layer 141. A portion of the low resistance electrode layer 142 which covers the upper end portion of the gate wiring layer 141 is formed integrally with a portion of the low resistance electrode layer 142 which covers the upper end portion of the gate electrode layer 140.

The low resistance electrode layer 142 covers an entire region of the gate electrode layer 140 and an entire region of the gate wiring layer 141. A current supplied from the gate pad 108 and the gate finger 109 to the gate wiring layer 141 flows through the low resistance electrode layer 142 having a relatively low sheet resistance and is transmitted to the gate electrode layer 140 and the gate wiring layer 141.

Thereby, the entirety of the gate electrode layer 140 can be made to transition rapidly from an off state to an on state via the gate wiring layer 141. It is, thus, possible to suppress a delay of switching response. In particular, in the case of the gate trench 135 having a length on the order of millimeters (not less than 1 mm), the delay of switching response can be appropriately suppressed by the low resistance electrode layer 142 which covers the upper end portion of the gate wiring layer 141.

The low resistance electrode layer 142 includes a polycide layer. The polycide layer is formed by a portion which forms a surface layer portion of the gate electrode layer 140, being silicided by a metal material. More specifically, the polycide layer is constituted of a p-type polycide layer which includes the p-type impurity added to the p-type polysilicon (the gate electrode layer 140).

In this embodiment, the low resistance electrode layer 142 has a specific resistance of not less than 10 µΩ·cm and not more than 110 µΩ·cm. The specific resistance of the low resistance electrode layer 142 may be not less than 10 µΩ·cm and not more than 25 µΩ·cm, not less than 25 µΩ·cm and not more than 50 µΩ·cm, not less than 50 µΩ·cm and not more than 75 µΩ·cm, not less than 75 µΩ·cm and not more than 100 µΩ·cm, or not less than 100 µΩ·cm and not more than 110 µΩ·cm. The low resistance electrode layer 142 includes at least one type of TiSi, $TiSi_2$, NiSi, CoSi, $CoSi_2$, $MoSi_2$, and $WSi_2$.

Among these types of materials, in particular, NiSi, $CoSi_2$, and $TiSi_2$ are relatively low in specific resistance value and temperature dependency and, therefore, suitable as the polycide layer for forming the low resistance electrode layer 142.

Further, as a result of verification by the inventors, in a case where $TiSi_2$ was adopted as the material of the low resistance electrode layer 142, an increase in leak current between the gate and source was observed upon application of a low electric field. In contrast thereto, in a case where $CoSi_2$ was adopted, no increase in leak current between the gate and source was observed upon application of a low electric field. When the fact that NiSi has a problem in heat resistance as compared with $CoSi_2$ is taken into account, $CoSi_2$ is the most preferable as the polycide layer for forming the low resistance electrode layer 142.

A sheet resistance inside the gate trench 135 when the low resistance electrode layer 142 is formed is not more than a sheet resistance of the gate electrode layer 140 alone. The sheet resistance inside the gate trench 135 is preferably not more than a sheet resistance of n-type polysilicon to which an n-type impurity is added.

The sheet resistance inside the gate trench 135 is approximated to a sheet resistance of the low resistance electrode layer 142. That is, the sheet resistance inside the gate trench 135 may be not less than 0.01Ω/□ and not more than 10Ω/□. The sheet resistance inside the gate trench 135 may be not less than 0.01Ω/□ and not more than 0.1Ω/□, not less than 0.1Ω/□ and not more than 1Ω/□, not less than 1Ω/□ and not more than 2Ω/□, not less than 2Ω/□ and not more than 4Ω/□, not less than 4Ω/□ and not more than 6Ω/□, not less than 6Ω/□ and not more than 8Ω/□, or not less than 8Ω/□ and not more than 10Ω/□. The sheet resistance inside the gate trench 135 is preferably less than 10Ω/□.

Again, with reference to FIG. 20 and FIG. 21, a plurality of source trenches 145 are formed in the first main surface 103 in the active region 106. Each of the source trenches 145 is formed in a region between two gate trenches 135 which are mutually adjacent.

Each of the source trenches 145 is formed in a band shape extending substantially parallel to or parallel to the second direction Y. The plurality of source trenches 145 are formed in a stripe shape in plan view. The plurality of source trenches 145 intersect the plurality of raised portion groups 115 in plan view, in the same manner as with the gate trenches 135.

Each of the source trenches 145 penetrates through the body region 131 and reaches the SiC epitaxial layer 122. A bottom wall of each of the source trenches 145 is positioned inside the SiC epitaxial layer 122. More specifically, the bottom wall of each of the source trenches 145 is positioned in the high concentration region 122a of the SiC epitaxial layer 122.

A depth of the source trench 145 may be substantially equal to the depth of the gate trench 135. The depth of the source trench 145 may be not less than the depth of the gate trench 135.

A pitch between central portions of the mutually adjacent source trenches 145 in terms of the first direction X may be not less than 1.5 µm and not more than 3 µm. The pitch between the central portions of the source trenches 145 may be not less than 1.5 µm and not more than 2 µm, not less than 2 µm and not more than 2.5 µm, or not less than 2.5 µm and not more than 3 µm.

A depth of the source trench 145 in terms of the normal direction of the first main surface 103 may be not less than 0.5 µm and not more than 10 µm. The depth of the source trench 145 may be not less than 0.5 µm and not more than 1 µm, not less than 1 µm and not more than 2.5 µm, not less than 2.5 µm and not more than 5 µm, not less than 5 µm and not more than 7.5 µm, or not less than 7.5 µm and not more than 10 µm.

A first direction X width of the source trench 145 may be not less than 0.1 µm and not more than 2 µm. The first direction X width of the source trench 145 may be not less than 0.1 µm and not more than 0.5 µm, not less than 0.5 µm and not more than 1 µm, not less than 1 µm and not more than 1.5 µm, or not less than 1.5 µm and not more than 2 µm.

The first direction X width of the source trench 145 may be substantially equal to the first direction X width of the gate trench 135. The first direction X width of the source trench 145 may be not less than the first direction X width of the gate trench 135.

An opening edge portion 146 of each of the source trenches 145 includes a curved portion 147 which is curved toward an interior of the source trench 145. The opening edge portion 146 of the source trench 145 is a corner portion which connects the first main surface 103 and a side wall of the source trench 145.

An electric field to the opening edge portion 146 of the source trench 145 is dispersed along the curved portion 147. It is, thereby, possible to relax the concentration of an electric field on the opening edge portion 146 of the source trench 145.

A p+-type contact region 148 is formed at a region along the side wall of the source trench 145 in the SiC semiconductor layer 102. A plurality of contact regions 148 are formed in a side surface of one source trench 145 on one side and a side surface thereof on the other side.

The plurality of contact regions 148 are formed at intervals along the second direction Y. The plurality of contact regions 148 are formed at intervals along the first direction X from the gate trench 135.

A p-type deep well region 149 is formed at a region along an inner wall of the source trench 145 in the SiC semiconductor layer 102. The deep well region 149 is formed in a band shape extending along the source trench 145. The deep well region 149 extends along the inner wall of the source trench 145.

More specifically, the deep well region 149 extends along the side wall of the source trench 145, passes through an edge portion thereof, and covers the bottom wall of the source trench 145. The deep well region 149 is continuous to the body region 131 in the side wall of the source trench 145.

The deep well region 149 has a bottom portion which is positioned on the second main surface 104 side with respect to the bottom wall of the gate trench 135. The deep well region 149 is formed in the high concentration region 122a of the SiC epitaxial layer 122.

A p-type impurity concentration of the deep well region 149 may be substantially equal to the p-type impurity concentration of the body region 131. The p-type impurity concentration of the deep well region 149 may be greater than the p-type impurity concentration of the body region 131. The p-type impurity concentration of the deep well region 149 may be less than the p-type impurity concentration of the body region 131.

The p-type impurity concentration of the deep well region 149 may be not more than a p-type impurity concentration of the contact region 148. The p-type impurity concentration of the deep well region 149 may be less than the p-type impurity concentration of the contact region 148. The p-type impurity concentration of the deep well region 149 may be not less than $1.0 \times 10^{17}$ cm$^{-3}$ and not more than $1.0 \times 10^{19}$ cm$^{-3}$.

A source insulating layer 150 and a source electrode layer 151 are formed inside each of the source trenches 145. In FIG. 2), the source insulating layer 150 and the source electrode layer 151 are shown with hatching for clarity.

The source insulating layer 150 may include silicon oxide. The source insulating layer 150 is formed as a film along an inner wall surface of the source trench 145 to demarcate a recess space inside the source trench 145.

The source insulating layer 150 includes a first region 150a and a second region 150b. The first region 150a is formed along the side wall of the source trench 145. The second region 150b is formed along the bottom wall of the source trench 145.

A thickness T11 of the first region 150a of the source insulating layer 150 is smaller than a thickness T12 of the second region 150b of the source insulating layer 150. T12/T11 which is a ratio of the thickness T12 of the second region 150b in relation to the thickness T11 of the first region 150a may be not less than 2 and not more than 5.

The thickness T11 of the first region 150a may be not less than 0.01 µm and not more than 0.2 µm. The thickness T12 of the second region 150b may be not less than 0.05 µm and not more than 0.5 µm.

The thickness T11 of the first region 150a may be substantially equal to the thickness T1 of the first region 139a of the gate insulating layer 139. The thickness T12 of the second region 150b may be substantially equal to the thickness T2 of the second region 139b of the gate insulating layer 139.

The source insulating layer 150 exposes the opening edge portion 146 of the source trench 145. More specifically, the source insulating layer 150 exposes the source region 138 and the contact region 148 from the opening edge portion 146 of the source trench 145.

Even more specifically, the first region 150a of the source insulating layer 150 has an upper end portion positioned at an opening side of the source trench 145. The upper end portion of the first region 150a is formed lower than the first main surface 103.

The upper end portion of the first region 150a exposes the side wall of the source trench 145 at the opening side of the source trench 145. In this way, the first region 150a exposes the source region 138 and the contact region 148 from the opening edge portion 146 of the source trench 145.

The source electrode layer 151 is embedded into the source trench 145 across the source insulating layer 150. More specifically, the source electrode layer 151 is embedded into the recess space demarcated by the source insulating layer 150 inside the source trench 145. The source electrode layer 151 is controlled by a source voltage.

The source electrode layer 151 has an upper end portion which is positioned at the opening side of the source trench 145. The upper end portion of the source electrode layer 151 is formed lower than the first main surface 103.

The upper end portion of the source electrode layer 151 may be formed flush with the upper end portion of the source insulating layer 150. The upper end portion of the source electrode layer 151 may protrude higher than the upper end portion of the source insulating layer 150.

The upper end portion of the source electrode layer 151 may be positioned lower than the upper end portion of the source insulating layer 150. A thickness of the source electrode layer 151 may be not less than 0.5 µm and not more than 10 µm (for example, approximately 1 µm). The thickness of the source electrode layer 151 may be not less than 0.5 µm and not more than 1 µm, not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm.

The source electrode layer 151 preferably includes polysilicon having properties close to SiC in terms of material properties. It is, thereby, possible to reduce stress generated inside the SiC semiconductor layer 102. The source electrode layer 151 preferably includes a p-type polysilicon to which a p-type impurity is added.

In this case, the source electrode layer 151 can be formed at the same time as the gate electrode layer 140. The p-type impurity may include at least one type of boron (B), aluminum (Al), indium (In) and gallium (Ga).

A p-type impurity concentration of the source electrode layer 151 is not less than the p-type impurity concentration of the body region 131. More specifically, the p-type impurity concentration of the source electrode layer 151 is larger than the p-type impurity concentration of the body region 131.

The p-type impurity concentration of the source electrode layer 151 may be not less than $1\times10^{18}$ cm$^{-3}$ and not more than $1\times10^{22}$ cm$^{-3}$. A sheet resistance of the source electrode layer 151 may be not less than 10Ω/☐ and not more than 500Ω/☐. The sheet resistance of the source electrode layer 151 may be not less than 10Ω/☐ and not more than 50Ω/☐, not less than 50Ω/☐ and not more than 100Ω/☐, not less than 100Ω/☐ and not more than 200Ω/☐, not less than 200Ω/☐ and not more than 300Ω/☐, not less than 300Ω/☐ and not more than 400Ω/☐, or not less than 400Ω/☐ and not more than 500Ω/☐.

The p-type impurity concentration of the source electrode layer 151 may be substantially equal to the p-type impurity concentration of the gate electrode layer 140. The sheet resistance of the source electrode layer 151 may be substantially equal to the sheet resistance of the gate electrode layer 140.

The source electrode layer 151 may include an n-type polysilicon in place of the p-type polysilicon. The source electrode layer 151 may include at least one type of tungsten, aluminum, copper, an aluminum alloy, and a copper alloy in place of the p-type polysilicon.

Thus, the semiconductor device 101 has a trench gate electrode structure 152 and a trench source electrode structure 153. The trench gate electrode structure 152 includes the gate trench 135, the gate insulating layer 139, the gate electrode layer 140, and the low resistance electrode layer 142. The trench source electrode structure 153 includes the source trench 145, the source insulating layer 150, and the source electrode layer 151.

With reference to FIG. 21 and FIG. 22, the interlayer insulating layer 161 is formed on the first main surface 103. The interlayer insulating layer 161 covers selectively the active region 106 and the outer region 107. The interlayer insulating layer 161 covers the trench gate electrode structure 152 in the active region 106, and covers the gate wiring layer 141 in the outer region 107.

The interlayer insulating layer 161 may include silicon oxide or silicon nitride. In the interlayer insulating layer 161, a gate contact hole 162 and a source contact hole 163 are formed.

The gate contact hole 162 exposes the gate wiring layer 141 (the low resistance electrode layer 142) in the outer region 107. The source contact hole 163 exposes the source region 138, the contact region 148, and the trench source electrode structure 153 in the active region 106. On the interlayer insulating layer 161, the gate pad 108, the gate finger 109, and the source pad 110 are formed.

The gate finger 109 enters into the gate contact hole 162 from above the interlayer insulating layer 161. The gate finger 109 is electrically connected to the low resistance electrode layer 142 inside the gate contact hole 162. Thereby, an electrical signal from the gate pad 108 is transmitted to the gate electrode layer 140 via the low resistance electrode layer 142 having a relatively low resistance value.

The source pad 110 enters into the source contact hole 163 from above the interlayer insulating layer 161. The source pad 110 is electrically connected to the source region 138, the contact region 148, and the source electrode layer 151 inside the source contact hole 163. The source electrode layer 151 may be formed by using a partial region of the source pad 110.

Figure 24:
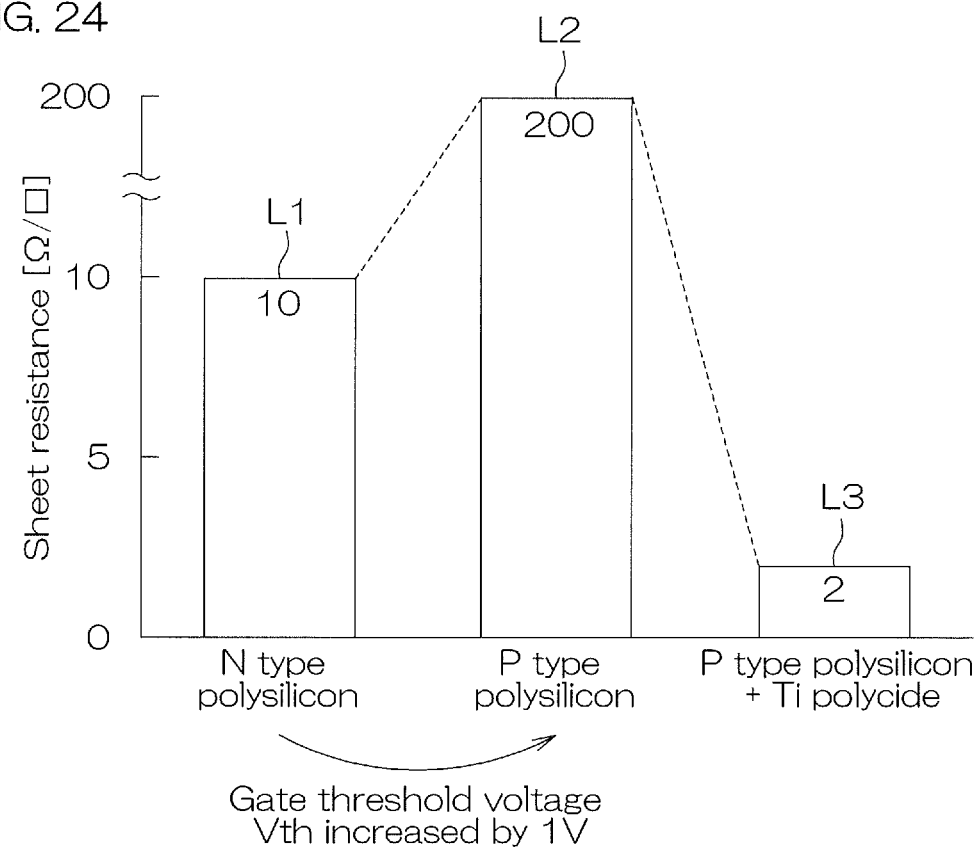
FIG. 24 is a graph which describes a sheet resistance.

FIG. 24 is a graph for describing a sheet resistance. In FIG. 24, the vertical axis shows a sheet resistance [Ω/☐] and the horizontal axis shows items. In FIG. 24, a first column graph L1, a second column graph L2, and a third column graph L3 are shown.

The first column graph L1 shows a sheet resistance of the n-type polysilicon. The second column graph L2 shows a sheet resistance of the p-type polysilicon. The third column graph L3 shows a sheet resistance inside the gate trench 135 in a case where the low resistance electrode layer 142 is formed on the p-type polysilicon. Here, the low resistance electrode layer 142 includes TiSi$_2$ (p-type titanium silicide).

With reference to the first column graph L1, the sheet resistance of the n-type polysilicon is 10Ω/☐. With reference to the second column graph L2, the sheet resistance of the p-type polysilicon is 200Ω/☐. With reference to the third column graph L3, the sheet resistance in the case where the low resistance electrode layer 142 is formed on the p-type polysilicon is 2Ω/☐.

The p-type polysilicon has a work function different from the n-type polysilicon, and embedding the p-type polysilicon into the gate trench 135 makes it possible to increase a gate threshold voltage Vth by approximately 1V.

However, the p-type polysilicon has a sheet resistance which is several tens of times (approximately 20 times) higher than a sheet resistance of the n-type polysilicon. Therefore, in a case where the p-type polysilicon is adopted as the material of the gate electrode layer 140, an energy loss increases significantly in association with an increase in parasitic resistance inside the gate trench 135 (hereinafter, simply referred to as "gate resistance").

In contrast thereto, in a structure having the low resistance electrode layer 142 provided on the p-type polysilicon, the sheet resistance can be decreased to not more than 1/100 as compared with a case where the low resistance electrode layer 142 is not formed. Further, in a structure having the low resistance electrode layer 142, the sheet resistance can be decreased to not more than 1/5 as compared with the gate electrode layer 140 which includes an n-type polysilicon.

As described above, according to the semiconductor device 101, the connection area of the drain pad 123 to the second main surface 104 can be increased by the raised portion group 115. It is, thereby, possible to improve electrical characteristics.

More specifically, the drain pad 123 forms an ohmic contact with the raised portion group 115. Thereby, favorable ohmic characteristics can be obtained between the SiC semiconductor layer 102 and the drain pad 123 and, therefore, electrical characteristics can be improved.

Further, according to the semiconductor device 101, the trench gate electrode structure 152 in which the gate electrode layer 140 is embedded into the gate trench 135 across the gate insulating layer 139 is formed. In this trench gate electrode structure 152, the gate electrode layer 140 is covered by the low resistance electrode layer 142 in the limited space of the gate trench 135.

The gate electrode layer 140 includes the p-type polysilicon. It is, thereby, possible to increase the gate threshold voltage Vth. The low resistance electrode layer 142 also includes the conductive material having the sheet resistance less than the sheet resistance of the p-type polysilicon.

It is, thereby, possible to reduce the gate resistance. As a result, a current can be efficiently diffused along the trench gate electrode structure 152 and reduction in switching delay can thus be achieved.

In particular, the structure in which the gate electrode layer 140 is covered by the low resistance electrode layer 142 eliminates the necessity of increasing the p-type impurity concentration of the body region 131. It is, thus, possible to increase the gate threshold voltage Vth while preventing an increase in channel resistance.

Further, according to the semiconductor device 101, the gate wiring layer 141 is covered by the low resistance electrode layer 142 in the outer region 107. It is, thereby, possible to reduce a gate resistance of the gate wiring layer 141 as well.

In particular, in the structure in which the gate electrode layer 140 and the gate wiring layer 141 are covered by the low resistance electrode layer 142, a current can be efficiently diffused along the trench gate electrode structure 152. Thus, the reduction in switching delay can be appropriately achieved.

Figure 25:
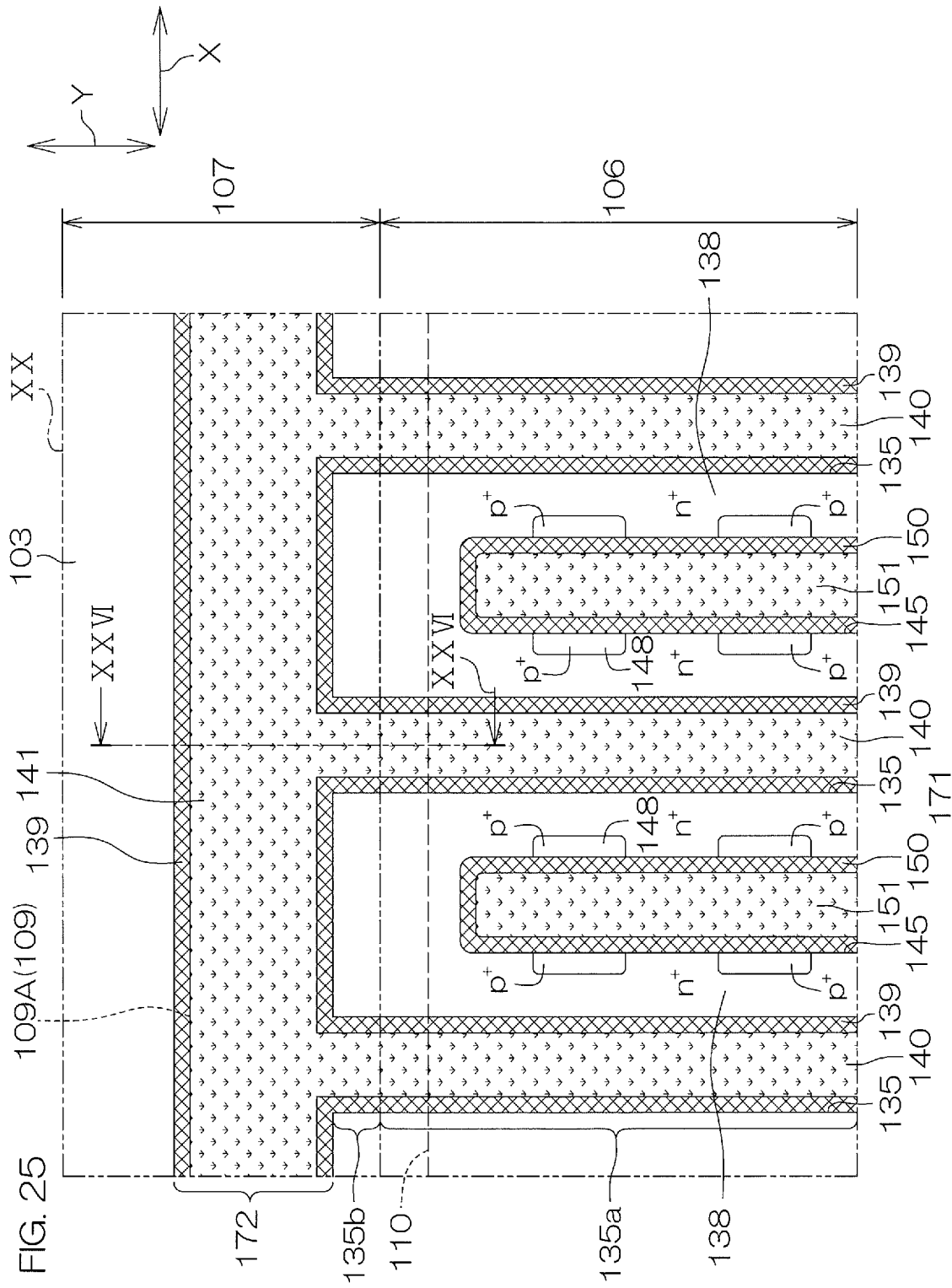
FIG. 25 is an enlarged view of a region corresponding to FIG. 20 and an enlarged view which describes a structure of a semiconductor device according to an eighth preferred embodiment of the present invention.
Figure 26:
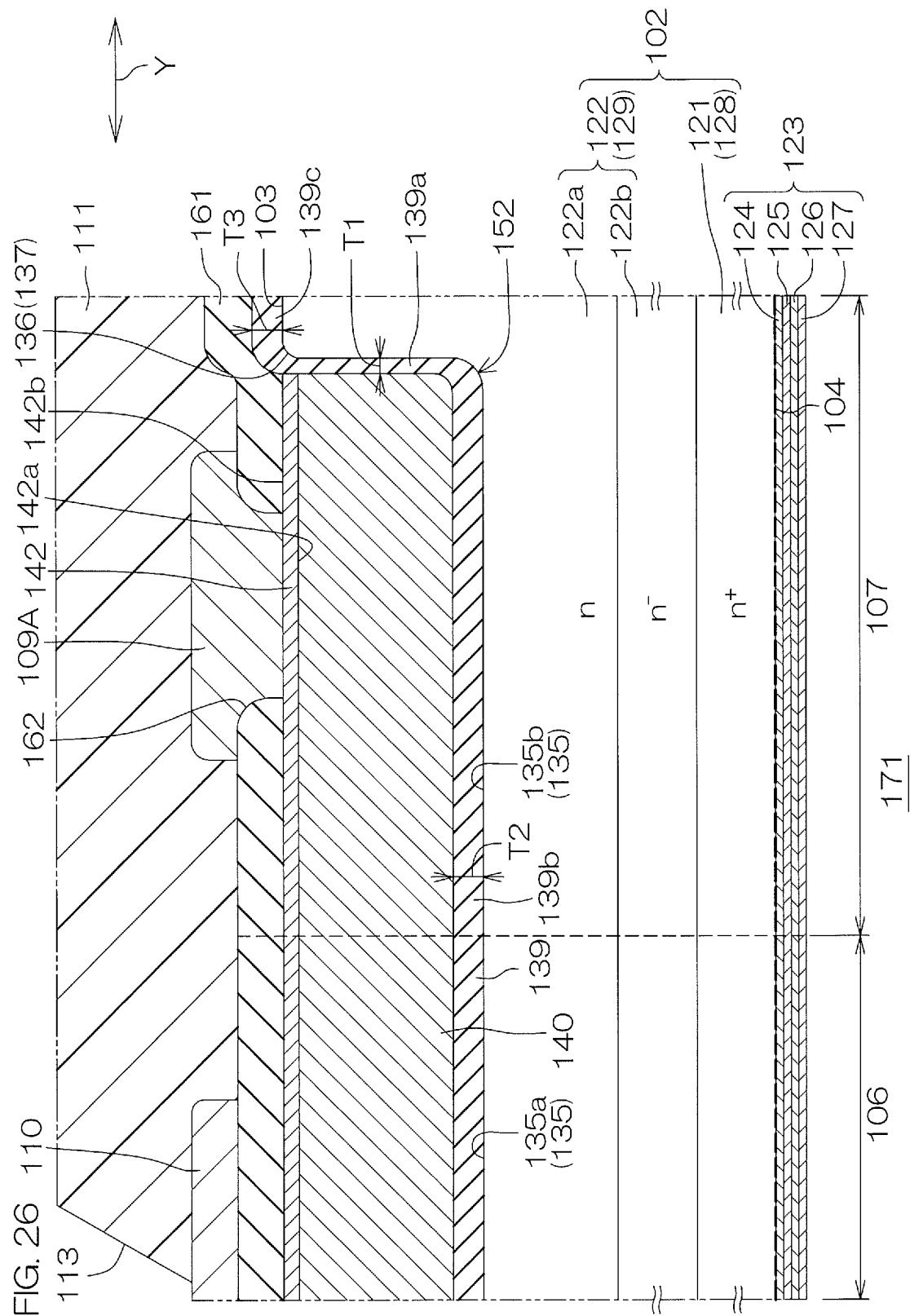
FIG. 26 is a sectional view taken along line XXVI-XXVI shown in FIG. 25.

FIG. 25 is an enlarged view of the region corresponding to FIG. 20 and an enlarged view for describing a structure of a semiconductor device 171 according to an eighth preferred embodiment of the present invention. FIG. 26 is a sectional view taken along line XXVI-XXVI shown in FIG. 25. In the following, structures corresponding to structures of the semiconductor device 101 shall be provided with the same reference symbols and description thereof shall be omitted.

With reference to FIG. 25 and FIG. 26, in the semiconductor device 171, an outer gate trench 172 is formed in a first main surface 103 in an outer region 107. The outer gate trench 172 extends in a band shape in the outer region 107.

The outer gate trench 172 extends along a gate finger 109 in a region below the gate finger 109. More specifically, the outer gate trench 172 is formed along three side surfaces 105A, 105B, and 105D of an SiC semiconductor layer 102 to demarcate an active region 106 from three directions. The outer gate trench 172 may be formed in an endless shape (for example, in a quadrilateral annular shape) which surrounds the active region 106.

The outer gate trench 172 is in communication with a contact trench portion 135b of each gate trench 135. Thereby, the outer gate trench 172 and the gate trench 135 are formed by one trench.

A gate wiring layer 141 is embedded into the outer gate trench 172. The gate wiring layer 141 is connected to a gate electrode layer 140 at a communication portion of the contact trench portion 135b with the outer gate trench 172.

In this embodiment, a low resistance electrode layer 142 covers an upper surface of the gate wiring layer 141 inside the outer gate trench 172. Therefore, the low resistance electrode layer 142 which covers the gate electrode layer 140 and the low resistance electrode layer 142 which covers the gate wiring layer 141 are both positioned inside one trench.

As described above, the semiconductor device 171 is also able to provide the same effects as those described for the semiconductor device 101. Further, the semiconductor device 171 eliminates the necessity of leading out the gate wiring layer 141 onto the first main surface 103.

It is, thereby, possible to suppress the gate wiring layer 141 from facing the SiC semiconductor layer 102 across a gate insulating layer 139 at opening edge portions of the gate trench 135 and the outer gate trench 172. As a result, it is possible to suppress the concentration of an electric field at the opening edge portion of the gate trench 135.

Figure 27:
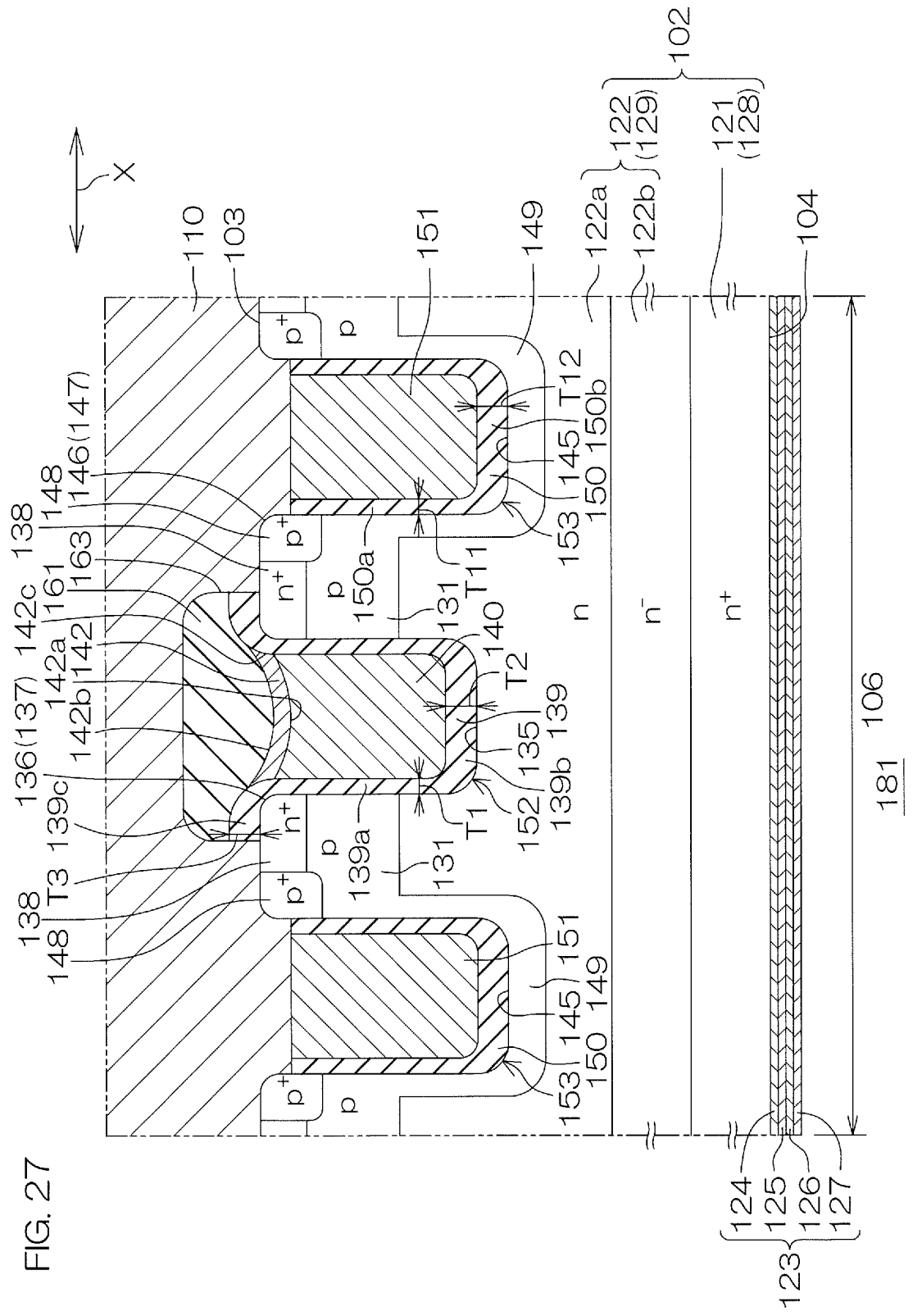
FIG. 27 is a sectional view of a region corresponding to FIG. 21 and a sectional view which describes a structure of a semiconductor device according to a ninth preferred embodiment of the present invention.

FIG. 27 is a sectional view of a region corresponding to FIG. 21 and a sectional view for describing a structure of a semiconductor device 181 according to a ninth preferred embodiment of the present invention. In the following, structures corresponding to structures of the semiconductor device 101 shall be provided with the same reference symbols and description thereof shall be omitted.

With reference to FIG. 27, in the semiconductor device 181, each of source trenches 145 is formed deeper than a gate trench 135. A bottom wall of each of the source trench 145 is positioned on a second main surface 104 side with respect to a bottom wall of the gate trench 135. More specifically, the bottom wall of each of the source trenches 145 is positioned at a high concentration region 122a of an SiC epitaxial layer 122.

A ratio of a depth of the source trench 145 in relation to a depth of the gate trench 135 may be not less than 1.5 under conditions such that the bottom wall of the source trench 145 is positioned inside the high concentration region 122a. The ratio of the depth of the source trench 145 in relation to the depth of the gate trench 135 is preferably not less than 2.

The depth of the gate trench 135 may be not less than 0.5 µm and not more than 3 µm (for example, approximately 1 µm). The depth of the source trench 145 may be not less than 0.75 µm and not more than 10 µm (for example, approximately 2 µm).

In the same manner as with the case of the semiconductor device 101, a contact region 148 extends along an inner wall of the source trench 145 and has a bottom portion which is positioned on a second main surface 104 side with respect to the bottom wall of the gate trench 135. The contact region 148 is formed in the high concentration region 122a of the SiC epitaxial layer 122.

As described above, the semiconductor device 181 is also able to provide the same effects as those described for the semiconductor device 101.

Figure 28:
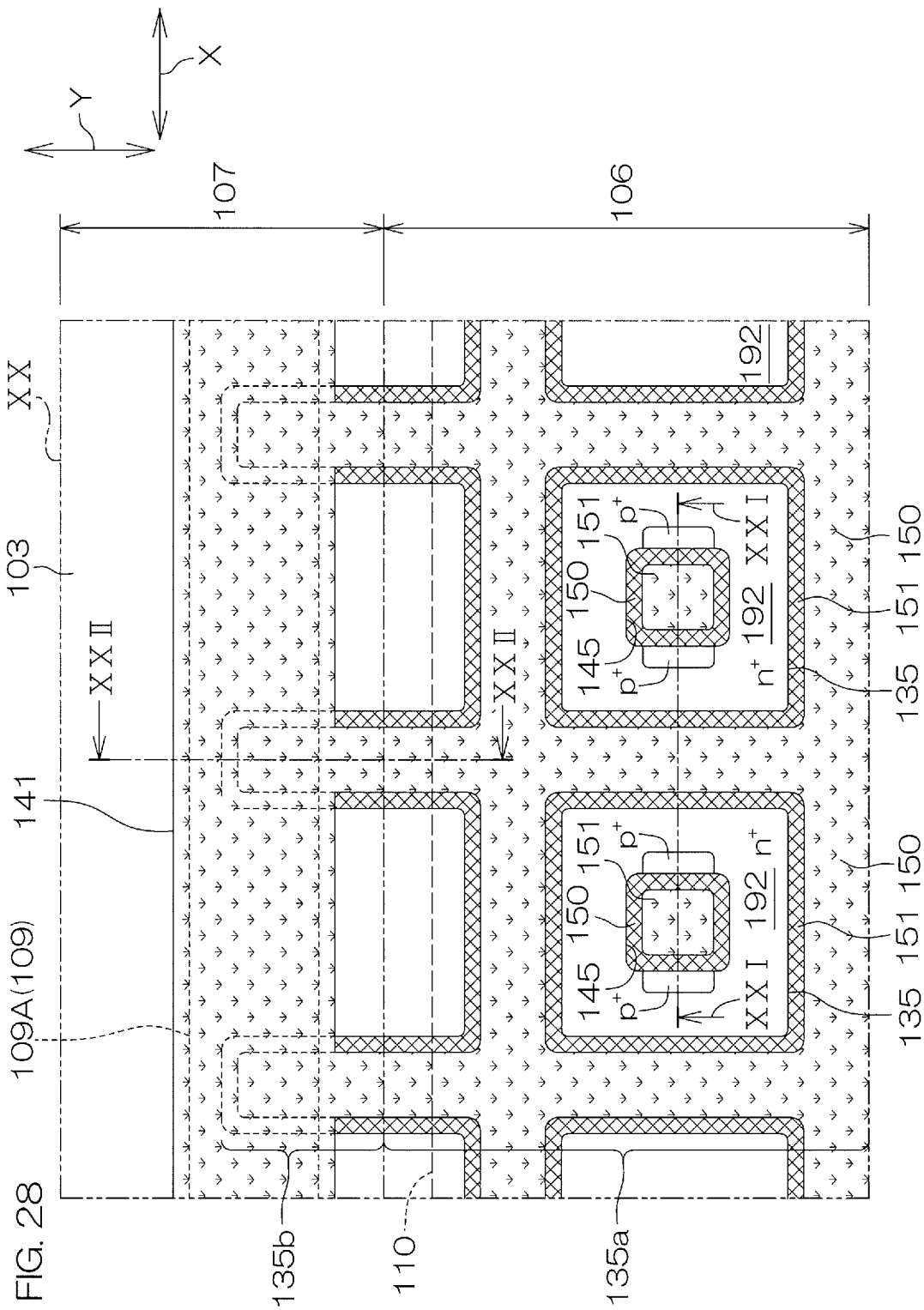
FIG. 28 is an enlarged view of the region corresponding to FIG. 20 and an enlarged view which describes a structure of a semiconductor device according to a tenth preferred embodiment of the present invention.

FIG. 28 is a plan view of a region corresponding to FIG. 20 and a plan view for describing a structure of a semiconductor device 191 according to a tenth preferred embodiment of the present invention. In the following, structures corresponding to structures of the semiconductor device 101 shall be provided with the same reference symbols, and description thereof shall be omitted.

With reference to FIG. 28, in this embodiment, gate trenches 135 are formed in a lattice shape in plan view. The gate trench 135 includes integrally a plurality of gate trenches 135 expending parallel to a first direction X and a plurality of gate trenches 135 extending substantially parallel to or parallel to a second direction Y.

A plurality of cell regions 192 are demarcated by the gate trench 135 in a matrix on a first main surface 103. Each of the cell regions 192 is formed in a quadrilateral shape in plan view. A source trench 145 is formed in each of the plurality of cell regions 192. The source trench 145 may be formed in a quadrilateral shape in plan view.

A sectional view taken along line XXI-XXI in FIG. 28 is substantially equal to the sectional view shown in FIG. 21.

A sectional view taken along line XXII-XXII in FIG. 28 is substantially equal to the sectional view shown in FIG. 22.

As described above, the semiconductor device 191 is also able to provide the same effects as those described for the semiconductor device 101. The gate trench 135 having the structure which is formed in the lattice shape in place of a stripe shape can also be applied to other configurations.

Figure 29:
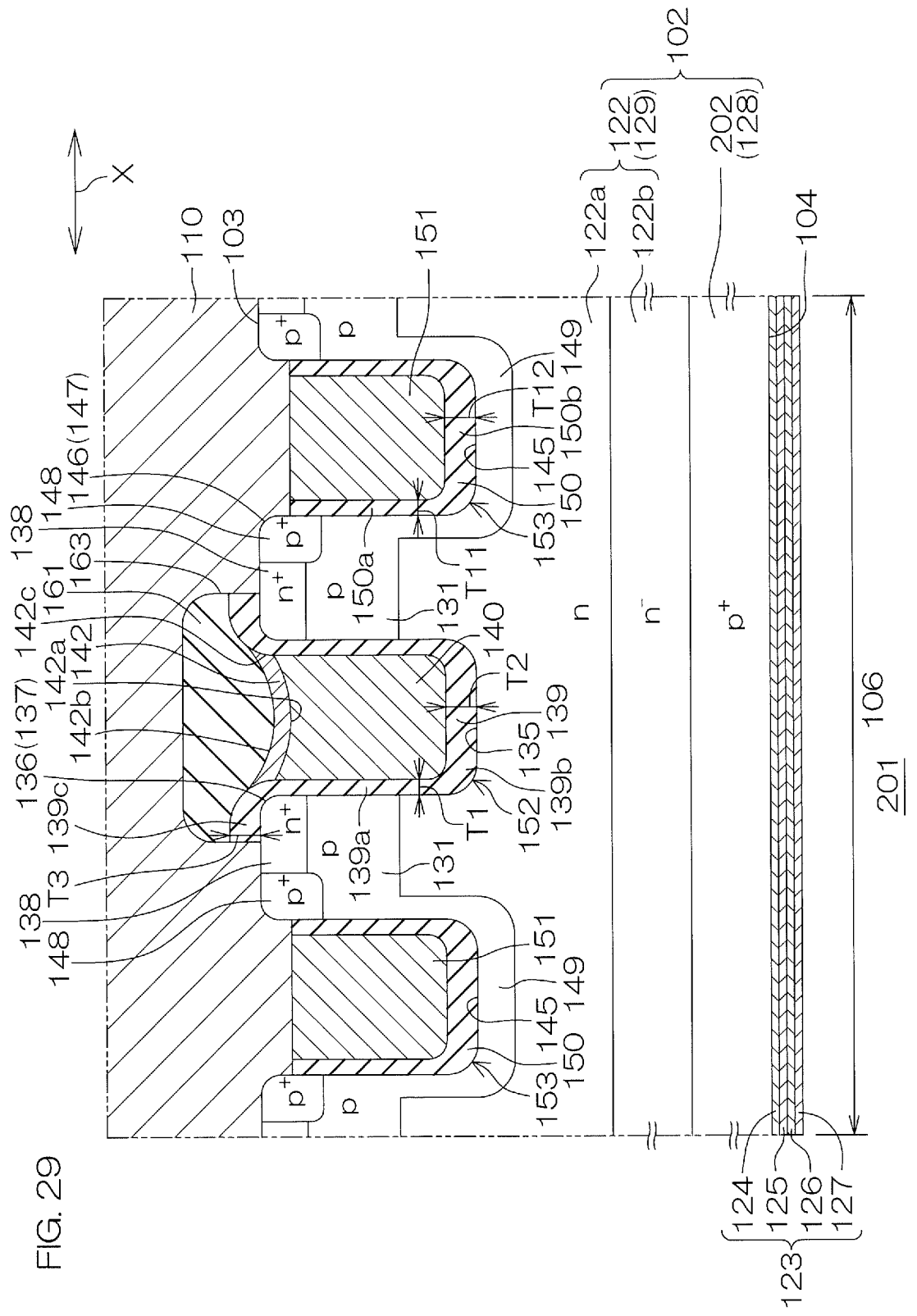
FIG. 29 is a sectional view of a region corresponding to FIG. 21 and a plan view which describes a structure of a semiconductor device according to an eleventh preferred embodiment of the present invention.

FIG. 29 is a sectional view of a region corresponding to FIG. 21 and a plan view for describing a structure of a semiconductor device 201 according to an eleventh preferred embodiment of the present invention. In the following, structures corresponding to structures of the semiconductor device 101 shall be provided with the same reference symbols, and description thereof shall be omitted.

With reference to FIG. 29, in the semiconductor device 201, an SiC semiconductor layer 102 includes a $p^+$-type SiC semiconductor substrate 202 in place of the $n^+$-type SiC semiconductor substrate 121. The $p^+$-type SiC semiconductor substrate 202 is formed as a collector region of an IGBT (insulated gate bipolar transistor).

The description of the semiconductor device 101 is applied to a description of the semiconductor device 201 by replacing a "source" of the MISFET by an "emitter" of the IGBT and replacing a "drain" of the MISFET by a "collector" of the IGBT.

That is, the source pad 110 and the source region 138 are respectively replaced by an emitter pad (110) and an emitter region (138). Further, the drain pad 123 and the drain region 128 are respectively replaced by a collector electrode layer (123) and a collector region (128).

As described above, the semiconductor device 201 is also able to provide the same effects as those described for the semiconductor device 101.

Although preferred embodiments of the present invention have been so far described, the present invention can be carried out in other configurations.

In each of the above-described preferred embodiments, a structure with which the conductive type of each semiconductor portion is inverted may be adopted. That is, a p-type portion may be formed to be of an n-type, and an n-type portion is formed to be of a p-type.

In each of the above-described preferred embodiments, a description has been given of an example in which the SiC semiconductor layer 2 or 102 has a laminated structure including the SiC semiconductor substrate 21 or 121 and the SiC epitaxial layer 22 or 122. However, the SiC semiconductor layer 2 or 102 may have a single layer structure constituted of the SiC semiconductor substrate 21 or 121. Further, the SiC semiconductor layer 2 or 102 may have a single layer structure constituted of the SiC epitaxial layer 22 or 122.

In the first to sixth preferred embodiments described above, a description has been given of an example in which the electrode 10 includes the Ti layer 31, the Ni layer 32, the Au layer 33, and/or the Ag layer 34. However, the electrode 10 may include an Al layer in place of or in addition to the Ti layer 31, the Ni layer 32, the Au layer 33, and/or the Ag layer 34.

The electrode 10 may have a laminated structure in which at least two types of the Ti layer 31, the Ni layer 32, the Au layer 33, the Ag layer 34, and the Al layer are laminated in any mode. Further, the electrode 10 may have a single layer structure which includes an Al layer.

In the seventh to eleventh preferred embodiments described above, a description has been given of an example in which the SiC epitaxial layer 122 having the high concentration region 122a and the low concentration region 122b is formed by an epitaxial growth method. However, the SiC epitaxial layer 122 may also be formed by the following steps.

First, the SiC epitaxial layer 122 having a relatively low n-type impurity concentration is formed by an epitaxial growth method. Then, an n-type impurity is introduced into a surface layer portion of the SiC epitaxial layer 122 by an ion implantation method. Thereby, the SiC epitaxial layer 122 having the high concentration region 122a and the low concentration region 122b is formed.

In the seventh to eleventh preferred embodiments described above, a description has been given of an example in which the gate electrode layer 140 and the gate wiring layer 141 which include a p-type polysilicon to which a p-type impurity is added are formed. However, in a case where no importance is given to an increase in gate threshold voltage Vth, the gate electrode layer 140 and the gate wiring layer 141 may include an n-type polysilicon to which an n-type impurity is added in place of the p-type polysilicon.

That is, the low resistance electrode layer 142 may include an n-type polycide. In this case, the low resistance electrode layer 142 may be formed by siliciding a portion of the n-type polysilicon which forms a surface layer portion by a metal material. The above-described structure is able to reduce a gate resistance.

In the seventh to eleventh preferred embodiments described above, a description has been given of an example in which the drain pad 123 includes the Ti layer 124, the Ni layer 125, the Au layer 126, and/or the Ag layer 127. The drain pad 123 may include the Al layer in place of or in addition to the Ti layer 124, the Ni layer 125, the Au layer 126, and/or the Ag layer 127.

In the seventh to eleventh preferred embodiments described above, the drain pad 123 may have a laminated structure in which at least two types of the Ti layer 124, the Ni layer 125, the Au layer 126, the Ag layer 127, and the Al layer are laminated in any mode. The drain pad 123 may have a single layer structure which includes an Al layer.

In the seventh to tenth preferred embodiments described above, the structure of the semiconductor device 201 according to the eleventh preferred embodiment may be adopted. That is, in the seventh to tenth preferred embodiments described above, the $p^+$-type SiC semiconductor substrate 202 may be adopted in place of the $n^+$-type SiC semiconductor substrate 21 or 121. In this case, in the description of each of the preferred embodiments described above, the "source" shall be replaced by the "emitter" and the "drain" shall be replaced by the "collector".

Examples of characteristics extracted from the present specification and the diagrams will be described hereinafter.

[A1] A semiconductor device including an SiC semiconductor layer which has a first main surface on one side and a second main surface on the other side, a semiconductor element which is formed in the first main surface, a raised portion group which includes a plurality of raised portions formed at intervals from each other at the second main surface, and an electrode which is directly connected to the raised portion group on the second main surface.

According to the semiconductor device, a connection area of the electrode to the second main surface can be increased by the raised portion group. It is, thereby, possible to improve electrical characteristics. Further, according to the semiconductor device, the electrode is directly connected to the raised portion group, thus making it possible to suppress an increase in resistance value due to a connection failure.

[A2] The semiconductor device described in A1 in which the electrode is connected to the raised portion group not via a silicide layer.

[A3] The semiconductor device described in A1 or A2 in which the electrode is connected to the raised portion group not via a carbon layer.

[A4] The semiconductor device described in any one of A1 to A3 in which the electrode includes at least one type of Ti, Ni, Au, and Ag.

[A5] The semiconductor device described in any one of A1 to A4 in which the electrode includes a Ti layer in contact with the raised portion group.

[A6] The semiconductor device described in any one of A1 to A4 in which the electrode includes an Ni layer in contact with the raised portion group.

[A7] The semiconductor device described in any one of A1 to A6 in which the raised portion group has a first portion in which some of the raised portions among the plurality of raised portions overlap each other in a first direction view as viewed in a first direction which is one of the plane directions of the second main surface.

[A8] The semiconductor device described in A7 in which the raised portion group has a second portion in which some of the raised portions among the plurality of raised portions are formed separate from the first portion in the first direction view and also overlap each other in the first direction view.

[A9] The semiconductor device described in A7 or A8 in which the raised portion groups are formed in plurality at intervals along a second direction which is one of the plane directions of the first main surface and which intersects the first direction.

[A10] The semiconductor device described in A9 in which a distance between the plurality of raised portion groups that are mutually adjacent is not more than 100 μm.

[A11] The semiconductor device described in A10 in which the distance is not more than 50 μm.

[A12] The semiconductor device described in A10 or A11 in which the distance is not more than 20 μm.

[A13] The semiconductor device described in any one of A7 to A12 in which the SiC semiconductor layer includes 4H—SiC, and the first direction is a [11-20] direction of 4H—SiC.

[A14] The semiconductor device described in any one of A7 to A12 in which the SiC semiconductor layer includes 4H—SiC, and the first direction is a [1-100] direction of 4H—SiC.

[A15] The semiconductor device described in A13 or A14 in which the SiC semiconductor layer has an off angle inclined at an angle of not more than 10° from a (0001) plane of 4H—SiC with respect to the [11-20] direction.

[A16] The semiconductor device described in A15 in which the off angle is not less than 0° and not more than 4°.

[A17] The semiconductor device described in A15 or A16 in which the off angle is greater than 0° and less than 4°.

[A18] The semiconductor device described in any one of A7 to A17 in which the raised portion group is formed in the second main surface in a range of not less than 10 μm and not more than 200 μm in terms of a direction orthogonal to the first direction.

[A19] The semiconductor device described in A18 in which the range is not less than 50 μm and not more than 150 μm.

[A20] The semiconductor device described in A18 or A14, in which the range is not less than 80 μm and not more than 120 μm.

[A21] The semiconductor device described in any one of A1 to A20 which further includes a groove formed in the second main surface.

[A22] The semiconductor device described in A21 in which the groove includes a portion which intersects the raised portion group.

[A23] The semiconductor device described in A21 or A22 in which the raised portion group includes a portion in which some of the raised portions among the plurality of raised portions are formed at intervals along the groove in a plan view as viewed in a normal direction of the second main surface.

[A24] The semiconductor device described in any one of A1 to A23 in which the semiconductor element includes a Schottky barrier diode.

[A25] The semiconductor device described in any one of A1 to A23 in which the semiconductor element includes a field effect transistor.

[B1] A semiconductor device including an SiC semiconductor layer which has a first main surface on one side and a second main surface on the other side, a semiconductor element which is formed in the first main surface, a raised portion group which includes a plurality of raised portions formed at intervals from each other at the second main surface and has a first portion in which some of the raised portions among the plurality of raised portions overlap each other in a first direction view as viewed in a first direction which is one of the plane directions of the second main surface, and an electrode which is formed on the second main surface and connected to the raised portion group.

According to the semiconductor device, a connection area of the electrode to the second main surface can be increased by the raised portion group. It is, thereby, possible to improve electrical characteristics.

[B2] The semiconductor device described in B1 in which the raised portion group has a second portion in which some of the raised portions among the plurality of raised portions are formed separate from the first portion in the first direction view and also overlap each other in the first direction view.

[B3] The semiconductor device described in B1 or B2 in which the raised portion groups are formed in plurality at intervals along a second direction which is one of the plane directions of the first main surface and which intersects the first direction.

[B4] The semiconductor device described in B3 in which a distance between the plurality of raised portion groups that are mutually adjacent is not more than 100 μm.

[B5] The semiconductor device described in B4 in which the distance is not more than 50 μm.

[B6] The semiconductor device described in B4 or B5 in which the distance is not more than 20 μm.

[B7] The semiconductor device described in any one of B1 to B6 in which the raised portion group is formed in a range of not less than 10 μm and not more than 200 μm in terms of a direction orthogonal to the first direction on the second main surface.

[B8] The semiconductor device described in B7 in which the range is not less than 50 μm and not more than 150 μm.

[B9] The semiconductor device described in B7 or B8 in which the range is not less than 80 μm and not more than 120 μm.

[B10] The semiconductor device described in any one of B1 to B9 in which the SiC semiconductor layer includes 4H—SiC, and the first direction is a [11-20] direction of the 4H—SiC.

[B11] The semiconductor device described in any one of B1 to B9 in which the SiC semiconductor layer includes 4H—SiC, and the first direction is a [1–100] direction of the 4H—SiC.

[B12] The semiconductor device described in B10 or B11 in which the SiC semiconductor layer has an off angle inclined at an angle of not more than 10° from a (0001) plane of the 4H—SiC with respect to the [11–20] direction.

[B13] The semiconductor device described in B12 in which the off angle is not less than 0° and not more than 4°.

[B14] The semiconductor device described in B12 or B13 in which the off angle is greater than 0° and less than 4°.

[B15] The semiconductor device described in any one of B1 to B14 in which the electrode includes at least one type of Ti, Ni, Au, and Ag.

[B16] The semiconductor device described in any one of B1 to B15 in which the electrode includes a Ti layer in contact with the raised portion group.

[B17] The semiconductor device described in any one of B1 to B15 in which the electrode includes an Ni layer in contact with the raised portion group.

[B18] The semiconductor device described in any one of B1 to B17 which further includes a groove formed in the second main surface of the SiC semiconductor layer.

[B19] The semiconductor device described in B18 in which the groove includes a portion which intersects the raised portion group.

[B20] The semiconductor device described in B18 or B19 in which the raised portion group includes a portion in which some of the raised portions among the plurality of raised portions are formed at intervals along the groove in a plan view as viewed in a normal direction of the second main surface.

[B21] The semiconductor device described in any one of B1 to B20 in which the semiconductor element includes a Schottky barrier diode.

[B22] The semiconductor device described in any one of B1 to B20 in which the semiconductor element includes a field effect transistor.

[C1] A semiconductor device including a semiconductor layer which has a main surface in which a gate trench is formed, a gate insulating layer which is formed along an inner wall of the gate trench, a gate electrode layer which includes a p-type polysilicon to which a p-type impurity is added and is embedded into the gate trench across the gate insulating layer, and a low resistance electrode layer which includes a conductive material having a sheet resistance less than a sheet resistance of the gate electrode layer, and covers the gate electrode layer.

According to the semiconductor device, a trench gate electrode structure in which the gate electrode layer is embedded into the gate trench across the gate insulating layer is formed. In the trench gate electrode structure, the gate electrode layer is covered by the low resistance electrode layer.

The gate electrode layer includes the p-type polysilicon. Thereby, a gate threshold voltage can be increased. Further, the low resistance electrode layer includes the conductive material having a sheet resistance less than a sheet resistance of the p-type polysilicon. It is, thereby, possible to reduce a gate resistance.

[C2] The semiconductor device described in C1 in which the low resistance electrode layer includes a polycide layer in which the p-type polysilicon is silicided by a metal material.

[C3] The semiconductor device described in C2 in which the polycide layer includes at least one type of TiSi, $TiSi_2$, NiSi, CoSi, $CoSi_2$, $MoSi_2$, and $WSi_2$.

[C4] The semiconductor device described in any one of C1 to C3 in which the low resistance electrode layer is formed as a film.

[C5] The semiconductor device described in any one of C1 to C4 in which a thickness of the low resistance electrode layer is not more than a thickness of the gate electrode layer.

[C6] The semiconductor device described in any one of C1 to C5 in which the gate insulating layer includes a first region formed along a side wall of the gate trench and a second region formed along a bottom wall of the gate trench, and a thickness of the second region of the gate insulating layer is not less than a thickness of the first region of the gate insulating layer.

[C7] The semiconductor device described in C6 in which the gate insulating layer has a third region which covers the main surface of the semiconductor layer, and a thickness of the third region of the gate insulating layer is not less than the thickness of the first region of the gate insulating layer.

[C8] The semiconductor device described in any one of C1 to C7 in which the gate trench has a curved portion which is curved toward an interior of the gate trench at an opening edge portion which connects the main surface of the semiconductor layer and a side wall of the gate trench.

[C9] The semiconductor device described in any one of C1 to C7 in which the gate trench has an inclined portion which is inclined downward toward a side wall of the gate trench from the main surface of the semiconductor layer at an opening edge portion which connects the main surface of the semiconductor layer and the side wall of the gate trench.

[C10] The semiconductor device described in any one of C1 to C9 in which the gate insulating layer includes a bulging portion which bulges toward an interior of the gate trench at an opening edge portion of the gate trench, and the low resistance electrode layer is in contact with the bulging portion of the gate insulating layer.

[C11] The semiconductor device described in C10 in which the bulging portion of the gate insulating layer protrudes in a curved shape toward the interior of the gate trench.

[C12] The semiconductor device described in any one of C1 to C11 which further includes a source region, a body region, and a drain region formed in this order so as to run along a side wall of the gate trench from the main surface of the semiconductor layer toward a thickness direction thereof and in which the low resistance electrode layer faces the source region across the gate insulating layer.

[C13] The semiconductor device described in any one of C1 to C12 which further includes an emitter region, a body region and a collector region formed in this order so as to run along the side wall of the gate trench from the main surface of the semiconductor layer toward the thickness direction thereof and in which the low resistance electrode layer faces the emitter region across the gate insulating layer.

[C14] The semiconductor device described in any one of C1 to C13 in which the semiconductor layer includes SiC.

[C15] A method for manufacturing a semiconductor device including a step of forming a gate trench on a main surface of a semiconductor layer, a step of forming a gate insulating layer along an inner wall of the gate trench, a step of forming a gate electrode layer by embedding a p-type polysilicon to which a p-type impurity is added into the gate trench across the gate insulating layer, and a step of forming a low resistance electrode layer by covering the gate electrode layer by a conductive material having a sheet resistance lower than a sheet resistance of the gate electrode layer.

[C16] The method for manufacturing the semiconductor device described in C15 in which the step of forming the low resistance electrode layer includes a step of forming a polycide layer which covers the gate electrode layer by siliciding a surface layer portion of the gate electrode layer by a metal material.

[C17] The method for manufacturing the semiconductor device described in C16 in which the metal material includes at least one type of Ti, Ni, Co, Mo and W.

[C18] The method for manufacturing the semiconductor device described in any one of C15 to C17 in which the step of forming the low resistance electrode layer includes a step of forming the low resistance electrode layer having a thickness not more than a thickness of the gate electrode layer.

[A1] to [A25], [B1] to [B22] and [C1] to [C18] can be combined in any mode among them.

The present specification does not restrict any combined mode of features illustrated with the first to eleventh preferred embodiments. The first to eleventh preferred embodiments may be combined among them in any mode or any configuration. That is, a configuration in which features illustrated in the first to eleventh preferred embodiments are combined in any mode and in any configuration may be adopted.

The present application corresponds to Japanese Patent Application No. 2018-068567 filed on Mar. 30, 2018 in the Japan Patent Office and Japanese Patent Application No. 2018-068568 filed on Mar. 30, 2018 in the Japan Patent Office, and the entire disclosures of these applications are incorporated herein by reference.

While the preferred embodiments of the present invention have been described in detail, these are merely specific examples used to clarify the technical contents of the present invention and the present invention should not be interpreted as being limited to these specific examples and the scope of the present invention is to be limited only by the appended claims.

REFERENCE SIGNS LIST

1: semiconductor device
2: SiC semiconductor layer
3: first main surface
4: second main surface
10: electrode
11: raised portion group
11A: first raised portion group
11B: second raised portion group
15: raised portion
16: groove
21: SiC semiconductor substrate
31: Ti layer
32: Ni layer
62: carbon layer
63: NiSi layer
71: semiconductor device
81: semiconductor device
91: semiconductor device
101: semiconductor device
102: SiC semiconductor layer
103: first main surface
104: second main surface
114: raised portion group
116: groove
121: SiC semiconductor substrate
124: Ti layer
125: Ni layer
171: semiconductor device
181: semiconductor device
191: semiconductor device
201: semiconductor device
202: SiC semiconductor substrate
D: Schottky barrier diode
X: first direction
Y: second direction

The invention claimed is:

1. A semiconductor device comprising:
an SiC semiconductor layer which has a first main surface on one side and a second main surface on the other side;
a semiconductor element which is formed in the first main surface;
a raised portion group which includes a plurality of raised portions formed at intervals from each other at the second main surface and has a first portion in which some of the raised portions among the plurality of raised portions overlap each other in a first direction view as viewed from a first direction which is one of the plane directions of the second main surface;
an Si amorphous layer formed in a surface layer portion of the second main surface inside the SiC semiconductor layer; and
an electrode which is formed on the second main surface and connected to the raised portion group,
wherein at least one of the plurality of raised portions is formed in a protruding shape having a curvature in a cross-sectional view.

2. The semiconductor device according to claim 1, wherein the raised portion group has a second portion in which some of the raised portions among the plurality of raised portion are formed separate from the first portion in the first direction view and also overlap each other in the first direction view.

3. The semiconductor device according to claim 1, wherein the raised portion groups are formed in plural at intervals along a second direction which is one of the plane directions of the first main surface and which intersects the first direction.

4. The semiconductor device according to claim 3, wherein a distance between the plurality of raised portion groups that are mutually adjacent is not more than 100 μm.

5. The semiconductor device according to claim 4, wherein the distance is not more than 50 μm.

6. The semiconductor device according to claim 4, wherein the distance is not more than 20 μm.

7. The semiconductor device according to claim 1, wherein the raised portion group is formed in a range of not less than 10 μm and not more than 200 μm in terms of a direction orthogonal to the first direction on the second main surface.

8. The semiconductor device according to claim 7, wherein the range is not less than 50 μm and not more than 150 μm.

9. The semiconductor device according to claim 7, wherein the range is not less than 80 μm and not more than 120 μm.

10. The semiconductor device according to claim 1, wherein
the SiC semiconductor layer includes 4H—SiC, and
the first direction is a [11-20] direction of the 4H—SiC.

11. The semiconductor device according to claim 10, wherein the SiC semiconductor layer has an off angle inclined at an angle of not more than 10° from a (0001) plane of the 4H—SiC to an [11-20] direction.

12. The semiconductor device according to claim 11, wherein the off angle is not less than 0° and not more than 4°.

13. The semiconductor device according to claim 11, wherein the off angle is greater than 0° and less than 4°.

14. The semiconductor device according to claim 1, wherein
the SiC semiconductor layer includes 4H—SiC, and
the first direction is a [1-100] direction of the 4H—SiC.

15. The semiconductor device according to claim 1, wherein the electrode includes at least one type of Ti, Ni, Au, and Ag.

16. The semiconductor device according to claim 1, wherein the electrode includes a Ti layer in contact with the raised portion group.

17. The semiconductor device according to claim 1, wherein the electrode includes an Ni layer in contact with the raised portion group.

18. The semiconductor device according to claim 1, further comprising:
a groove formed in the second main surface of the SiC semiconductor layer.

19. The semiconductor device according to claim 18, wherein the groove includes a portion which intersects the raised portion group.

20. The semiconductor device according to claim 18, wherein the raised portion group includes a portion in which some of the raised portions among the plurality of raised portions are formed at intervals along the groove in a plan view as viewed in a normal direction of the second main surface.

21. The semiconductor device according to claim 1, wherein the semiconductor element includes a Schottky barrier diode.

22. The semiconductor device according to claim 1, wherein the semiconductor element includes a field effect transistor.

23. The semiconductor device according to claim 1, wherein the Si amorphous layer is formed in regions in which the plurality of raised portions are formed, at the surface layer portion of the second main surface.

24. The semiconductor device according to claim 1, wherein the Si amorphous layer is formed in a region outside the plurality of raised portions, at the surface layer portion of the second main surface.

* * * * *